(12) United States Patent
Dean

(10) Patent No.: US 6,766,212 B1
(45) Date of Patent: *Jul. 20, 2004

(54) IDENTIFYING RELATIONSHIPS AMONG CONSTITUENT PARTS OF A WAFER FABRICATION SYSTEM

(75) Inventor: Timothy C. Dean, Lincoln, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/352,984

(22) Filed: Jul. 14, 1999

(51) Int. Cl.$^7$ .............................................. G06F 19/00
(52) U.S. Cl. ...................................... 700/121; 345/700
(58) Field of Search ........................... 700/97, 99, 121, 700/95, 96; 716/1; 345/700

(56) References Cited

U.S. PATENT DOCUMENTS

| | | | | |
|---|---|---|---|---|
| 5,586,021 A | | 12/1996 | Fargher et al. | 364/468.06 |
| 5,646,870 A | | 7/1997 | Krivokapic et al. | 364/578 |
| 5,655,110 A | | 8/1997 | Krivokapic et al. | 395/500 |
| 5,691,895 A | * | 11/1997 | Kurtzberg et al. | 700/29 |
| 5,740,341 A | * | 4/1998 | Oota et al. | 345/420 |
| 5,774,689 A | * | 6/1998 | Curtis et al. | 703/21 |
| 5,777,876 A | | 7/1998 | Beauchesne | 364/468.01 |
| 5,841,659 A | * | 11/1998 | Tanaka et al. | 700/121 |
| 5,884,079 A | * | 3/1999 | Furusawa | 717/1 |
| 5,929,855 A | * | 7/1999 | Benton et al. | 345/736 |
| 5,966,519 A | * | 10/1999 | Keeley | 716/5 |
| 5,980,078 A | * | 11/1999 | Krivoshein et al. | 700/1 |
| 5,999,911 A | * | 12/1999 | Berg et al. | 705/9 |
| 6,006,193 A | * | 12/1999 | Gibson et al. | 705/8 |
| 6,036,345 A | * | 3/2000 | Jannette et al. | 700/97 |
| 6,195,594 B1 | * | 2/2001 | Shah et al. | 700/97 |
| 6,233,537 B1 | * | 5/2001 | Gryphon et al. | 703/1 |
| 6,249,768 B1 | * | 6/2001 | Tulskie, Jr. et al. | 705/7 |
| 6,336,053 B1 | * | 1/2002 | Beatty | 345/736 |
| 6,467,077 B1 | | 10/2002 | Dean | 716/19 |

OTHER PUBLICATIONS

Paul L. Kristoff and David P. Nunn, "The Process Specification System For MMST," IEEE Transactions On Semicondutor Manufacturing, vol. 8, No. 3, Aug. 1995, pp. 262–271.

Mu Der Jeng, Chi Liang Chuang and Wen Yuah Hung, "Performance Evaluation Of The Thin Film Area In An IC Wafer Fabrication System Using Petri Nets," IEEE, Oct. 1998, pp. 3094–3099.

* cited by examiner

*Primary Examiner*—Ramesh Patel
*Assistant Examiner*—Ronald D Hartman, Jr.
(74) *Attorney, Agent, or Firm*—Skjerven Morrill LLP

(57) ABSTRACT

A method and system for use in wafer fabrication systems. The method and system identify relationships among constituent parts of a wafer fabrication system by generating a presentation of at least one relationship between an identified at least one integral part associated with the wafer fabrication system and at least one other integral part associated with the wafer fabrication system.

28 Claims, 53 Drawing Sheets

COMPONENT (POU)
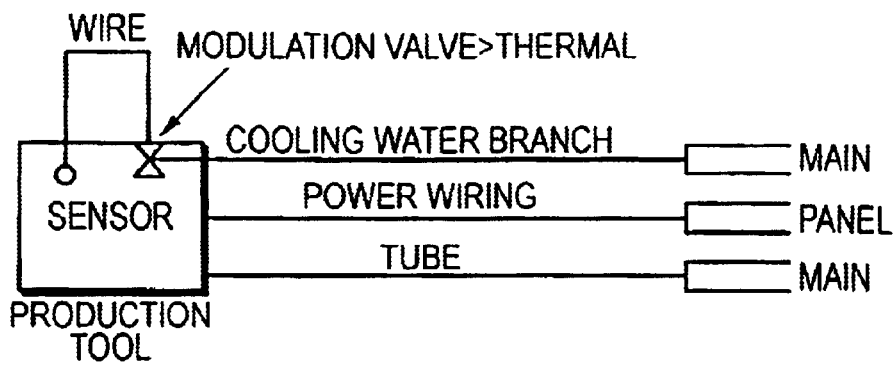
CONNECTION
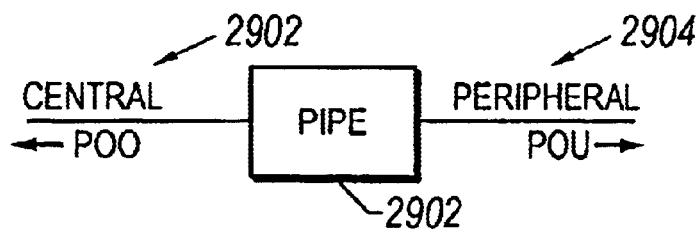
CONTROL (AUTOMATIC)
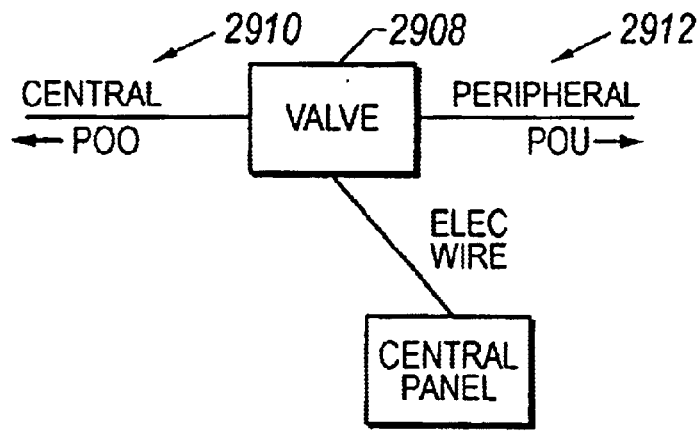
FIG. 29B

IDENTIFYING RELATIONSHIPS AMONG CONSTITUENT PARTS OF A WAFER FABRICATION SYSTEM

CROSS-REFERENCE

The present invention is related to subject matter disclosed in the following co-pending application:

1. United States patent application entitled, "Capturing An Evolving Wafer Fabrication Method And System", Ser. No. 09/352,983 now U.S. Pat. No. 6,467,077, naming Timothy C. Dean as the inventor, filed substantially contemporaneously with the present application and incorporated by reference herein in its entirety; and
2. United States patent application entitled, "Identifying Wafer Fabrication System Impacts Resulting From Specified Actions", Ser. No. 09/353,687, naming Timothy C. Dean as the inventor, filed substantially contemporaneously with the present application and incorporated by reference herein in its entirety.

BACKGROUND OF THE INVENTION

1. Field of the Invention

The present invention relates, in general, to wafer fabrication systems.

2. Description of the Related Art

The production of semiconductor devices consists of many layers of chemical compounds applied to or removed from a silicon base. The base is a disk known as a "wafer". Depending on wafer size and chip complexity, each wafer can contain 25 to several hundred separate identical chips.

Using photolithography, the pattern of electrical circuits for a given layer is captured on the wafer. The image is developed, and the wafer moves to another process, either adding or modifying a layer, or etching it out in the pattern of the lithographic image. This process is repeated many many times in many layers to get a full 3-D electronic circuit. The dimensions of these circuits are incredibly tiny. Present technology is in the range of 0.25 micron line width or feature size.

Wafer fabrication systems are utilized to manufacture semiconductor devices. A wafer fabrication system can be conceived of as being composed of production equipment and utility systems. Production equipment can be conceived of as being composed of functional units known in the art as "production tools." Utility systems can be conceived of as being composed of functional units known in the art as "items of utility system equipment."

Prior to the initial installation of a wafer fabrication system, the production equipment and utility systems are individually designed and integrated together using top down engineering design techniques in order to yield the wafer fabrication system. Each individual production equipment and utility system design, as well as the overall wafer fabrication system design, is typically recorded in its own equipment layout plan drawing.

Subsequent to the initial installation of a wafer fabrication system, it is common within the industry to take a "modular" approach to the production equipment and utility systems making up the wafer fabrication system. That is, the constituent parts of the production equipment and the utility systems are treated as functional members that can be independently added, modified, replaced, relocated, removed, or upgraded with only concern for impacts local to the modification, replacement, relocation, removal, or upgrade.

With respect to the manufacture of semiconductor devices, there are hundreds of different production tools utilized to apply or remove or condition the various layers within the semiconductor device. Additionally, there are dozens of different chemicals required to produce the desired effects. The different chemicals require separate distribution, or utility, systems to deliver them.

Use of the modular approach to production equipment and utility systems allows the piecemeal addition, modification, replacement, relocation, removal, and/or upgrading of production tools making up the production equipment and items of utility equipment making up the utility systems as new process steps become necessary, or when production tools are improved. In practice, there are many advantages to the modular approach. One advantage is that the modular approach is highly efficient and effectively allows an existing wafer fabrication system to continuously evolve over time in order to meet expanding demand and changing manufacturing procedures. In a sense, a wafer fabrication system resulting from the modular approach is the best system possible in that it is uniquely adapted to the needs at hand, a fact which arises from its evolutionary growth in response to a changing environment of present and future needs.

One significant disadvantage to a wafer fabrication system utilizing the modular approach is that its evolutionary growth pattern means that there is no overall conscious design, or plan, applicable to the wafer fabrication system which has been evolving for any significant length of time. In theory, this disadvantage could be overcome by maintaining extensive documentation about the wafer fabrication system as it evolved. In practice, this has not happened.

The semiconductor device manufacturing industry has been in the midst of sustained capacity expansion for years. To keep up with demand, companies have been installing and updating production equipment and items of utility system equipment on a need-driven basis. Consequently, many of today's semiconductor device wafer fabrication systems consist of a bewildering array of production tools and items of utility system equipment assembled together in response to past needs. While such wafer fabrication systems do work exceptionally well, they give rise to significant difficulties from the standpoint of facilities engineers attempting to manage, maintain, or upgrade such wafer fabrication systems.

One such difficulty arises from the lack of documentation, and consequent lack of understanding, concerning the interrelationships of the production tools composing the production equipment. Another difficulty arises from the lack of documentation, and consequent lack understanding, concerning the interrelationships of the items of utility system equipment composing the utility systems. Yet another difficulty arises from lack of documentation, and consequent lack understanding, concerning the interrelationships of the various production tools and items of utility system equipment. This lack of documentation and understanding exists since existing wafer fabrication systems, composed of production equipment made up of various and sundry production tools and utility systems made up of various and sundry items of utility system equipment, are the result of sustained evolution, often over a period of several years, in response to needs that had to be satisfied immediately (e.g., either to avoid a shutdown of the facility or to quickly ramp up for production of a new product or quantity of product).

The result of the foregoing described process or real-time installation and modification is a highly evolved sprawl of well-functioning production equipment which is often partially undocumented (that is, because of the rapid modification without documentation, the original equipment layout plan drawings quickly become inaccurate representations of the production equipment and utility systems making up a wafer fabrication system). That is, since the production tools (and their supporting items of utility system equipment) had to be installed and/or modified virtually in real time, time for documenting such installations/modifications did not typically exist at the time of such installations/modifications. Furthermore, rapid growth in the industry has also typically meant that one real-time project has followed on the heels of a preceding real-time project. Consequently, often, time is not available to go back and document the changes in production tools and their supporting distribution systems which gave rise to existing production equipment. Thus, existing wafer fabrication systems are in the main vastly undocumented. This lack of documentation gives rise to a corresponding lack of information regarding the overall system functioning.

Incomplete documentation and overall wafer fabrication system understanding poses several grave difficulties to facilities engineers due to the overwhelming complexity of existing systems. The following example of an existing system will help to demonstrate a few of the difficulties arising from such complexity and lack of documentation.

At the NEC Electronics, Inc. semiconductor device manufacturing facility in Roseville, Calif. there are literally hundreds of production tools in place, which, as discussed above, collectively make up the production equipment. A great number of the relationships and interrelationships of the production tools in place are poorly documented or undocumented for the reasons set forth above. In addition, connected to the production tools in place are the following utilities, many of which have relationships and interrelationships that are likewise undocumented. Thirty-five (35) bulk liquid chemical supply or return systems. These chemical supply and return system carry various types of chemical ranging from IPA to MEK to HF to H2SO4 and many others. Four (4) different types of electrical power systems, all at various voltages. Five (5) different types of communication systems. Eleven (11) bulk gas systems. These bulk gas systems carry various types of chemical including Argon, Nitrogen, Hydrogen, Oxygen, compressed air, etc. Forty (40) bottled gas systems (serving only 1–5 tools). These bottled gas systems include several types of gases such as freons, CO2, HBr, Ne-Kr-F, PH3, SF6, etc. Four (4) major process exhaust systems: acid exhaust, alkali exhaust, organic exhaust, powder exhaust. (Each has several scrubbers to release only cleaned air to the atmosphere.) Several (e.g., house and process) vacuum systems. Six (6) wastewater systems for different chemical mixtures. Five (5) water systems: Cooling supply & return, super high purity (deionized or DI) water, hot DI water, industrial water.

Those skilled in the art will recognize that each of the foregoing described utility systems contains utility system equipment such as mains, valves, panelboards, branches, plus all sorts of generation equipment, pumps, tanks, pressure reducing stations, etc. Those skilled in the art will further realize that the number of utilities serving the production equipment fluctuates constantly, as the mix of different tools evolves and changes. Those skilled in the art will yet further realize that it is common for as many as 20 of the foregoing described utility systems to come together at a single production tool, depending upon the necessary requirements (e.g., chemical, vacuum, power, and cooling requirements) of the production tool.

As noted above, the modular approach to wafer fabrication systems allows the addition, modification, replacement, relocation, removal, and/or upgrading of individual production tools and items of utility equipment. Unfortunately, the addition, modification, replacement, relocation, removal, and/or upgrading of such production tools and items of utility equipment is generally not just a simple matter of stopping the wafer fabrication system, plugging in the new production tool or item of utility equipment, and re-starting the system. Insofar as production tools are typically being served by a number of different utilities, and insofar as the production tools are themselves often serving as conduits for utilities to other production tools, the addition, modification, replacement, relocation, removal, and/or upgrading of production tools or items of utility system equipment often requires that the production tools and/or utilities surrounding the production tool(s) or item(s) to be replaced or modified be taken off line.

More often than not, the addition, modification, replacement, relocation, removal, and/or upgrading of production tools or items of utility system equipment requires extensive engineering modification of existing production tools and utility systems, such as retrofitting connections, adjusting power supplies, modifying software controls, etc. in order to make the added, modified, replaced, relocated, removed, and/or upgraded production tools or items of utility system equipment function effectively. This operation of "integrating" a new production tool into existing production equipment is known in the art by the term "hook-up". Those skilled in the art will recognize that there are always unforeseen difficulties which arise during hook-up. These difficulties need to be overcome in order to for the new production tool or items of utility system equipment to function effectively. Overcoming these difficulties takes time, and can sometimes take a great deal of time.

Insofar as adding, modifying, replacing, relocating, removing, and/or upgrading production tools or items of utility system equipment can require that all or part of a wafer fabrication system be shut down, it is extremely important that the facility engineers deciding whether or not to deploy new production tools or items of utility system equipment be able to estimate the worst case scenarios in order to determine a plan of installation having substantially no effects on the wafer fabrication system operation. This means that they need to be able to estimate the effect on the wafer fabrication system of taking off-line the production tools or items of utility system equipment necessary to effect the change/modification. Unfortunately, assessing such worse case scenarios is not something easily done in the art due to the lack of documentation and understanding regarding the interrelationships of the production tools and their supporting utilities within the evolved existing wafer fabrication systems.

Since in the art there is typically no adequate description of the interrelationships within the evolved system, it is very difficult for facility engineers to anticipate the effects of proposed changes to production equipment or utility systems. That is, if the relationships are not well documented, it is very difficult to anticipate the effect of, say, shutting off a valve delivering sulfuric acid to a tool, especially if that valve serves several conduits or the tool itself serves several other tools. Since the interrelationships between components of the production equipment, the interrelationships between components of the utilities serving the production equipment, and the interrelationships between the components of the production equipment and the components of the utilities may not be generally well known or documented, shutting down parts of the system often has many unexpected effects. Those skilled in the art will recognize that this lack of knowledge is undesirable, and makes an already risky operation more risky.

In the absence of the present invention, the common approach to the foregoing noted difficulties is for each utility to be separately (which are usually outdated, for the reasons set forth above) documented on a large blueprint drawing (or drawings) of its own. To examine all the utilities at a given production tool, many drawings must be researched (typically at least one drawing per each utility).

Those skilled in the art will recognize that, for a proposed addition to or modification of a group of tools (such modifications tend to come in groups needed to support a certain product and defined quantity of the product), facilities construction engineers, utilizing the existing (and typically outmoded) blueprint drawings on a piecemeal basis, prepare a utility matrix—a listing of the utility demands for the entire group of production tools to be modified. Thereafter, the construction engineers evaluate the matrix to determine if utility service is adequate in the proposed locations, or whether system upgrades will be required. If system upgrades will be required, the type and cost of the upgrade are determined.

As product planners attempt to refine their production mix, several such proposed modifications occur throughout the year. Thus, from a planning standpoint the foregoing described procedure is very labor intensive and fraught with risk. Notwithstanding the foregoing, that risk becomes real and the dangers present when a design decision is made and the changes actually implemented.

Those skilled in the art will recognize that, even if the evolutionary nature of the system had been well documented, from a practicable standpoint it is extremely difficult to represent all the hook-up information related to installing or modifying production tool(s) as a drawing single. In most practical instances, there are just too many branch lines feeding any one production tool. With hundreds of tools and dozens of utilities interlinked, such a diagram would be a very convoluted web, virtually impossible to draw even if it could be understood.

Those skilled in the art will also recognize that even if the evolutionary nature of the production equipment and utility systems making up the wafer fabrication system had been well documented, from a practicable standpoint it is extremely difficult to represent wafer fabrication system-wide impacts related to installing or modifying production tool(s) and/or utility systems. The practical reasons for this is that most wafer fabrication systems maintain separate blueprint drawings for separate production tools and utility systems, which makes an overall wafer fabrication system assessment of likely impacts substantially impracticable.

It is therefore apparent that a need exists in the art for a method and system which can dynamically learn, coordinate, and present the massive amount of production tool and utility interconnect data from existing and evolving wafer fabrication systems, and present such learned information in such a fashion that the costs, benefits, and impacts of any proposed modifications of production equipment and/or utilities on parts of the wafer fabrication system can be adequately accessed.

SUMMARY OF THE INVENTION

A method and system have been invented which can dynamically learn, coordinate, and present the massive amount of production tool and utility interconnect data from existing and evolving wafer fabrication systems, and present such learned information in such a fashion that relationships between various integral parts of the wafer fabrication system can be identified. The method and system identify relationships among constituent parts of a wafer fabrication system by generating a presentation of at least one relationship between an identified at least one integral part associated with the wafer fabrication system and at least one other integral part associated with the wafer fabrication system.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features and advantages made apparent to those skilled in the art by referencing the accompanying drawings.

FIG. 10 shows a high-level logic flowchart showing an example of the selection of at least one integral part on a granular basis.

FIG. 12 shows a high-level logic flowchart showing an example of the selection of the at least one integral part on a granular basis.

FIG. 23 shows a high-level logic flowchart showing an example of the identification of at least one integral part on a granular basis.

FIG. 25 shows a high-level logic flowchart showing an example of the identification of at least one integral part on a granular basis.

FIG. 29B shows pictographically some the aspects set forth in FIG. 29A.

FIG. 42 shows a high-level logic flowchart showing an example of identification of at least one directly affected integral part on a granular basis.

FIG. 44 shows a high-level logic flowchart showing an example of the identification of at least one directly affected integral part on a granular basis.

The use of the same reference symbols in different drawings indicates similar or identical items.

DESCRIPTION OF THE PREFERRED EMBODIMENT(S)

The following sets forth a detailed description of the best contemplated mode for carrying out the invention as described in the claims. The detailed description is intended to be illustrative and should not be taken as limiting.

The following sets forth a detailed description of the best contemplated mode for carrying out the multiple independent inventions described herein. The description is intended to be illustrative and should not be taken to be limiting. In addition, the following detailed description has been divided into sections (e.g., sections I–II) in order to highlight the inventions described herein; however, those skilled in the art will appreciate that such sections are merely for illustrative focus, and that the inventions herein disclosed typically draw their support from multiple sections. Consequently, it is to be understood that the division of the detailed description into separate sections is merely done as an aid to understanding and is in no way intended to be limiting.

As noted in the description of the related art section, modern wafer fabrication systems evolve in a piecewise fashion. The following describes processes and devices for capturing a wafer fabrication system as it evolves, with the ability to perform such capturing from virtually any point in the development of the wafer fabrication system. Also described are processes and devices which can utilize a captured wafer fabrication system to discern what impact or impacts a given action taken with respect to a portion of a wafer fabrication system will generate. Additionally described are processes and devices which utilize a captured wafer fabrication system to generate representations of the way in which various defined portions of the wafer fabrication system interact with and influence each other.

One significant aspect utilized herein is a devised treatment of "granular" wafer fabrication systems. This treatment radically deconstructs the relationships in which constituent parts of wafer fabrication systems are typically manipulated and viewed. Instead, processes and devices described herein manipulate and view each wafer fabrication system as an agglomeration of "granular" integral members, with each such granular member being defined by its relations (e.g., logical, mechanical, electrical, chemical, etc.) with other granular integral members, irrespective of how such granular integral members may previously have been understood, viewed, and/or defined. This radical deconstruction, and how it relates to existent manipulations and views of a wafer fabrication system, is presented pictographically in FIGS. 1A and 1B.

Figure 1A:
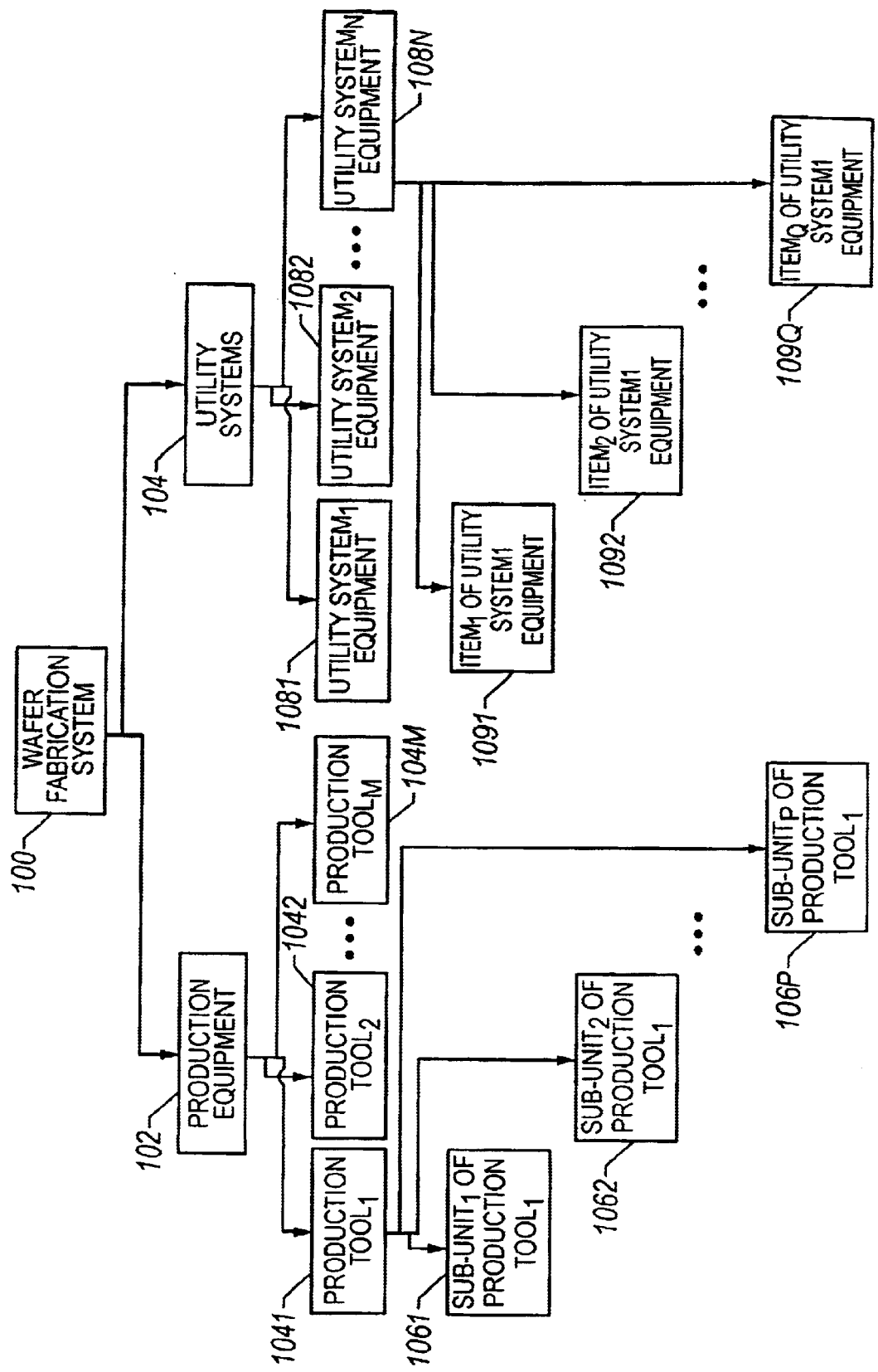
FIG. 1A is a pictographic representation of how the signifiers utilized by processes and devices herein relate to existing wafer fabrication system signifiers.

Referring now to FIG. 1A, shown is a pictographic representation of how the signifiers utilized by processes and devices herein relate to existing wafer fabrication system signifiers. Depicted in FIG. 1A is the wafer fabrication system signifier 100 which signifies the totality of everything other than human input necessary to fabricate integrated circuits. Shown is that wafer fabrication system signifier 100 can be further subdivided into production equipment signifier 102 (remember that equipment, as commonly used, is plural) and utility systems signifier 104.

Depicted is that production equipment signifier 102 can be further broken down into production tool$_1$ signifier 1041 through production tool$_M$ signifier 104M (where M is some integer greater than 1). Illustrated is that each production tool signifier can be further broken down into a number of sub-units of production tools. For example, shown is that production tool$_1$ signifier 1041 can be broken down into sub-unit$_1$ of production tool$_1$ signifier 1061, sub-unit$_2$ of production tool$_1$ signifier 1062, . . . , and sub-unit$_P$ of production tool$_1$ signifier 106P (where P is some integer greater than 1).

Depicted is that utility systems signifier 104 can be further broken down into utility system$_1$ equipment signifier 1081 through utility system$_N$ equipment signifier 108N (where N is some integer greater than 1). Illustrated is that each utility system signifier can be further broken down into a number of items of utility systems. For example, shown is that utility system$_N$ 108N can be broken down into item$_1$ of utility system$_N$ signifier 1091, item$_2$ of utility system$_N$ signifier 1092, . . . , and item$_Q$ of utility system$_N$ signifier 109Q (where Q is some integer greater than 1).

Figure 1B:
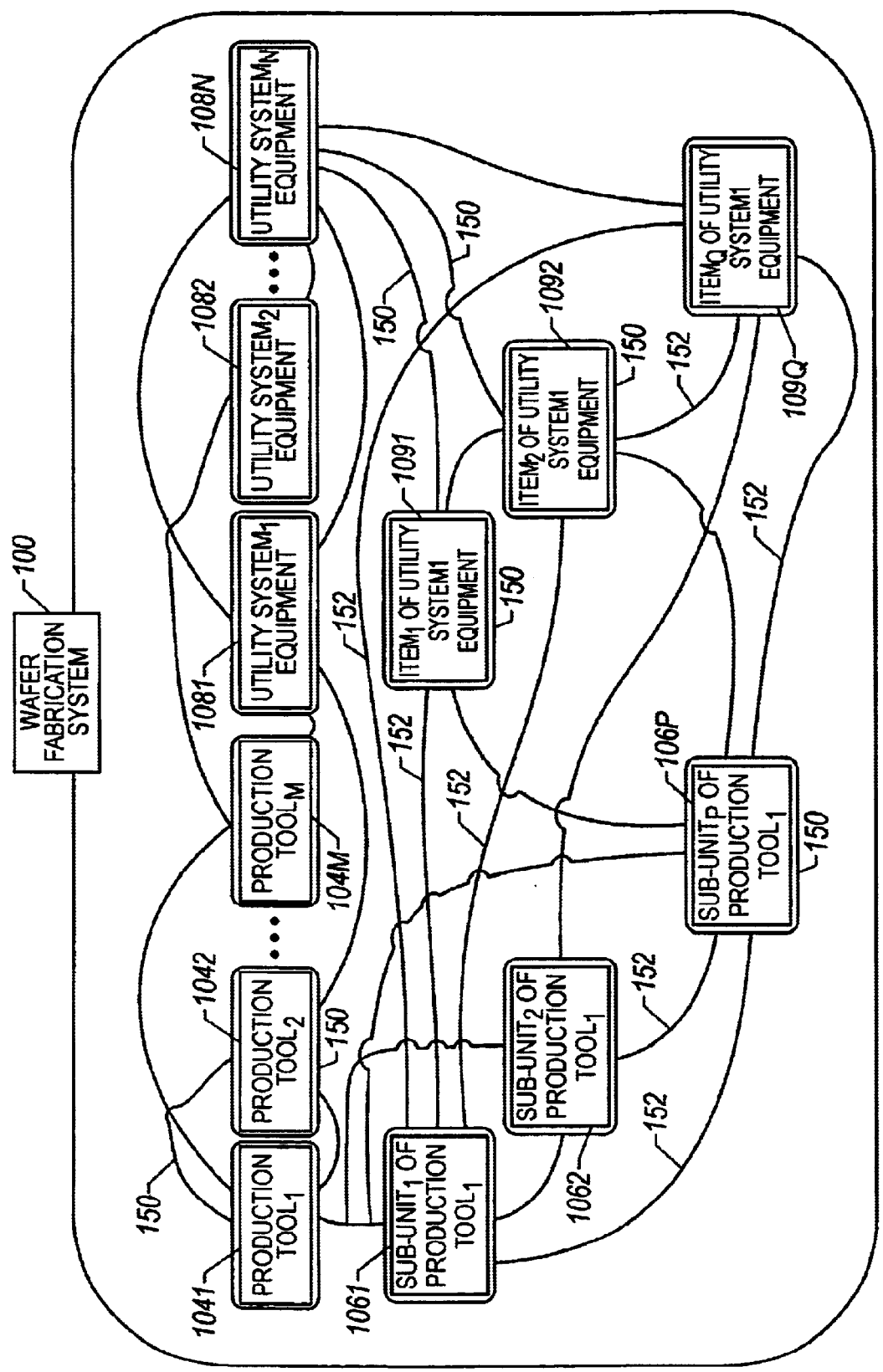
FIG. 1B depicts a pictographic of representation of how the signifiers utilized and viewed by the various processes and devices described below differ from these illustrated in FIG. 1A.

Referring now to FIG. 1B, depicted is a pictographic of representation of how the signifiers utilized and viewed by the various processes and devices described below differ from these illustrated in FIG. 1A. Illustrated in FIG. 1B is that the hierarchical arrangement of signifiers of FIG. 1A has been deconstructed, and that that the signifiers have been reconstructed on a different basis—namely, the signifiers' interactions with each other. Notice that the hierarchical relationships of FIG. 1A have been supplemented by a web of interrelationships, depicted in FIG. 1B, which essentially ignores the hierarchical relationships of FIG. 1A. Instead, the process and devices utilized herein define each of the sub-units of production tools and items of utility systems making up a wafer fabrication system as "granular" integral part signifiers 150 (the basic granular signifiers utilized herein are components, controls, and connection, and are described in more detail below).

Granular integral parts 150 are interlinked by coupling signifiers 152 (basic coupling signifiers utilized herein are electrical, mechanical, chemical, and thermal, and are described in more detail below). As can be seen, the granular integral part signifiers 150 and coupling signifiers 152 deconstruct wafer fabrication system 100 into a mass of interlinked and interwoven granular parts. This gives rise to a number of advantages which become apparent in the following discussion.

I. Capturing an Evolving Wafer Fabrication System

As noted in the description of the related art section, modern wafer fabrication systems evolve in a piecewise fashion. The following describes processes and devices for capturing a wafer fabrication system as it evolves from virtually any point in its development. Furthermore, the following described processes and devices allow for the piecewise acquisition of information about the evolving system, and thus can be utilized to capture an evolving wafer fabrication system starting with basically any integral aspect of the system, at basically any point in time during the evolution of the wafer fabrication system. Furthermore, it is to be understood that multiple independent versions of the below described processes and devices can be used independent of each other. Thereafter, each multiple version can be used to characterize a portion of the evolving wafer fabrication system which that version has captured. Furthermore, if desired, each such multiple version can eventually be "linked up" to other of the multiple independent versions to create a coherent linked whole.

Figure 2:
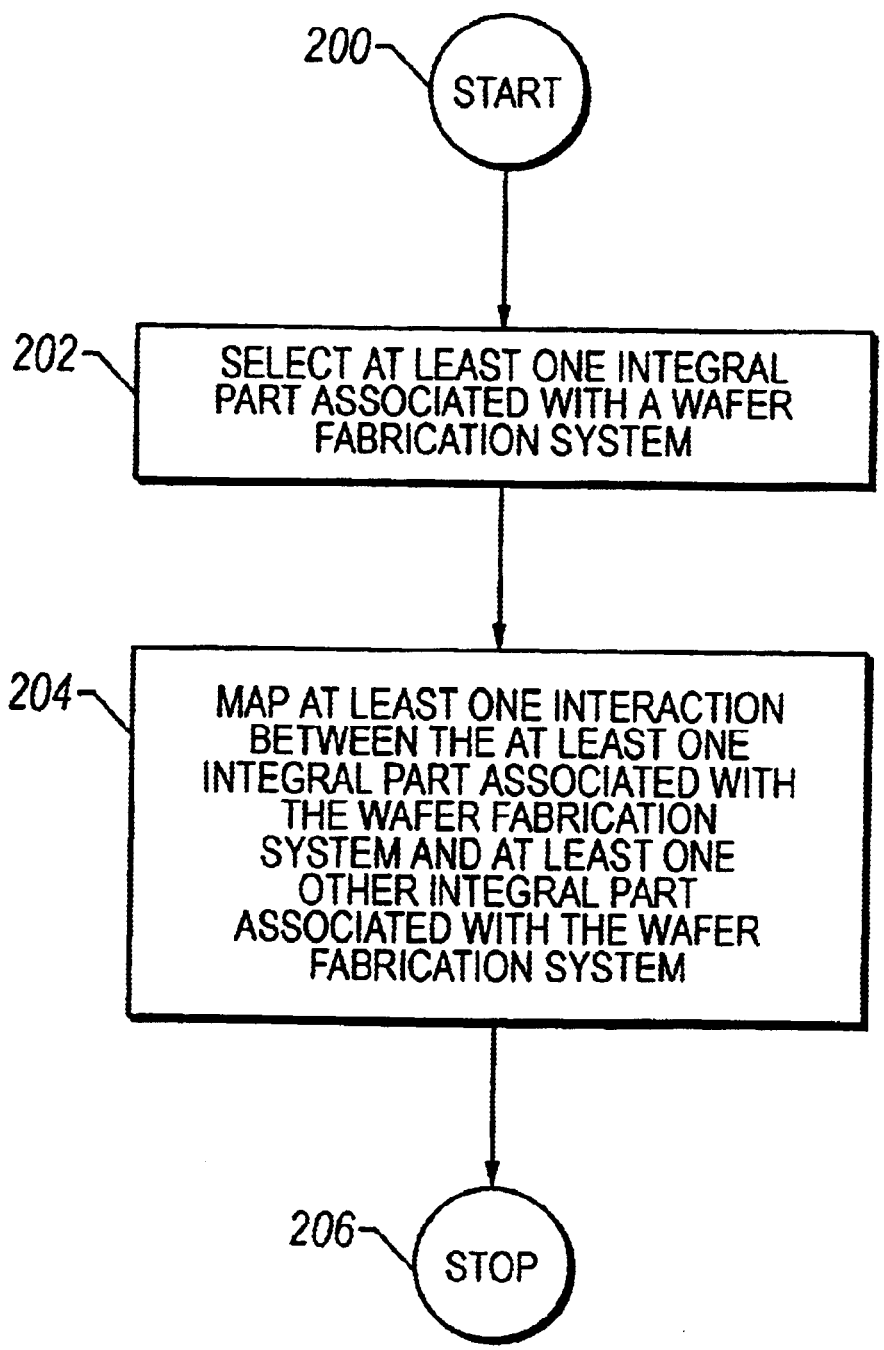
FIG. 2 depicts a high-level logic flowchart of a process by which an evolving wafer fabrication system can be captured.

With reference now to FIG. 2, depicted is a high-level logic flowchart of a process by which an evolving wafer fabrication system can be captured. Method step 200 shows the start of the process. Method step 202 depicts the selection of at least one integral part associated with a wafer fabrication system. Method step 204 illustrates the mapping of at least one interaction between the integral part selected in method step 202 and at least one other integral part associated with the wafer fabrication system. Method step 206 shows the end of the process.

Figure 3:
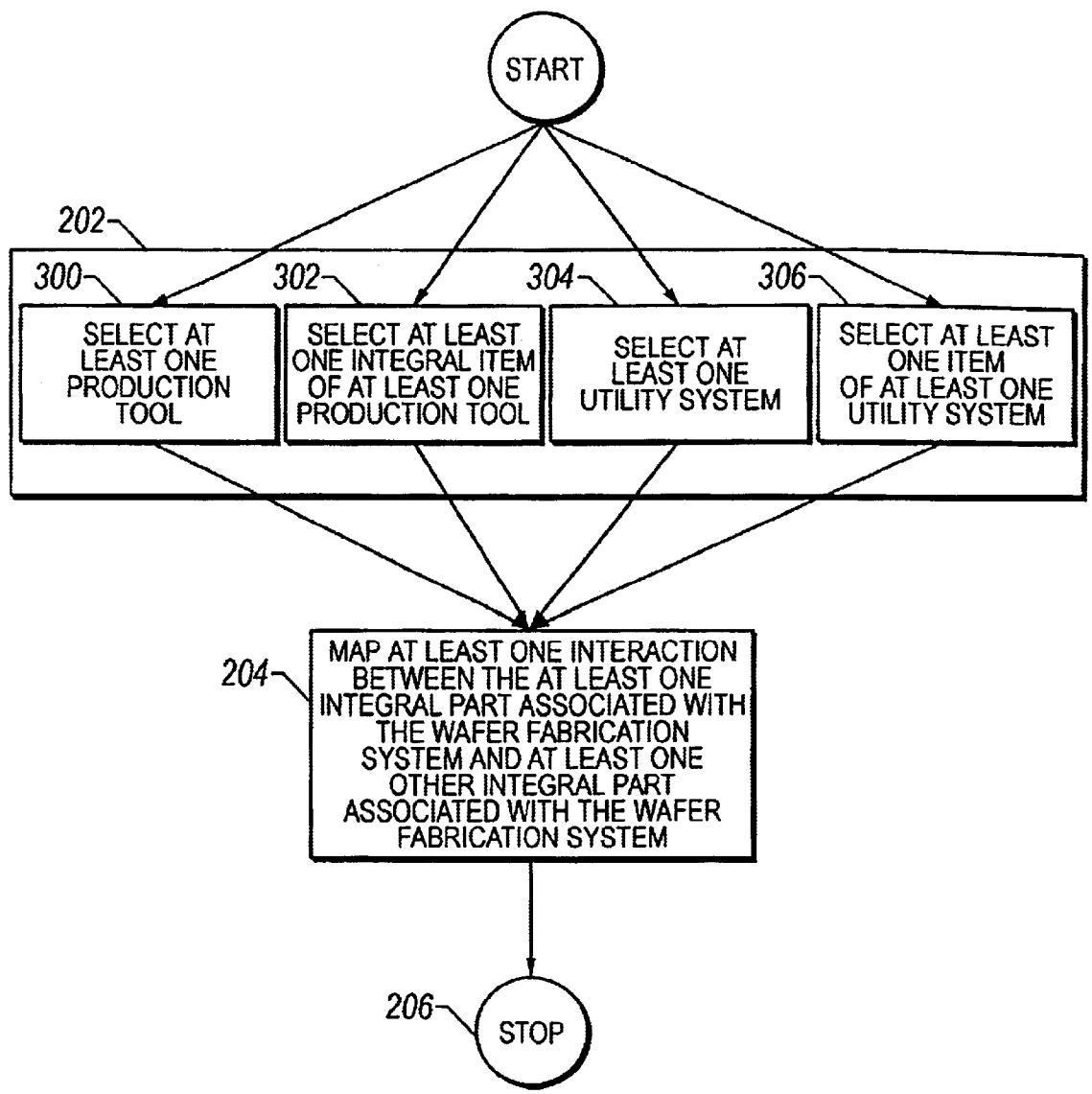
FIG. 3 illustrates a high-level logic flowchart showing several examples of the selection of the at least one integral part.

Referring now to FIG. 3, illustrated is a high-level logic flowchart showing several examples of the selection of the at least one integral part referenced in method step 202. Method step 300 illustrates that in one instance, the selection of the at least one integral part referenced in method step 202 can be the selection of at least one production tool. Method step 302 shows that in a second instance, the selection of the at least one integral part referenced in method step 202 can be the selection of at least one integral item of at least one production tool. Method step 304 shows that in a third instance, the selection of the at least one integral part referenced in method step 202 can be the selection of at least one utility system. Method step 306 shows that in a fourth instance the at selection of at least one integral part can be the selection of at least one item of at least one utility system. The remaining shown steps function substantially as like-numbered steps described previously.

Figure 4:
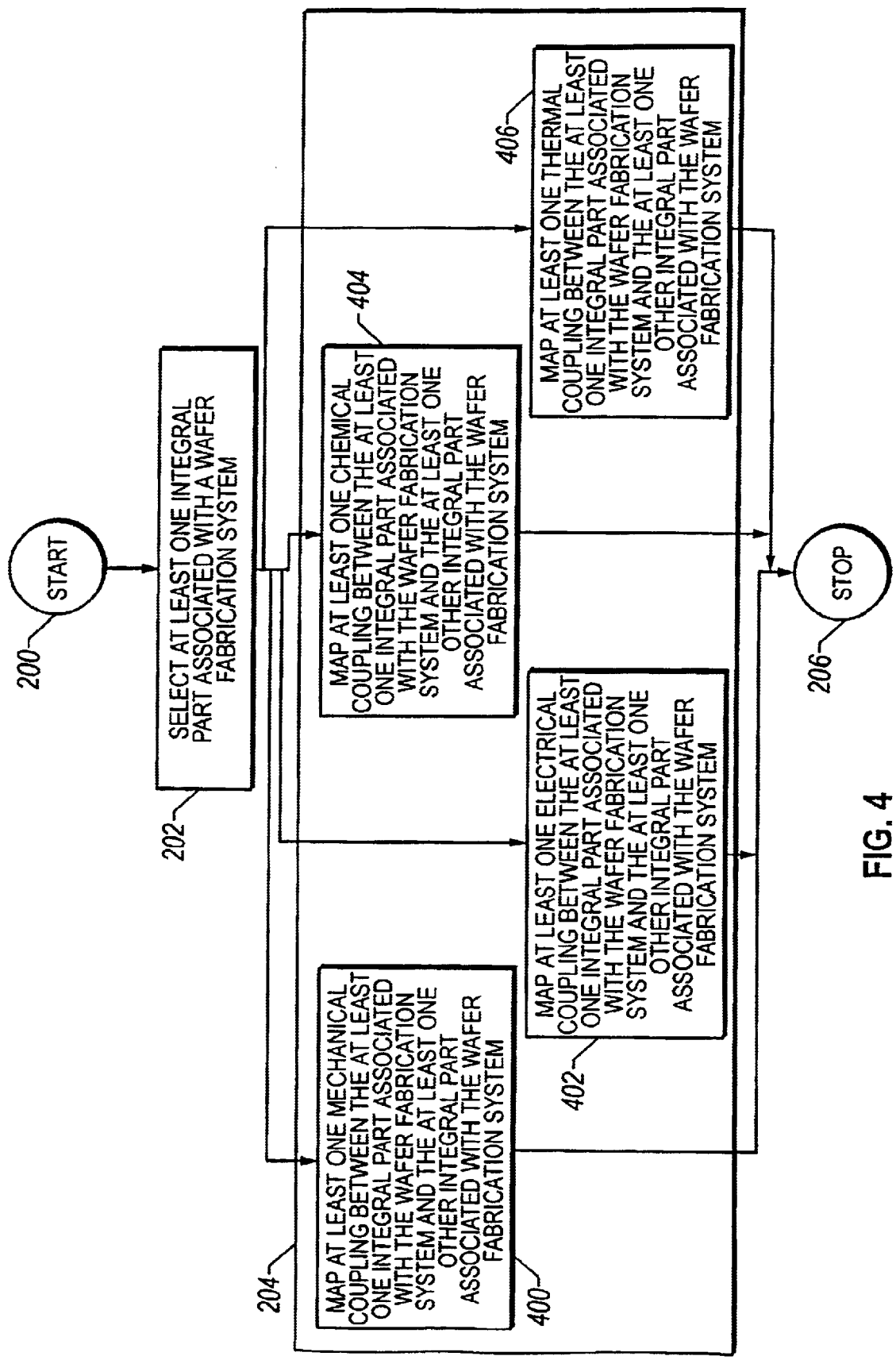
FIG. 4 shows a high-level logic flow chart showing several examples of mapping.

Referring now to FIG. 4, shown is a high-level logic flow chart showing several examples of the mapping illustrated in method step 204. Method step 400 illustrates that in one instance, mapping at least one interaction between the integral part selected in method step 202 and at least one other integral part associated with the wafer fabrication system, as was referenced in method step 204, can be the mapping of at least one mechanical coupling between the at least one integral part selected in method step 202 and at least one other integral part associated with the wafer fabrication system. Method step 402 shows that in a second instance, mapping at least one interaction between the integral part selected in method step 202 and at least one other integral part associated with the wafer fabrication system as was referenced in method step 204, can be the mapping of at least one electrical coupling between the integral part selected in method step 202 and at least one other integral part associated with the wafer fabrication system. Method step 404 shows that in a third instance, mapping at least one interaction between the integral part selected in method step 202 and at least one other integral part associated with the wafer fabrication system, as was referenced in method step 204, can be the mapping of at least one chemical coupling between the integral part selected in method step 202 and at least one other integral part associated with the wafer fabrication system. Method step 406 shows that in a fourth instance, mapping at least one interaction between the integral part selected in method step 202 and at least one other integral part associated with the wafer fabrication system, as was referenced in method step 204, can be the mapping of at least one thermal coupling between the integral part selected in method step 202 and at least one other integral part associated with the wafer fabrication system. The remaining shown steps function substantially as like-numbered steps described previously.

Figure 5:
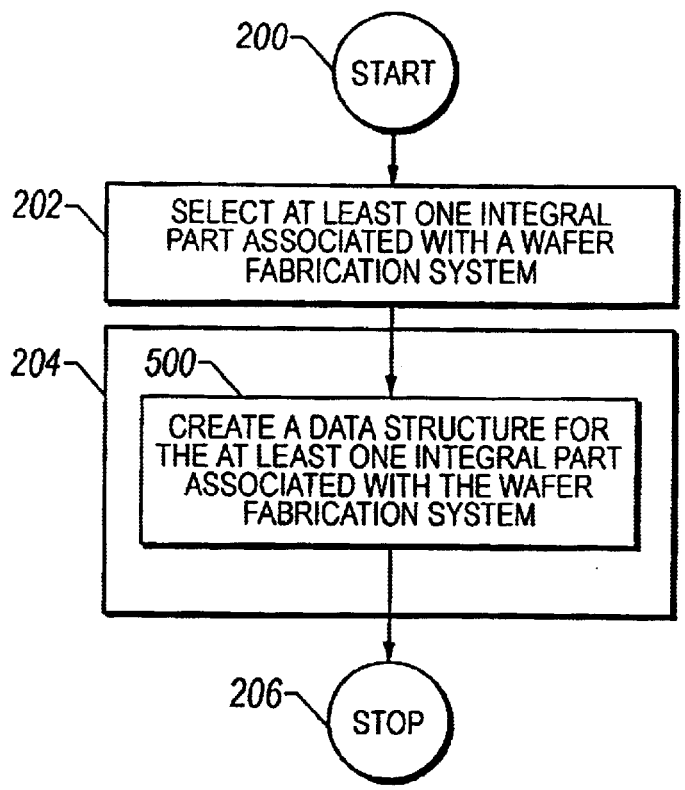
FIG. 5 shows a high-level logic flowchart showing an example of how mapping can be achieved.

Referring now to FIG. 5, shown is a high-level logic flowchart showing an example of how the mapping illustrated in method step 204 can be achieved. Method step 500 illustrates that in one instance, mapping at least one interaction between the at least one integral part selected in method step 202 and at least one other integral part associated with the wafer fabrication system, as was referenced in method step 204, can be achieved by the creation of a data structure for the at least one integral part selected in method step 202. In one embodiment, this is achieved via the creation of a relational database entry. The remaining shown steps function substantially as like-numbered steps described previously.

Figure 6:
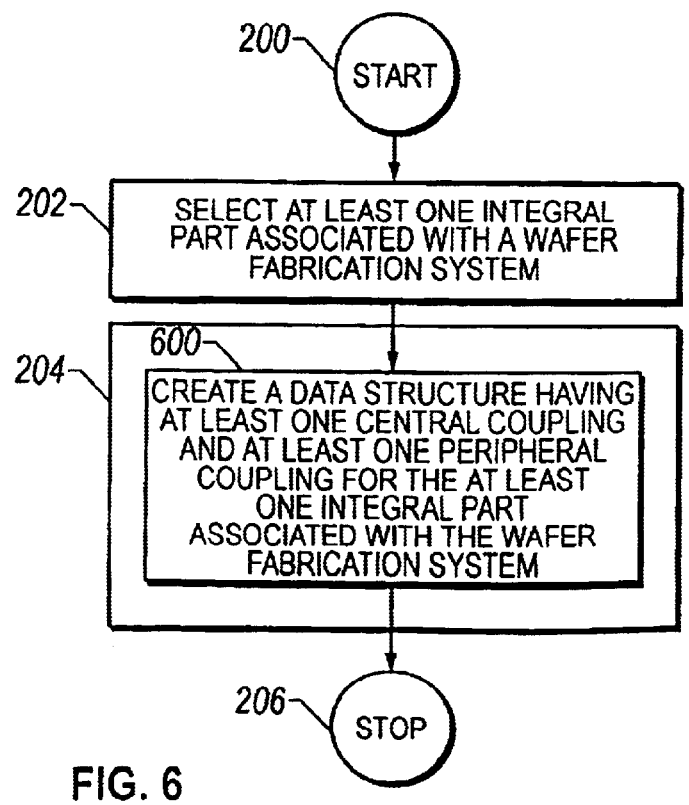
FIG. 6 shows a high-level logic flowchart showing an example of how mapping can be achieved.

Referring now to FIG. 6, shown is a high-level logic flowchart showing an example of how the mapping illustrated in method step 204 can be achieved. Method step 600 illustrates that in one instance, mapping at least one interaction between the at least one integral part selected in method step 202 and at least one other integral part associated with the wafer fabrication system, as was referenced in method step 204, can be achieved by the creation of a data structure for the at least one integral part selected in method step 202 where the data structure has at least one central[1] coupling and at least one peripheral[2] coupling for the at least one integral part associated with the wafer fabrication system. In one embodiment, this is achieved via the creation of a relational database entry. The remaining shown steps function substantially as like-numbered steps described previously.

[1] As used herein, "central" indicates towards the source of the utility. Visualize a tree trunk. Connection capacities are larger towards the central end of the utility distribution. Switchgear, boilers, and pumps are typically towards the center of utility systems.
[2] As used herein, "peripheral" indicates towards the outer edges of the utility distribution. Visualize twigs and leaves of a tree. Connection capacities are smaller. Production tools and plumbing fixtures are typically towards the periphery of utility systems.

Figure 7:
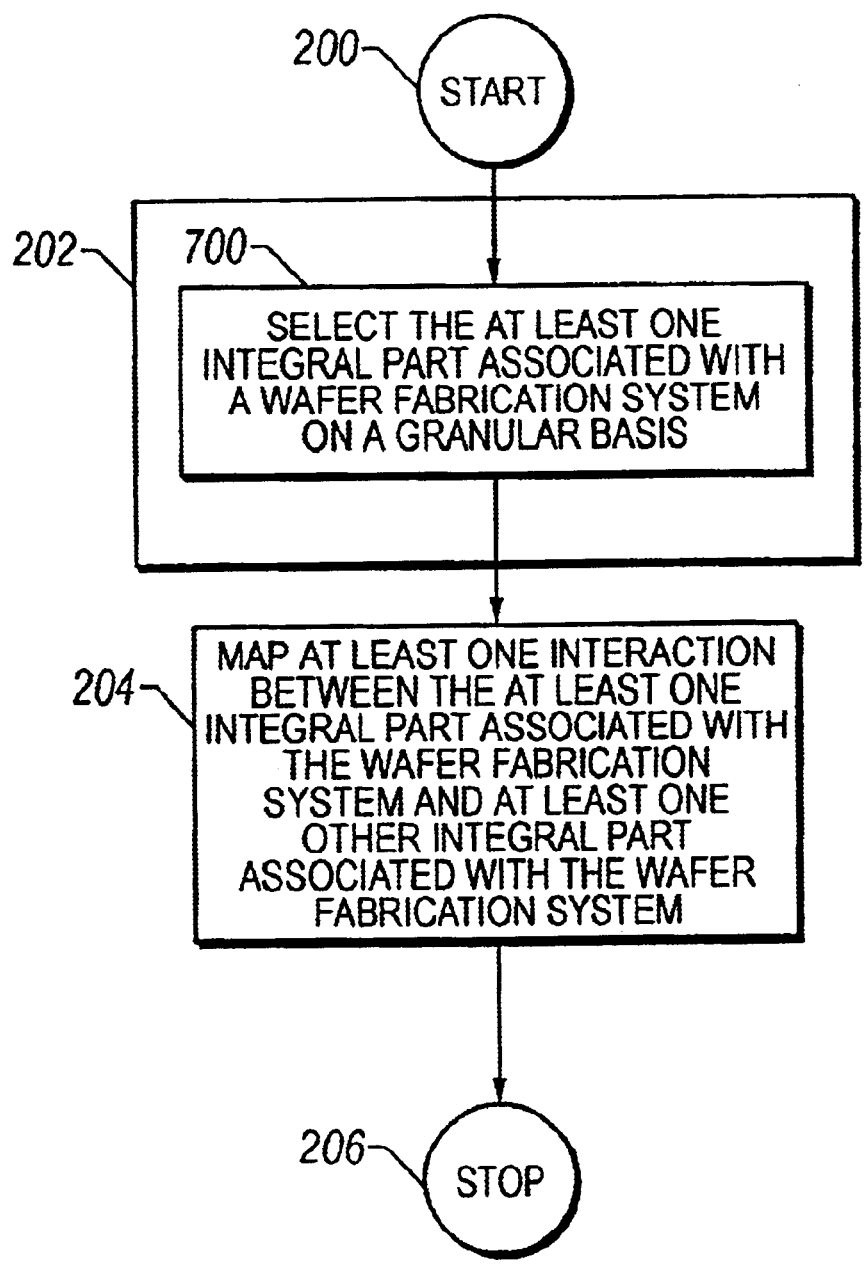
FIG. 7 illustrates a high-level logic flowchart showing an example of the selection of at least one integral part.

Referring now to FIG. 7, illustrated is a high-level logic flowchart showing an example of the selection of at least one integral part referenced in method step 202. Method step 700 illustrates that in one instance, the selection of the at least one integral part referenced in method step 202 can be the selection of at the at least one integral part is done on a granular basis. The remaining shown steps function substantially as like-numbered steps described previously.

Figure 8:
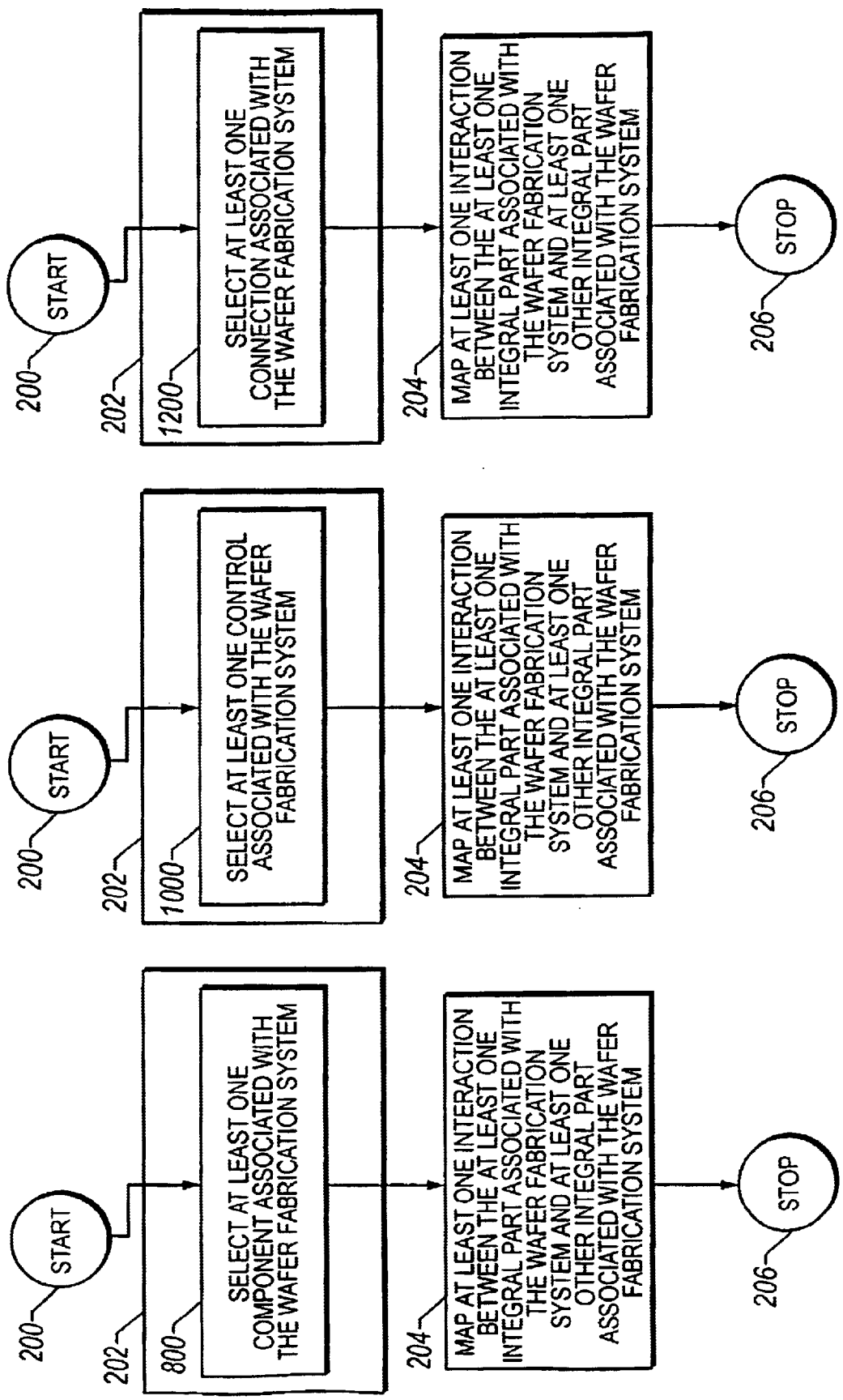
FIG. 8 shows a high-level logic flowchart showing an example of the selection of at least one integral part on a granular basis.

Referring now to FIG. 8, shown is a high-level logic flowchart showing an example of the selection of at least one integral part on a granular basis, as referenced in method step 700. Method step 800 illustrates that in one instance, the selection of at least one integral part done on a granular basis, referenced in method step 700, involves selecting at least one component[3] associated with the wafer fabrication system. The remaining shown steps function substantially as like-numbered steps described previously.

[3] As used herein, a "Component" typically consumes utilities for purposes not related to the utility being consumed, such as heating water or processing wafers. Components often are linked to multiple utilities. A Component is a primary interface location for human use of the utility systems. Examples of Components include: production tools, scrubbers, boilers, pumps, etc.

Figure 9:
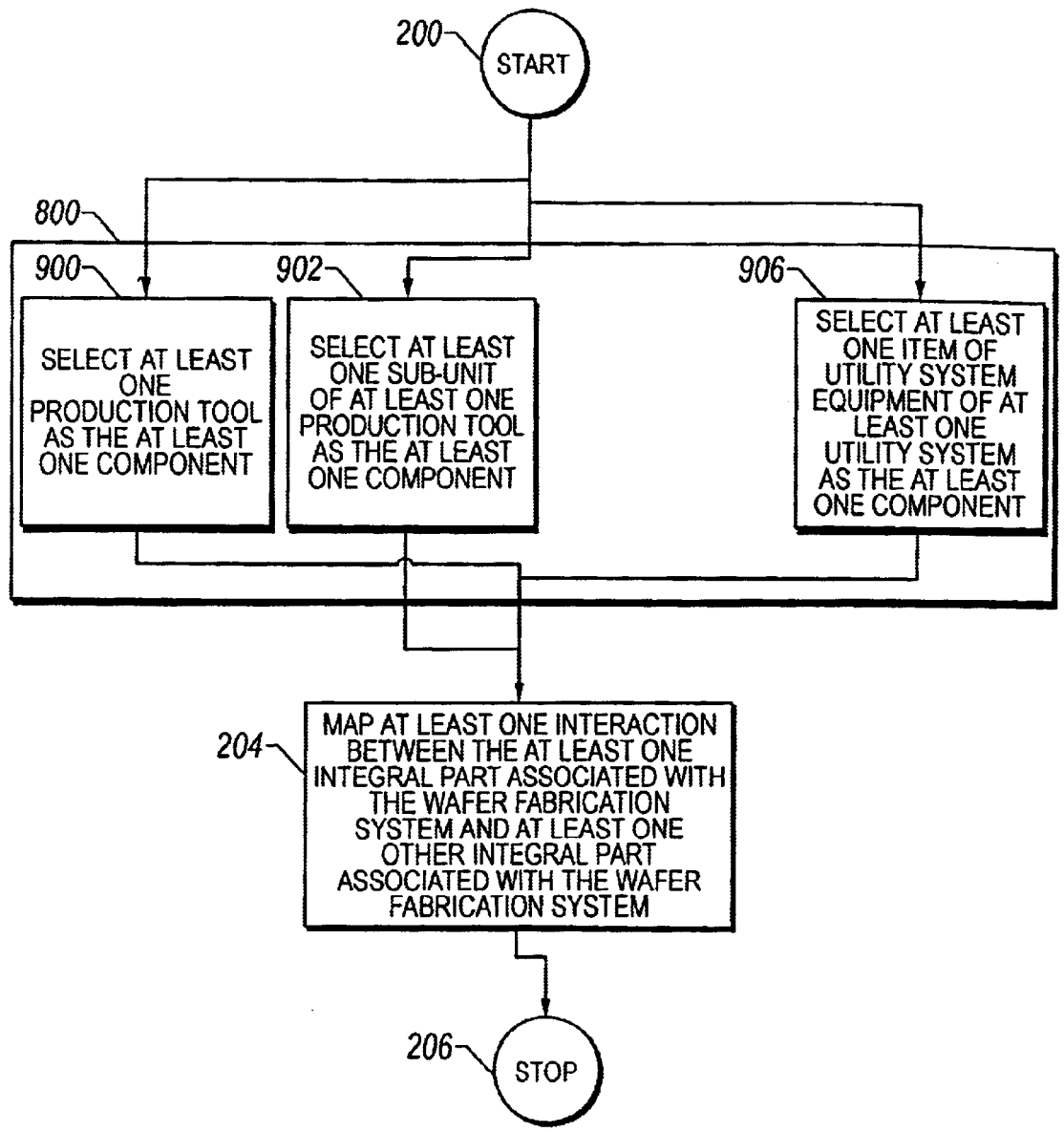
FIG. 9 shows a high-level logic flowchart showing several examples of the selection of the at least one component (as the term component is defined and used herein) associated with the wafer fabrication system.

Referring now to FIG. 9, shown is a high-level logic flowchart showing several examples of the selection of the at least one component (as the term component is defined and used herein) associated with the wafer fabrication system referenced in method step 800. Method step 900 illustrates that in a first instance, the selection of the at least one component (as the term component is defined and used herein) associated with the wafer fabrication system, referenced in method step 800, can involve selecting at least one production tool. Method step 902 illustrates that in a second instance, the selection of the at least one component (as the term component is defined and used herein) associated with the wafer fabrication system, referenced in method step 800, can involve selecting at least one sub-unit of at least one production tool. Method step 906 illustrates that in a third instance, the selection of the at least one component (as the term component is defined and used herein) associated with the wafer fabrication system, referenced in method step 800, can involve selecting at least one item of utility system equipment. The remaining shown steps function substantially as like-numbered steps described previously.

Referring now to FIG. 10, shown is a high-level logic flowchart showing an example of the selection of at least one integral part on a granular basis, as referenced in method step 700. Method step 1000 illustrates that in one instance, the selection of at the at least one integral part done on a granular basis, referenced in method step 700, involves selecting at least one control[4] associated with the wafer fabrication system. The remaining shown steps function substantially as like-numbered steps described previously.

[4]As used herein, a "Control" modifies or meters a utility as it flows by. Manual controls only link to a single utility. Automatic Controls link to two utilities—the one being controlled and the one doing the controlling. A Control does not consume utilities. Examples include: valves, dampers. circuit breakers, flow meters, transformers, sensors, etc.

Figure 11:
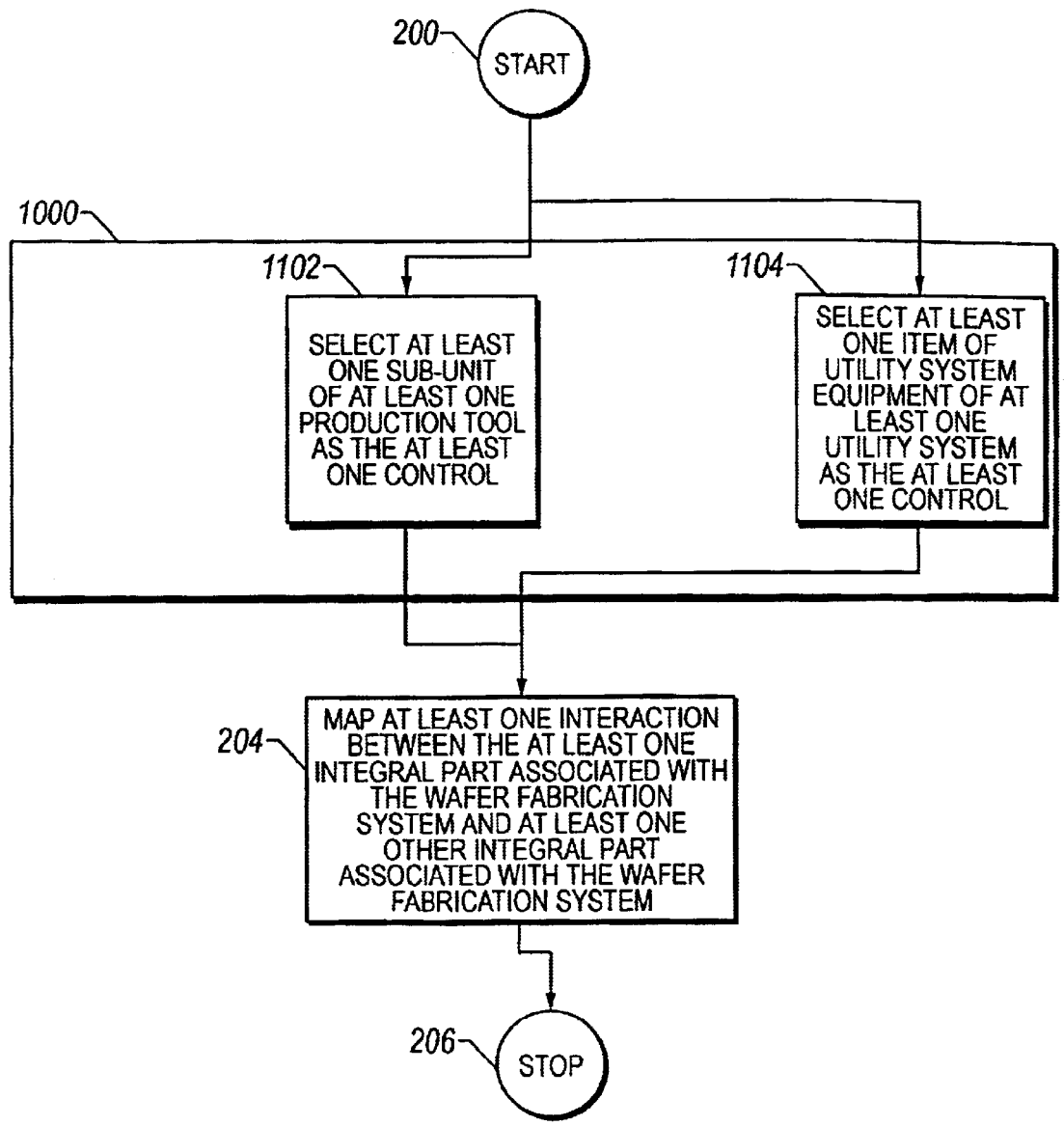
FIG. 11 shows a high-level logic flowchart showing several examples of the selection of the at least one control (as the term control is defined and used herein) associated with the wafer fabrication system.

Referring now to FIG. 11, shown is a high-level logic flowchart showing several examples of the selection of the at least one control (as the term control is defined and used herein) associated with the wafer fabrication system referenced in method step 1000. Method step 1102 illustrates that in a first instance, the selection of the at least one control (as the term control is defined and used herein) associated with the wafer fabrication system, referenced in method step 1000, can involve selecting at least one sub-unit of at least one production tool. Method step 1104 illustrates that in a third instance, the selection of the at least one control (as the term control is defined and used herein) associated with the wafer fabrication system, referenced in method step 1000, can involve selecting at least one item of utility system equipment. The remaining shown steps function substantially as like-numbered steps described previously.

Referring now to FIG. 12, shown is a high-level logic flowchart showing an example of the selection of the at least one integral part on a granular basis, as referenced in method step 700. Method step 1200 illustrates that in one instance, the selection of at the at least one integral part done on a granular basis, referenced in method step 700, involves selecting at least one connection[5] associated with the wafer fabrication system. The remaining shown steps function substantially as like-numbered steps described previously.

[5]As used herein, a "Connection" transports a single utility. It may be either linear (only two links) or branching (many links). There is no human interaction. Examples of Connections include: pipes, ducts, wyes & tees, wires, valve manifolds, breaker panels, etc. Connection item records are where CCC tracks flow and pressure quantity data.

Figure 13:
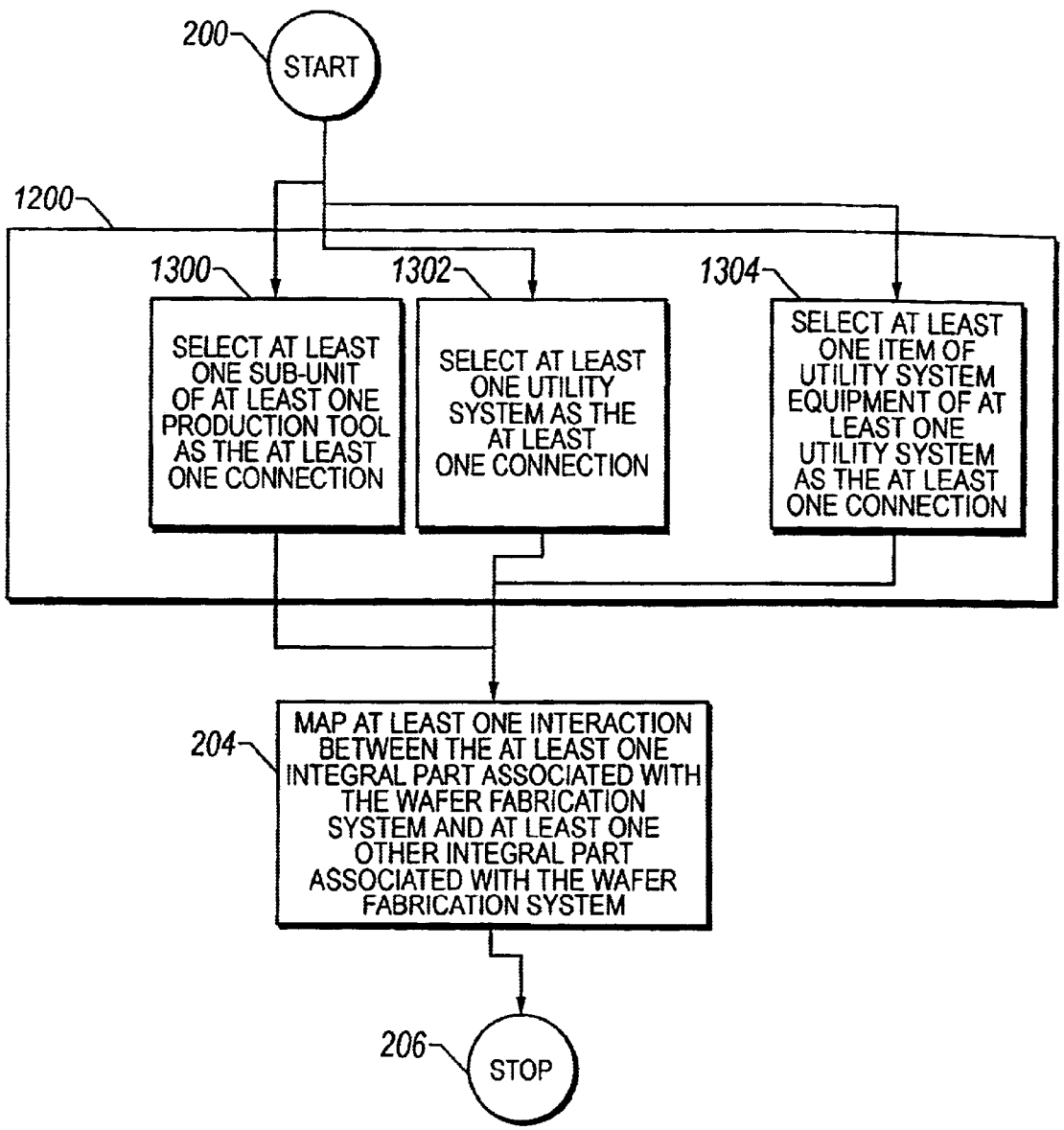
FIG. 13 shows a high-level logic flowchart showing several examples of the selection of the at least one connection (as the term connection is defined and used herein) associated with the wafer fabrication system.

Referring now to FIG. 13, shown is a high-level logic flowchart showing several examples of the selection of the at least one connection (as the term connection is defined and used herein) associated with the wafer fabrication system referenced in method step 1200. Method step 1300 illustrates that in a first instance, the selection of the at least one connection (as the term connection is defined and used herein) associated with the wafer fabrication system, referenced in method step 1200, can involve selecting at least one production tool. Method step 1302 illustrates that in a second instance, the selection of the at least one connection (as the term connection is defined and used herein) associated with the wafer fabrication system, referenced in method step 1200, can involve selecting at least one utility system. Method step 1304 illustrates that in one instance, the selection of the at least one connection (as the term connection is defined and used herein) associated with the wafer fabrication system, referenced in method step 1200, can involve selecting at least one item of utility system equipment. The remaining shown steps function substantially as like-numbered steps described previously.

Figure 14:
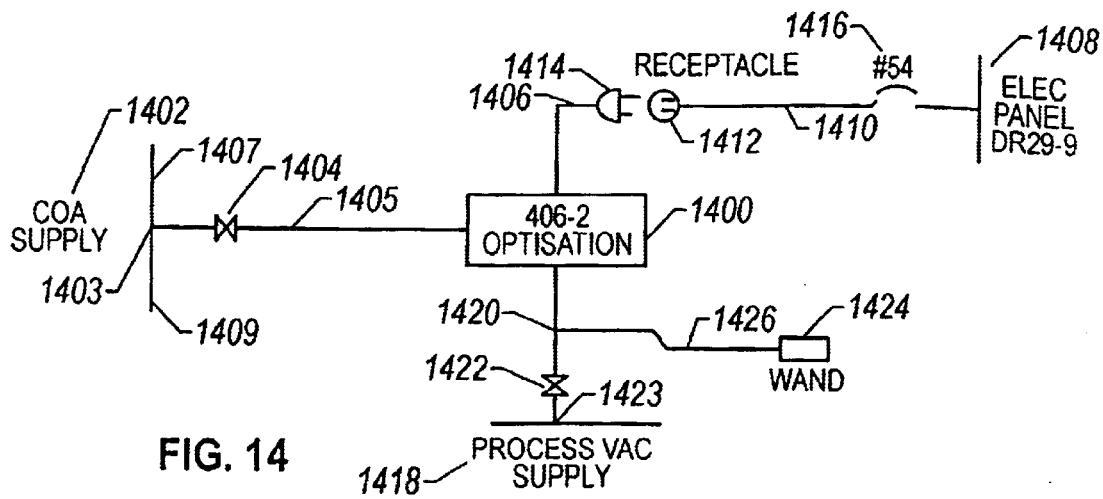
FIG. 14 shows apart of an evolving wafer fabrication system.
Figure 15:
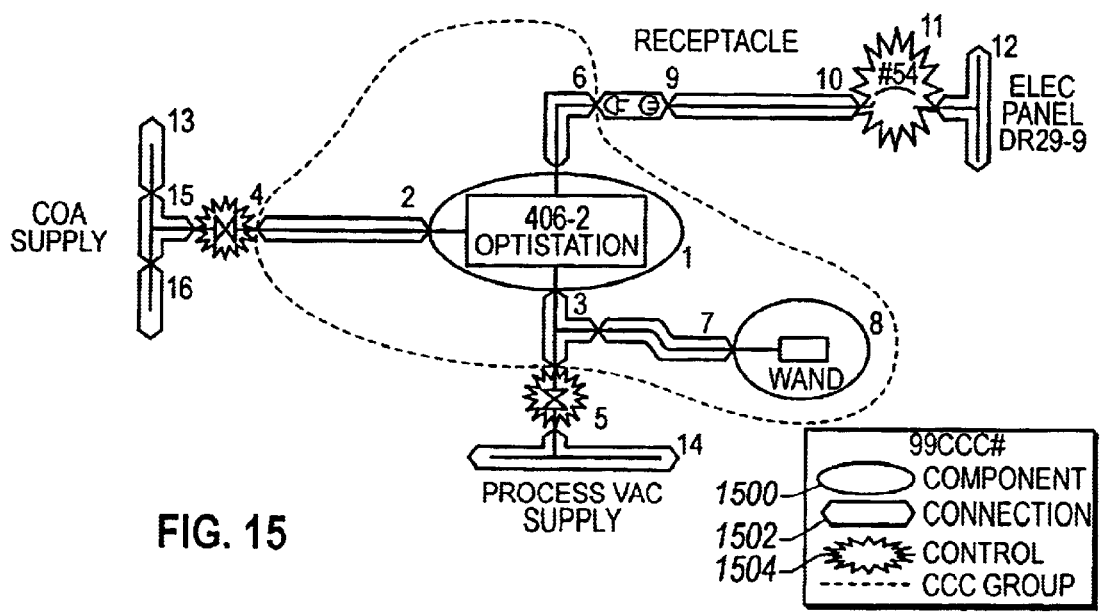
FIG. 15 shows the items of FIG. 14 designated as components, controls, or connections.
Figure 16:
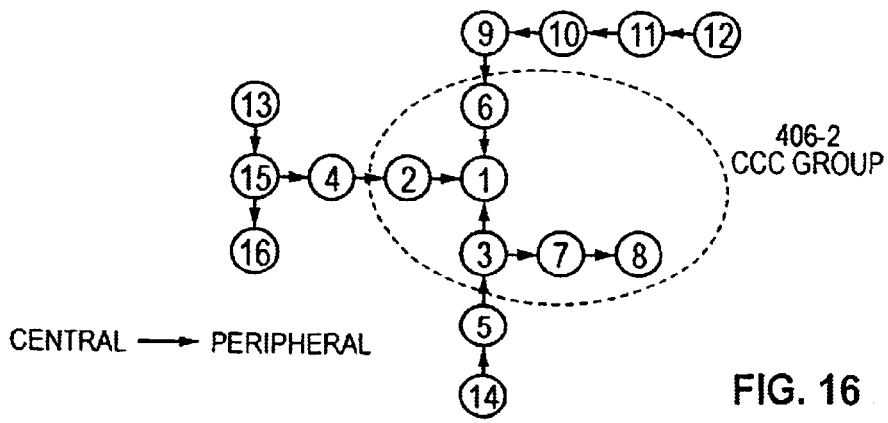
FIG. 16 shows a lattice diagram of Components, Controls, Connections items of FIGS. 14 and 15.

Referring now to FIGS. 14, 15, and 16, shown are "real world" examples of components, connections, controls, and their corresponding couplings. Referring to FIG. 14, shown is optistation 1400. Optistation is supplied with necessary air via clean ordinary air supply (COA) 1402, via air tubing 1405. The supply of air delivered to optistation 1400 is controlled by air control valve 1404. Shown is that air valve 1404 is connected to T-connection 1403, where one leg of T-connection 1403 connects to air tubing 1407 and the other leg of T-connection 1403 connects to air tubing 1409.

Electrical panel 1408 supplies optistation 1400 with electrical power via electrical panel wiring 1410, electrical panel receptacle female connector 1412, electrical panel receptacle male connector 1414 and electrical power cord 1406. The supply of electricity is controlled via breaker ™54 1416.

Process vacuum supply 1418 supplies optistation 1400 with vacuum via vacuum tubing T-connection 1420. Process vacuum supply 1418 is controlled via vacuum control valve 1422 and wand 1424 via wand tubing 1426. Process vacuum supply 1418 is supplied to vacuum control valve 1422 via vacuum tubing T-connection 1423.

With reference now to FIG. 15, shown are the items of FIG. 14 designated as components, controls, or connections, which are denoted by shapes 1500, 1502, and 1504 which are drawn surrounding the items. Depicted is that electrical panel 1408 has been designated connection 12. Illustrated is that breaker ™54 1416 has been designated control 11. Shown is that electrical panel wiring 1410 has been designated connection 10. Depicted electrical panel receptacle female connector 1412 has been designated connection 9. Illustrated is that electrical panel receptacle male connector 1414 and electrical power cord 1406 have been collectively designated connection 6. Shown is that optistation 1400 has been designated component 1. Depicted is that vacuum tubing T-connection 1420 has been designated connection 3. Illustrated is that wand tubing 1426 has been designated connection 7. Shown is that wand 1424 has been designated component 8. Illustrated is that vacuum valve 1422 has been designated control 5. Shown is that vacuum tubing T-connection 1423 has been designated connection 14. Shown is that air tubing 1405 has been designated as connection 2. Depicted is that air valve 1404 has been designated as control 4. Illustrated is that T-connection 1403 has been designated as connection 15. Shown is that air tubing 1407 has been designated as connection 13 and air tubing 1409 has been designated as connection 15.

FIG. 15 helps illustrate various types of couplings between integral parts of wafer fabrication systems. A mechanical coupling is a coupling based on that fact that coupled parts exchange or carry electrical energy (i.e., are mechanically coupled). One example of a mechanical coupling is the coupling between air tubing 1405/connection 2 and air valve 1404/control 4. Another example of a mechanical coupling is the coupling between optistation 1400/component 1 and vacuum tubing T-connection 1420/connection 3.

An electrical coupling is a coupling based on the fact that coupled parts exchange or carry electrical energy (i.e., are electrically coupled). One example of an. electrical coupling is the coupling between electrical panel 1408/connection 12 and breaker ™54 1416/control 11, in that even though the integral parts are physically an electrical panel 1408 and a breaker ™54 1416, their coupling is based on the fact that the integral parts carry electrical energy. Likewise for the depicted coupling between electrical panel wiring 1410/connection 10 and electrical panel receptacle female connector 1412/connection 9.

A chemical coupling is a coupling based on the fact that coupled parts exchange or carry certain chemicals (i.e., are chemically coupled). One example of chemical coupling (for sake of illustration, air is viewed here as a "chemical")is the coupling between air tubing 1405/connection 2 and optistation 1400/component 1, in that air is exchanged between the connection and the component.

A thermal coupling is a coupling based on the fact that coupled parts exchange or carry thermal energy. For example, a coupling between optistation 1400/component 1 and air conditioning unit (not shown)/component (not shown) in that heat is exchanged between the two components. Likewise, virtually any depicted mechanical coupling could be alternatively viewed as a thermal coupling.

The foregoing described examples of couplings. It should be apparent from the foregoing that this scheme can allow the same coupling to be viewed in different ways depending on context. For example, two coupled integral parts could be viewed as mechanically coupled (if mechanical concerns were of interest), electrically coupled (if electrical concerns were of interest), chemically coupled (if chemical concerns were of interest), and/or thermally coupled (if thermal concerns were of interest). Thus, the granular scheme described herein gives great flexibility in capturing a wafer fabrication system beyond any theory heretofore available.

With reference now to FIG. 16, shown is a lattice diagram of Components, Controls, Connections items of FIGS. 14 and 15. Also shown are central and peripheral connections.

II. Generating Presentation of Relationships Involving Integral Parts of Evolving Wafer Fabrication System As was noted in the Description of the Related Art section, above, a significant problem that arises with respect to an evolving wafer fabrication system is that such system's evolving nature makes it very difficult to determine with 100% certainty the actual mechanical, electrical, chemical, thermal, etc. relationships between the one or more particular integral parts of the wafer fabrication system. As was explained in the Description of Related Art section, the longer a wafer fabrication system has been in place and evolving, the more a problem exists with respect to knowing the relationships between the integral parts of the wafer fabrication system. The foregoing section described various processes and devices whereby an evolving wafer fabrication system could be partially or wholly captured at virtually any point in its evolution and from virtually any point within the wafer fabrication system. Once the wafer fabrication system has been captured, in whole or in part, the captured data can be utilized to give an up-to-date picture of the relationships between the captured integral parts of the wafer fabrication system, with an accuracy heretofore unavailable in the absence of the present inventions.

Figure 52:
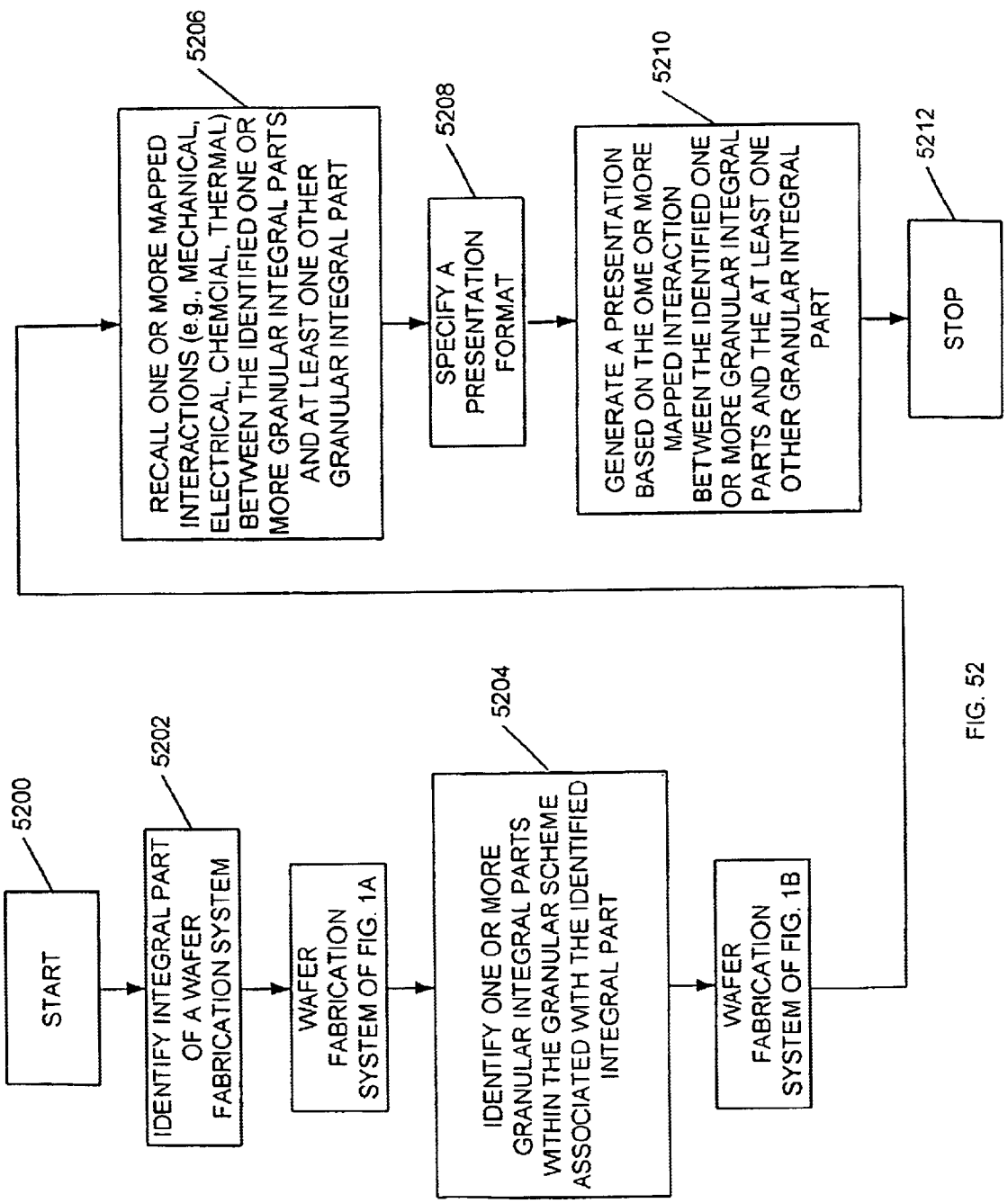
FIG. 52 shows a high-level partially schematic diagram depicting a process by which captured data can be utilized to give an up-to-date picture of the relationships between the captured integral parts of the wafer fabrication system.

Referring now to FIG. 52, shown is a high-level partially schematic diagram depicting a process by which captured data can be utilized to give an up-to-date picture of the relationships between the captured integral parts of the wafer fabrication system. Method step 5200 depicts the start of the process. Method step 5202 illustrates the identification (typically done by a human user selecting between various presentation options via clicking a button on a graphical user interface) of some integral part of wafer fabrication system 100. Method step 5204 shows the identification of one or more "granular" integral parts within a granular scheme, which for sake of illustration is shown as the "granular scheme" of FIG. 1B. Method step 5206 depicts the discernment, or recalling, of one or more mapped interactions (e.g., mechanical, electrical, chemical, and/or thermal couplings which were discussed above) between or involving the identified one or more granular integral parts and at least one other granular integral part. Method step 5208 illustrates the specification of a particular presentation format (typically accomplished via a human user selecting between various presentation options by clicking a button on a graphical user interface). Method step 5210 shows the generation of a presentation in a manner consistent with the selected presentation option and the identified one or more granular integral parts. As will be discussed below, the presentation can be in any format, and the fact that the presentation is generated using the granular format should not be taken to mean that the presentation must be in granular format. Rather, the granular format allows virtually infinite flexibility in presentation, as will become apparent below. Method step 5212 shows the end of the process.

Figure 17:
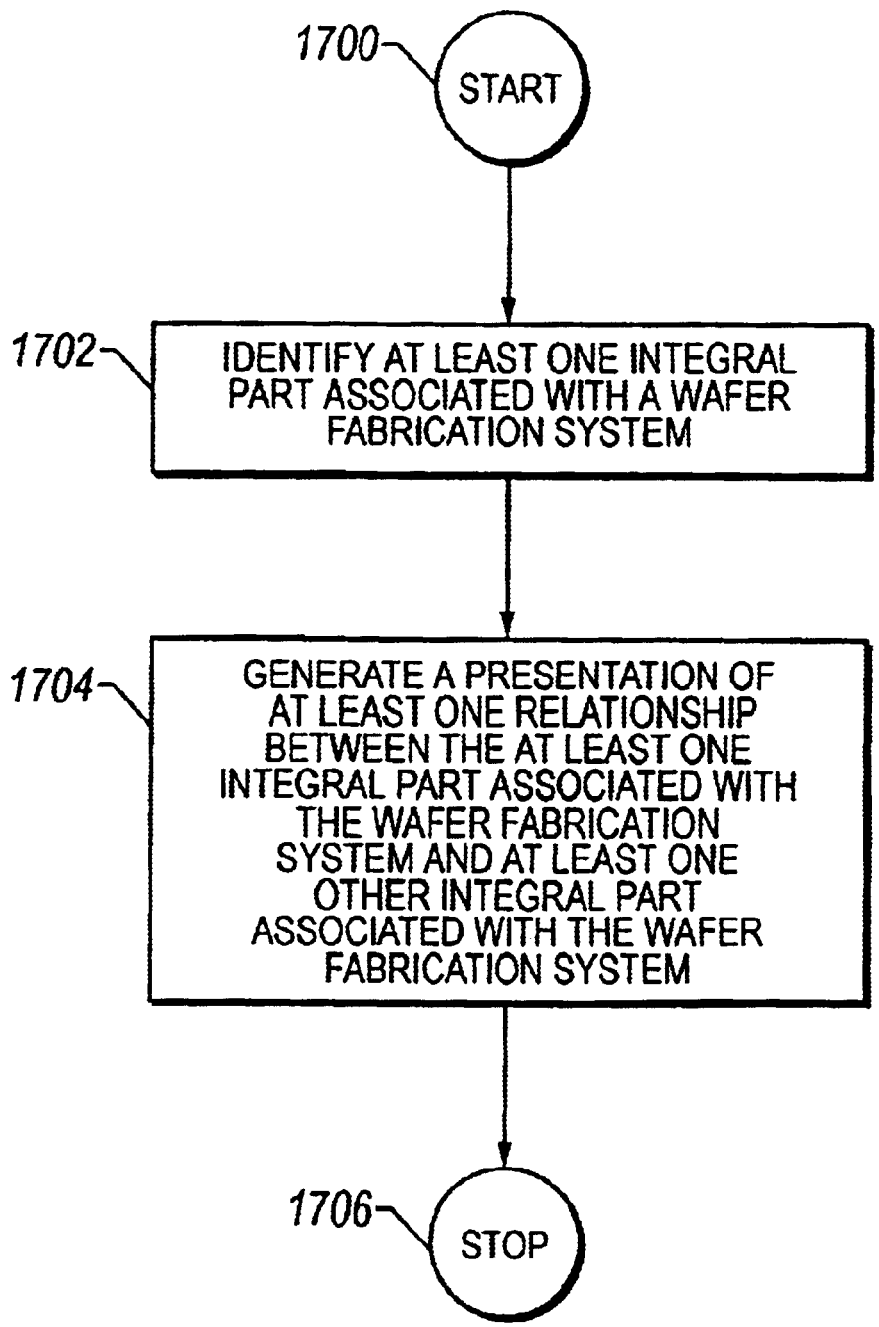
FIG. 17 depicts a high-level logic flowchart of a process by which the captured data can be utilized to give an up-to-date picture of the relationships between the captured integral parts of the wafer fabrication system.

Referring now to FIG. 17, depicted is a high-level logic flowchart of a process by which the captured data can be utilized to give an up-to-date picture of the relationships between the captured integral parts of the wafer fabrication system. Method step 1700 shows the start of the process. Method step 1702 depicts the identification of at least one integral part associated with a wafer fabrication system. Method step 1704 illustrates the generation and presentation of at least one relationship between the at least one integral part associated with the wafer fabrication system and at least one other integral part associated with the wafer fabrication system. Method step 1706 shows the end of the process.

Figure 18:
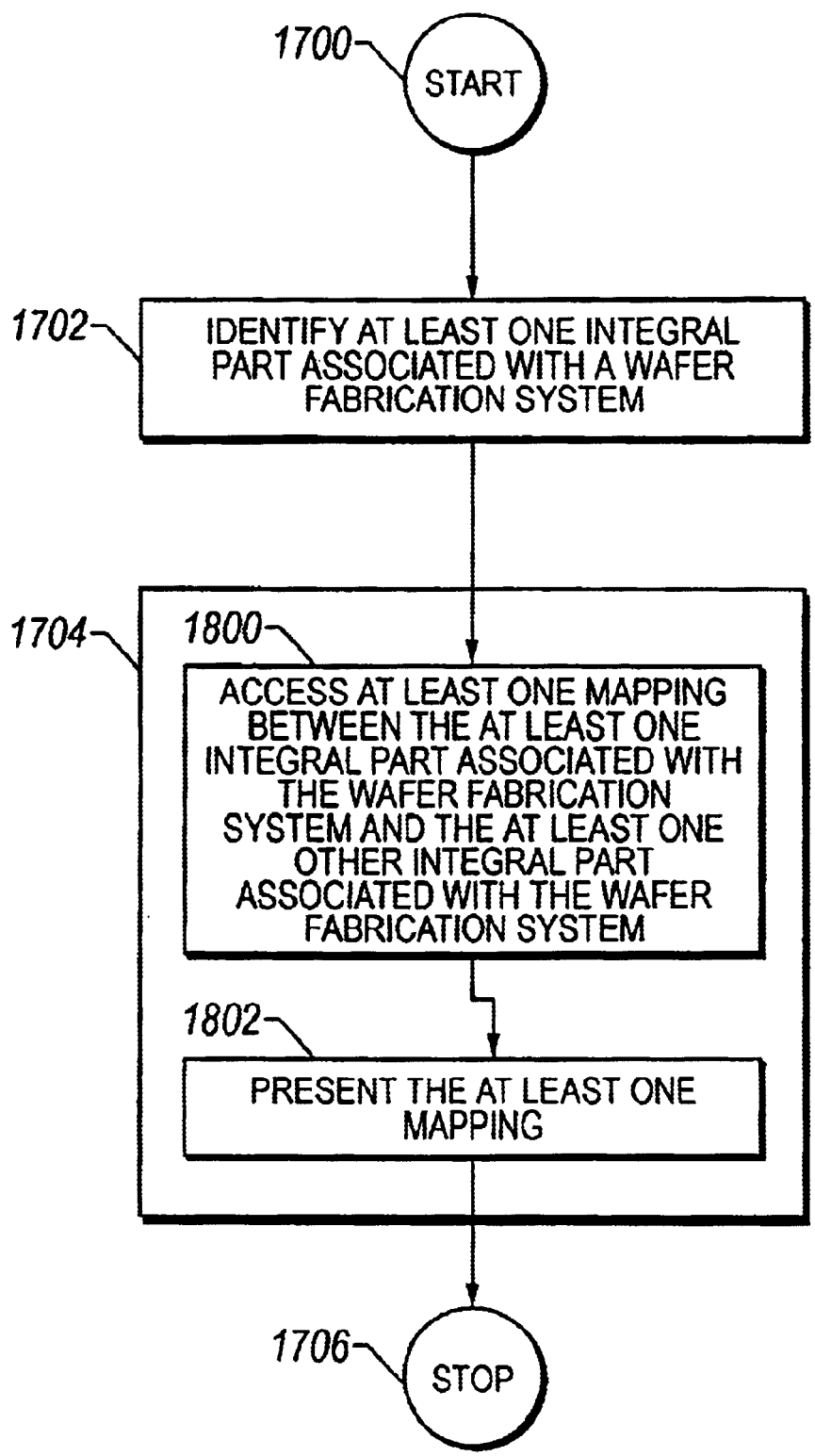
FIG. 18 illustrates a high-level logic flowchart showing several examples of the generation and presentation of at least one relationship between the at least one integral part associated with the wafer fabrication system and at least one other integral part associated with the wafer fabrication system.

Referring now to FIG. 18, illustrated is a high-level logic flowchart showing several examples of the generation and presentation of at least one relationship between the at least one integral part associated with the wafer fabrication system and at least one other integral part associated with the wafer fabrication system referenced in method step 1704. Method step 1800 illustrates that in one instance, the generation and presentation of at least one relationship between the at least one integral part associated with the wafer fabrication system and at least one other integral part associated with the wafer fabrication system referenced in method step 1704 can include accessing at least one mapping between the at least one integral part associated with the wafer fabrication system and the at least one other part of the wafer fabrication system. Method step 1802 depicts that in one instance, the generation and presentation of at least one relationship between the at least one integral part associated with the wafer fabrication system and at least one other integral part associated with the wafer fabrication system referenced in method step 1704 can further include presenting the at least one mapping between the at least one integral part associated with the wafer fabrication system and the at least one other part of the wafer fabrication system. The remaining shown steps function substantially as like-numbered steps described previously.

Figure 19:
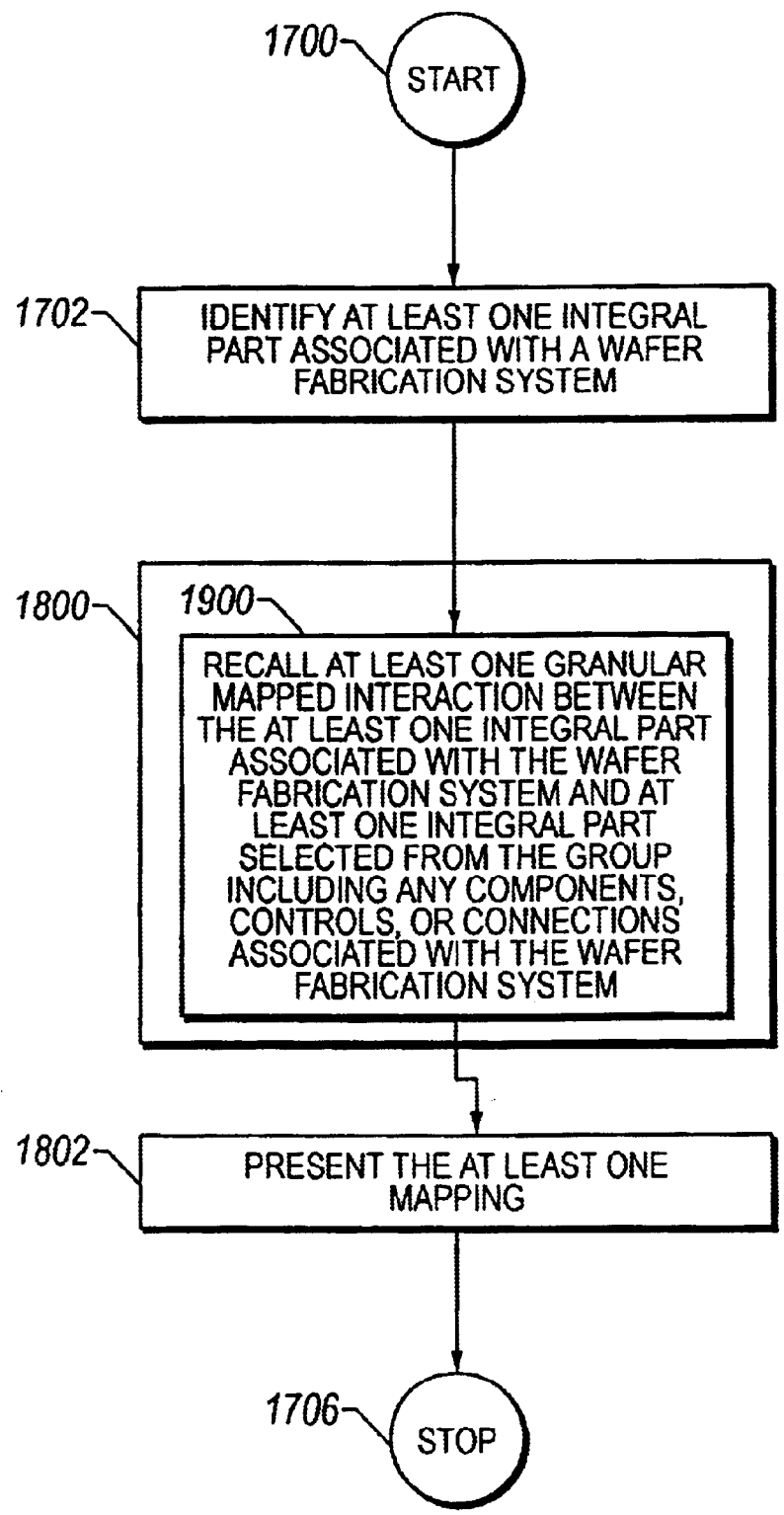
FIG. 19 shows a high-level logic flow chart showing an example of the accessing at least one mapping between the at least one integral part associated with the wafer fabrication system and the at least one other part of the wafer fabrication system.

Referring now to FIG. 19, shown is a high-level logic flow chart showing an example of the accessing at least one mapping between the at least one integral part associated with the wafer fabrication system and the at least one other part of the wafer fabrication system referenced in method step 1800. Method step 1900 illustrates that in one instance, accessing at least one mapping between the at least one integral part associated with the wafer fabrication system and the at least one other part of the wafer fabrication system, referenced in method step 1800, can be the recalling of at least one granular mapping between the at least one integral part associated with the wafer fabrication system and at least one integral part selected from the group including but not limited to any components, controls, or connections associated with the wafer fabrication system. The remaining shown steps function substantially as like-numbered steps described previously.

Figure 20:
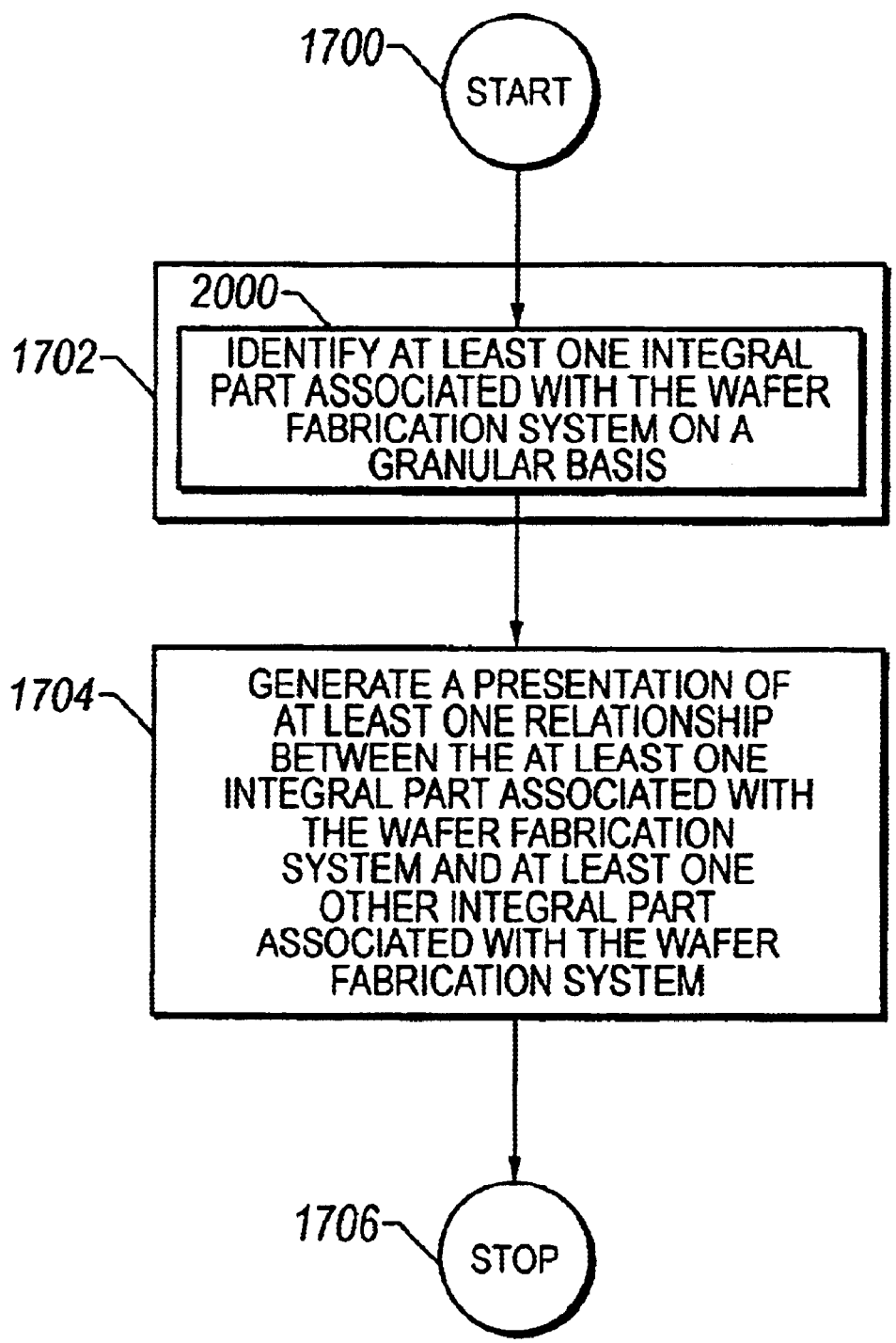
FIG. 20 shows a high-level logic flowchart showing an example of how the identification of at least one integral part associated with a wafer fabrication system can be achieved.

Referring now to FIG. 20, shown is a high-level logic flowchart showing an example of how the identification of at least one integral part associated with a wafer fabrication system, referenced in method step 1702, can be achieved. Method step 2000 illustrates that in one instance, the identification of at least one integral part associated with a wafer fabrication system referenced in method step 1702 can be achieved by the identification of at least one integral part on a granular basis. The remaining shown steps function substantially as like-numbered steps described previously.

Figure 21:
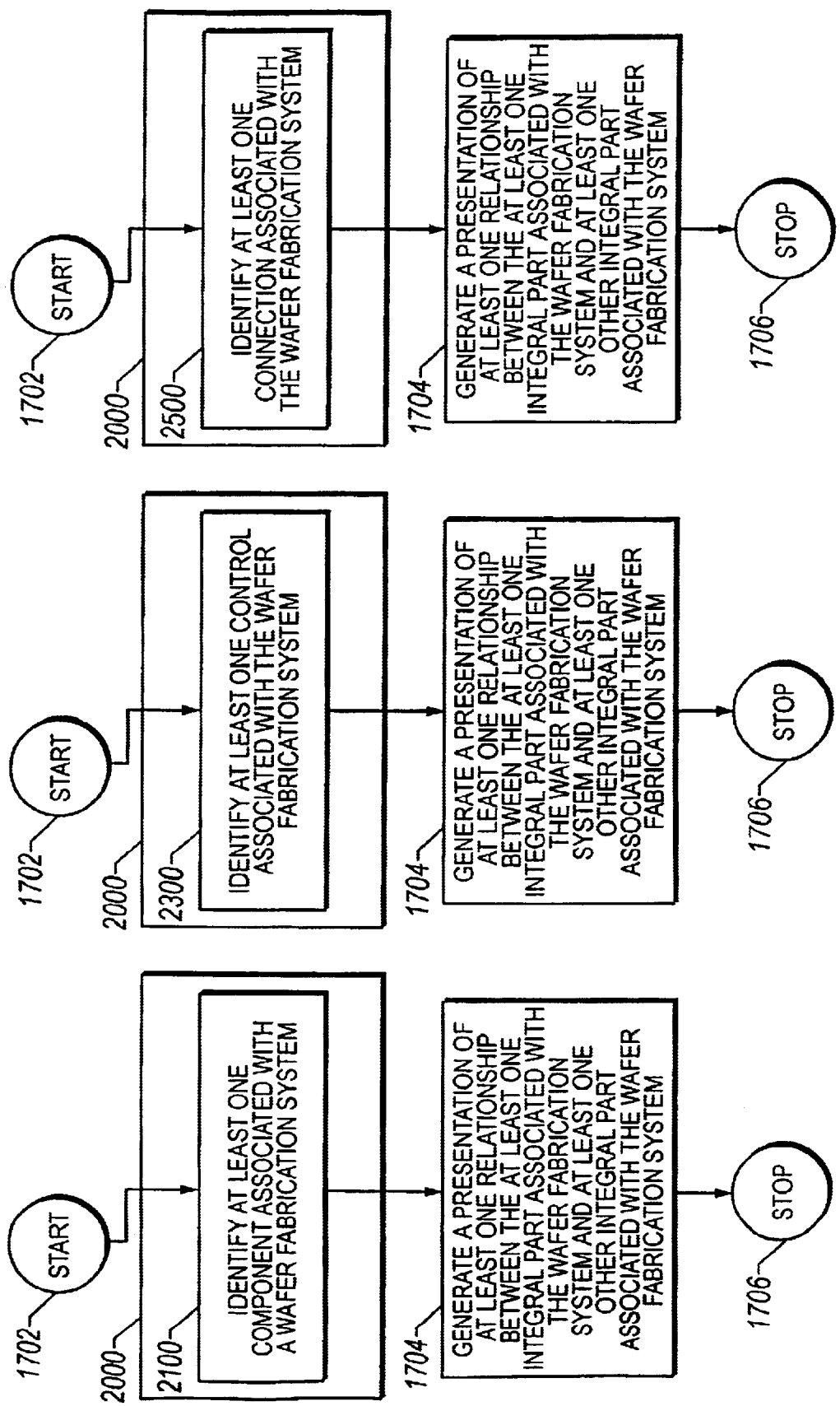
FIG. 21 shows a high-level logic flowchart showing an example of the identification of at least one integral part done on a granular basis.

Referring now to FIG. 21, shown is a high-level logic flowchart showing an example of the identification of at least one integral part done on a granular basis as is referenced in method stop 2000. Method step 2100 illustrates that in one instance, the identification of at least one integral part on a granular basis, referenced in method step 2000, involves identifying at least one component (as the term component is defined and used herein) associated with the wafer fabrication system. The remaining shown steps function substantially as like-numbered steps described previously.

Figure 22:
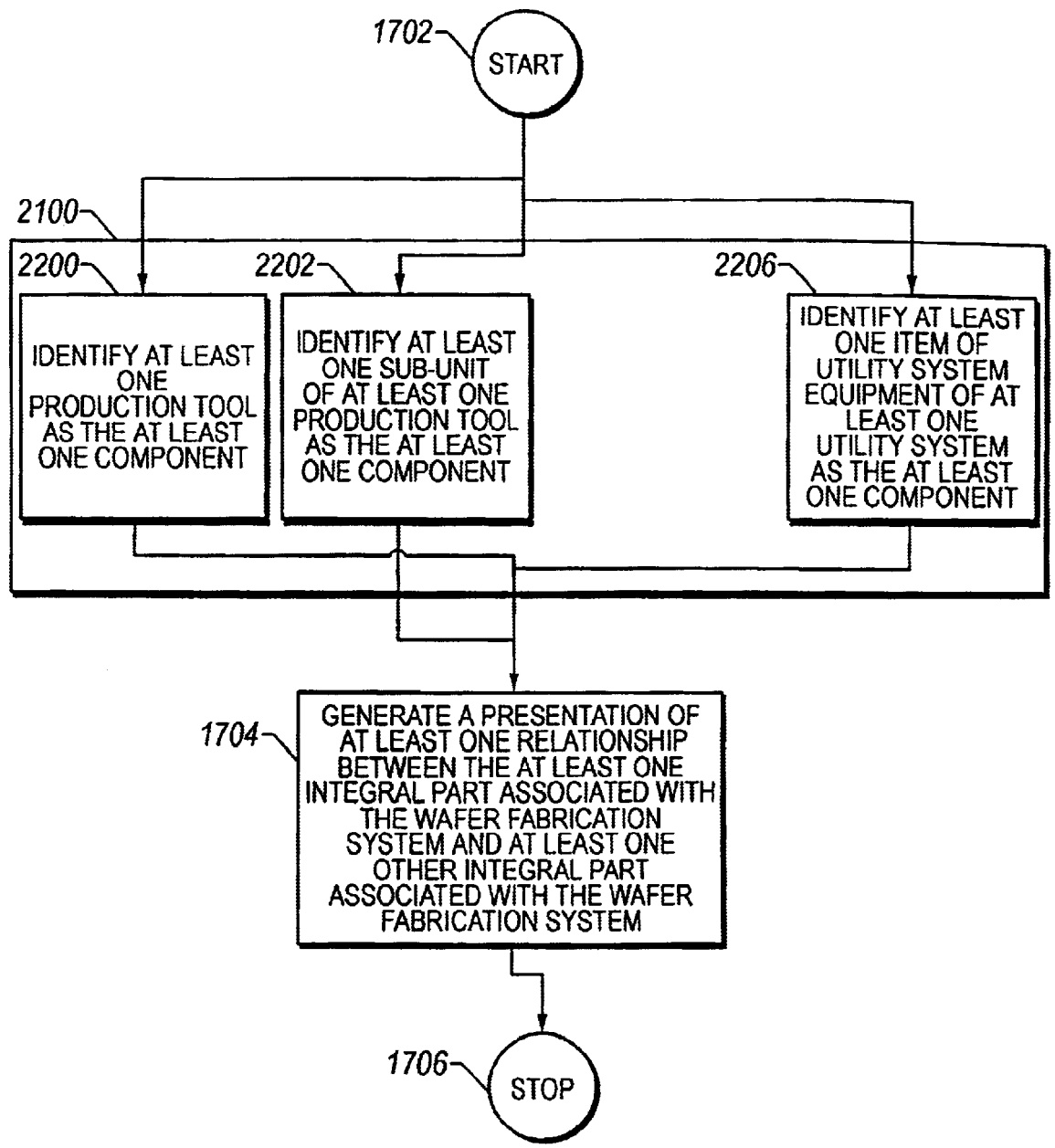
FIG. 22 shows a high-level logic flowchart showing several examples of the identification of the at least one component (as the term component is defined and used herein) associated with the wafer fabrication system.

Referring now to FIG. 22, shown is a high-level logic flowchart showing several examples of the identification of the at least one component (as the term component is defined and used herein) associated with the wafer fabrication system referenced in method step 2100. Method step 2200 illustrates that in a first instance, the identification of the at least one component (as the term component is defined and used herein) associated with the wafer fabrication system, referenced in method step 2100, can involve identifying at least one production tool. Method step 2202 illustrates that in a second instance, the identification of the at least one component (as the term component is defined and used herein) associated with the wafer fabrication system, referenced in method step 2100, can involve identifying at least one sub-unit of at least one production tool. Method step 2206 illustrates that in a third instance, the identification of the at least one component (as the term component is defined and used herein) associated with the wafer fabrication system, referenced in method step 2100, can involve identifying at least one item of utility system equipment. The remaining shown steps function substantially as like-numbered steps described previously.

Referring now to FIG. 23, shown is a high-level logic flowchart showing an example of the identification of at least one integral part on a granular basis as is referenced in method stop 2000. Method step 2300 illustrates that in one instance, the identification of at least one integral part on a granular basis, referenced in method step 2000, involves identifying at least one control (as the term control is defined and used herein) associated with the wafer fabrication system. The remaining shown steps function substantially as like-numbered steps described previously.

Figure 24:
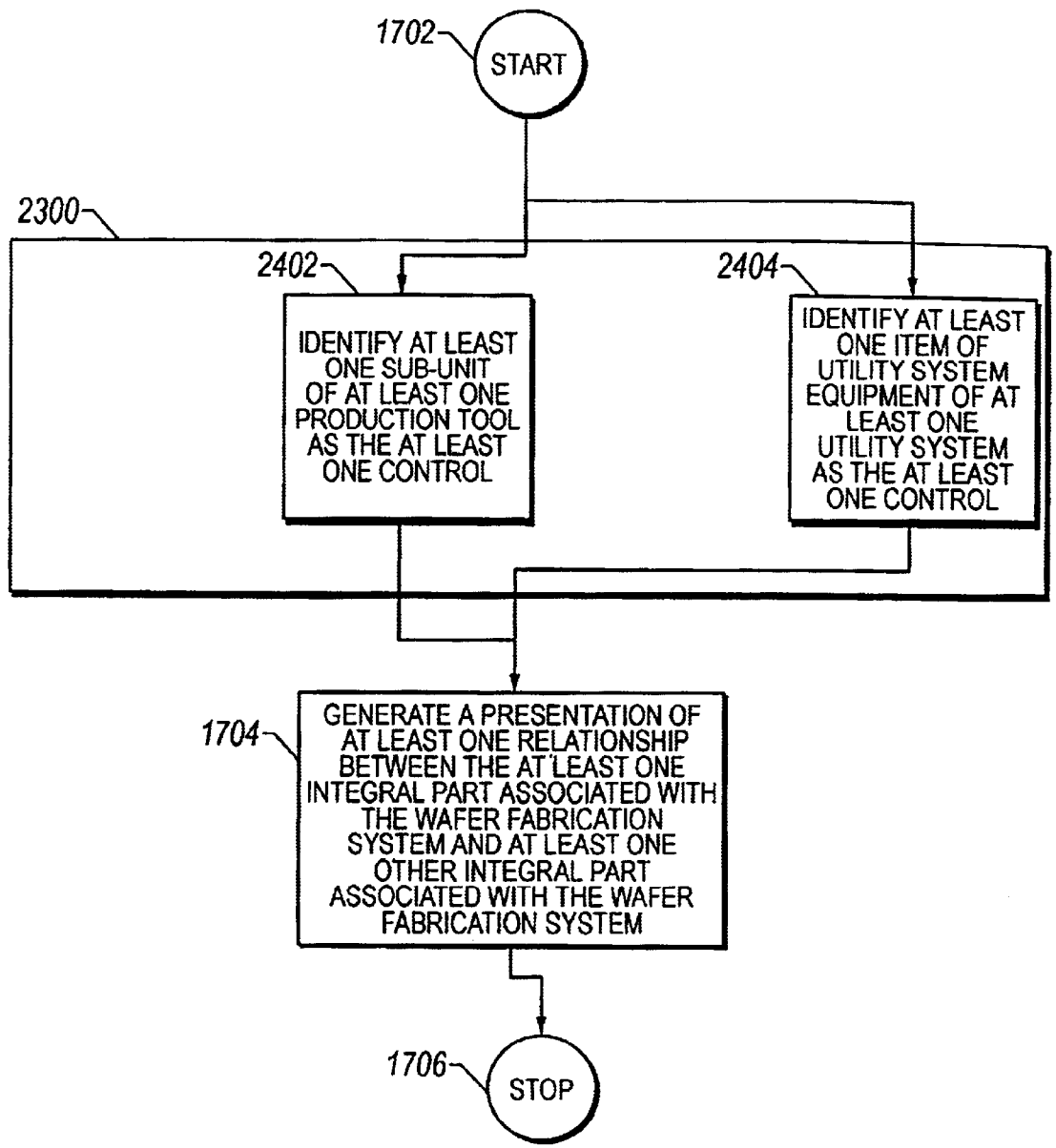
FIG. 24 shows a high-level logic flowchart showing several examples of the identification of the at least one control (as the term control is defined and used herein) associated with the wafer fabrication system.

Referring now to FIG. 24, shown is a high-level logic flowchart showing several examples of the identification of the at least one control (as the term control is defined and used herein) associated with the wafer fabrication system referenced in method step 2300. Method step 2402 illustrates that in a first instance, the identification of the at least one control (as the term control is defined and used herein) associated with the wafer fabrication system, referenced in method step 2300, can involve identifying at least one sub-unit of at least one production tool. Method step 2404 illustrates that in a second instance, the identification of the at least one control (as the term control is defined and used herein) associated with the wafer fabrication system, referenced in method step 2303, can involve identifying at least one item of utility system equipment. The remaining shown steps function substantially as like-numbered steps described previously.

Referring now to FIG. 25, shown is a high-level logic flowchart showing an example of the identification of at least one integral part on a granular basis as is referenced in method stop 2000. Method step 2500 illustrates that in one instance, the identification of at least one integral part done on a granular basis, referenced in method step 2000, can involve identifying at least one connection (as the term connection is defined and used herein) associated with the wafer fabrication system. The remaining shown steps function substantially as like-numbered steps described previously.

Figure 26:
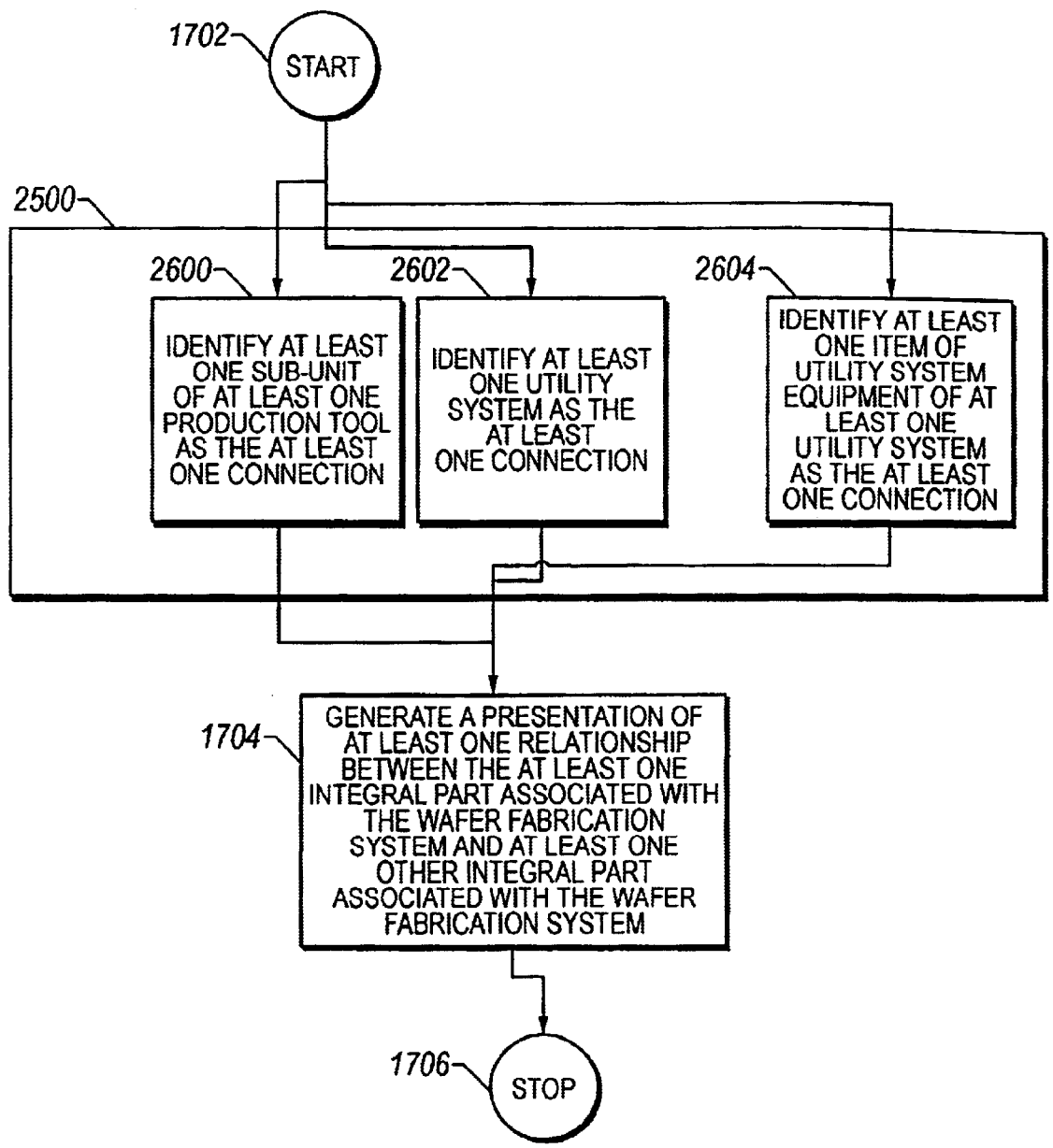
FIG. 26 shows a high-level logic flowchart showing several examples of the selection of at least one connection (as the term connection is defined and used herein) associated with the wafer fabrication system.

Referring now to FIG. 26, shown is a high-level logic flowchart showing several examples of the selection of at least one connection (as the term connection is defined and used herein) associated with the wafer fabrication system referenced in method step 2500. Method step 2600 illustrates that in a first instance, the selection of the at least one connection (as the term connection is defined and used herein) associated with the wafer fabrication system, referenced in method step 2500, can involve selecting at least one production tool. Method step 2602 illustrates that in a second instance, the selection of the at least one connection (as the term connection is defined and used herein) associated with the wafer fabrication system, referenced in method step 2500, can involve selecting at least one utility system. Method step 2604 illustrates that in one instance, the selection of the at least one connection (as the term connection is defined and used herein) associated with the wafer fabrication system, referenced in method step 2500, can involve selecting at least one item of utility system equipment. The remaining shown steps function substantially as like-numbered steps described previously.

Figure 27:
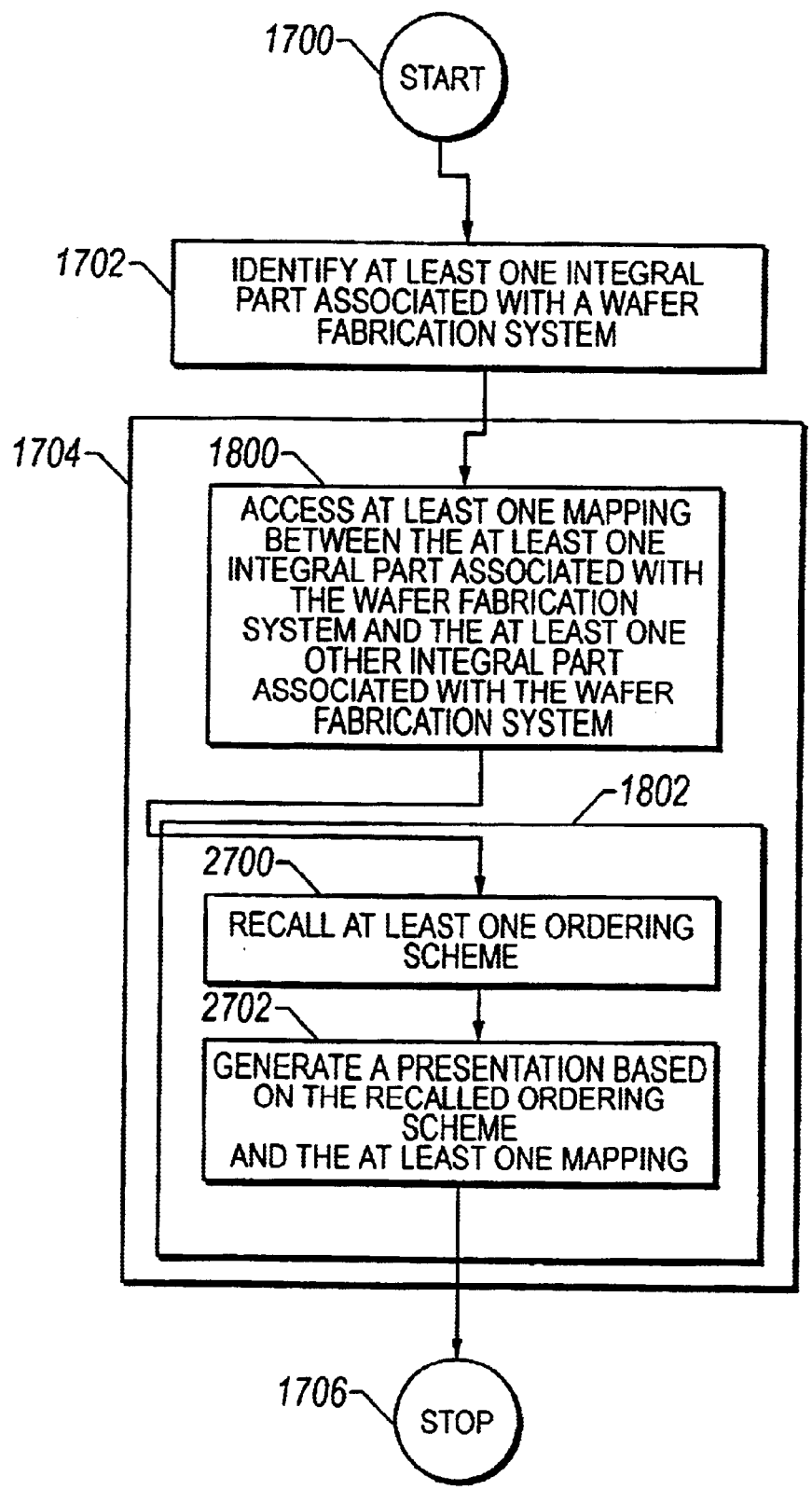
FIG. 27 shows a high-level logic flowchart showing an example of the generation and presentation of at least one relationship between the at least one integral part associated with the wafer fabrication system and at least one other integral part associated with the wafer fabrication system.

Referring now to FIG. 27, shown is a high-level logic flowchart showing an example of the generation and presentation of at least one relationship between the at least one integral part associated with the wafer fabrication system and at least one other integral part associated with the wafer fabrication system referenced in method step 1704. Method step 2700 illustrates that in an one instance, the generation and presentation of at least one relationship between the at least one integral part associated with the wafer fabrication system and at least one other integral part associated with the wafer fabrication system, referenced in method step 1704, involves recalling at least one ordering scheme. Method step 2702 further illustrates that in an one instance, the generation and presentation of at least one relationship between the at least one integral part associated with the wafer fabrication system and at least one other integral part associated with the wafer fabrication system, referenced in method step 1704, further involves generating a presentation based on the recalled ordering scheme and the at least one mapping. The remaining shown steps function substantially as like-numbered steps described previously.

Figure 28:
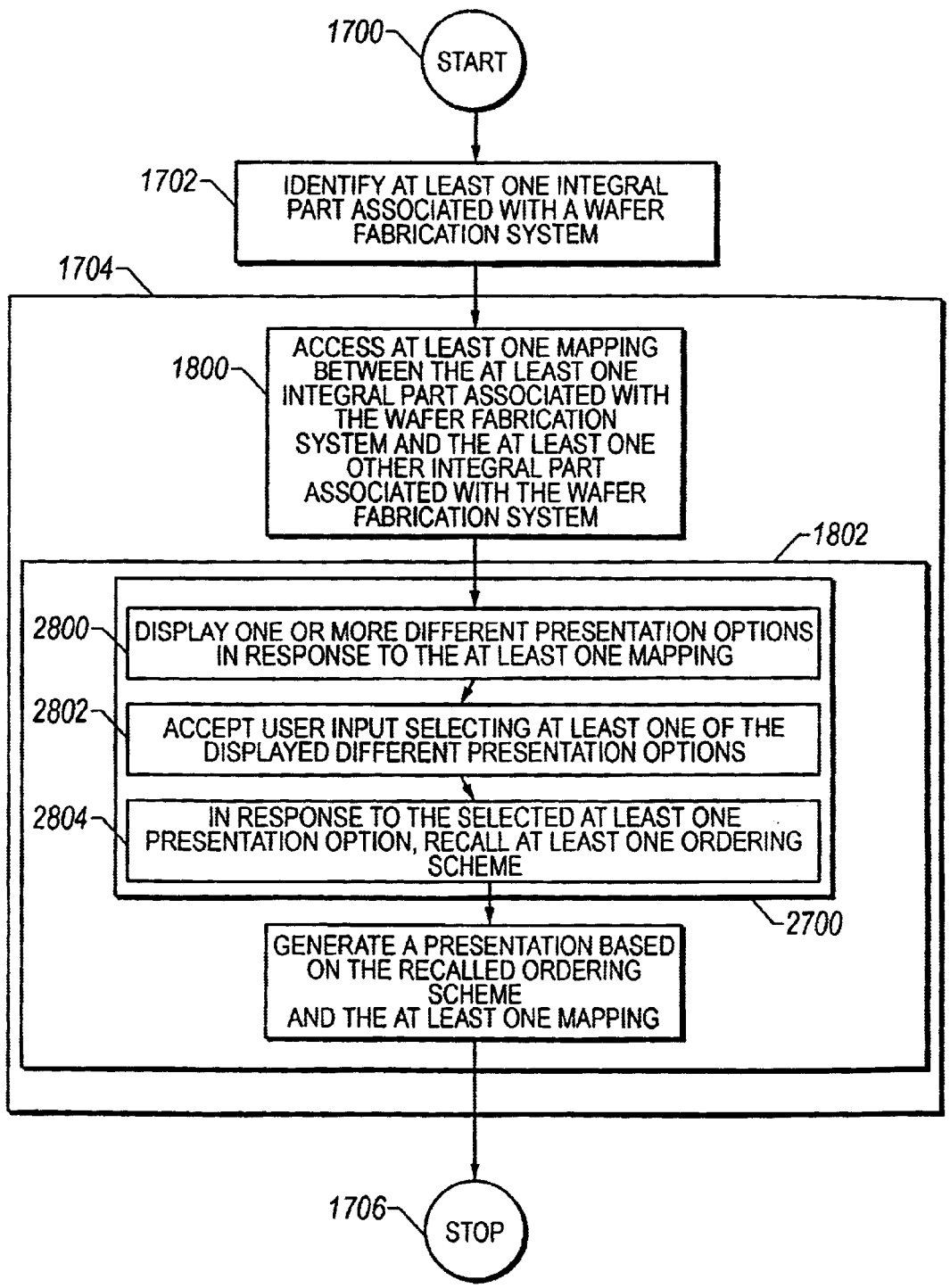
FIG. 28 shows a high-level logic flowchart showing an example of recalling at least one ordering scheme.

Referring now to FIG. 28, shown is a high-level logic flowchart showing an example of recalling at least one ordering scheme referenced in method step 2700. Method step 2800 illustrates that in an one instance, recalling at least one ordering scheme, referenced in method step 2700, involves displaying one or more different presentation options in response to at least one mapping, referenced in step 1800. Method step 2802 further illustrates that in an one instance, recalling at least one ordering scheme, referenced in method step 2700, further involves accepting user input selective of the displayed one ore more different presentation options. Method step 2804 further illustrates that in an one instance, recalling at least one ordering scheme, referenced in method step 2700, further involves recalling at least one ordering scheme in response to the accepted user input selective of the displayed one or more different presentation options. The remaining shown steps function substantially as like-numbered steps described previously.

Figure 29A:
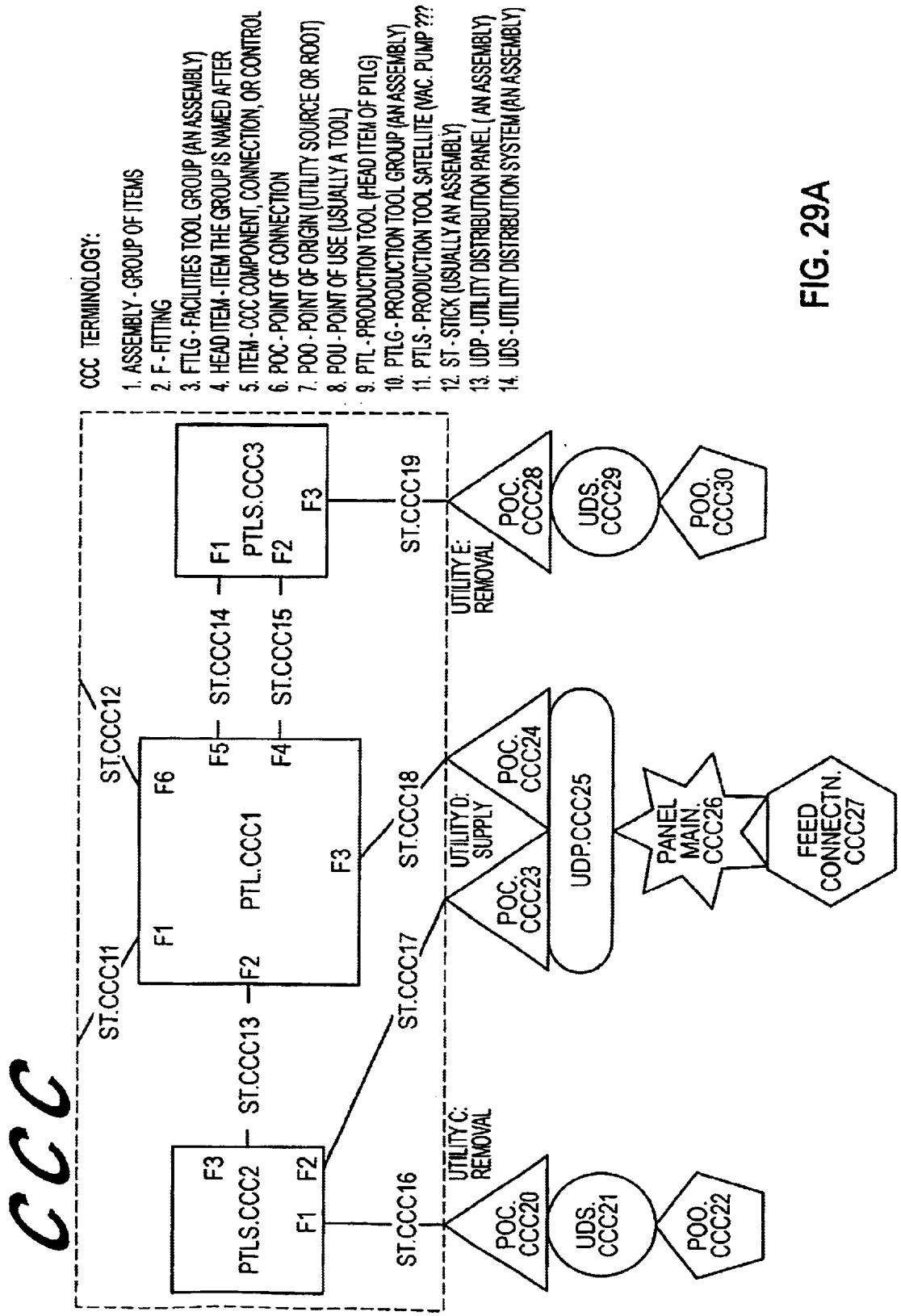
FIG. 29A shows grouping based on facilities engineering concepts.
Figure 30A:
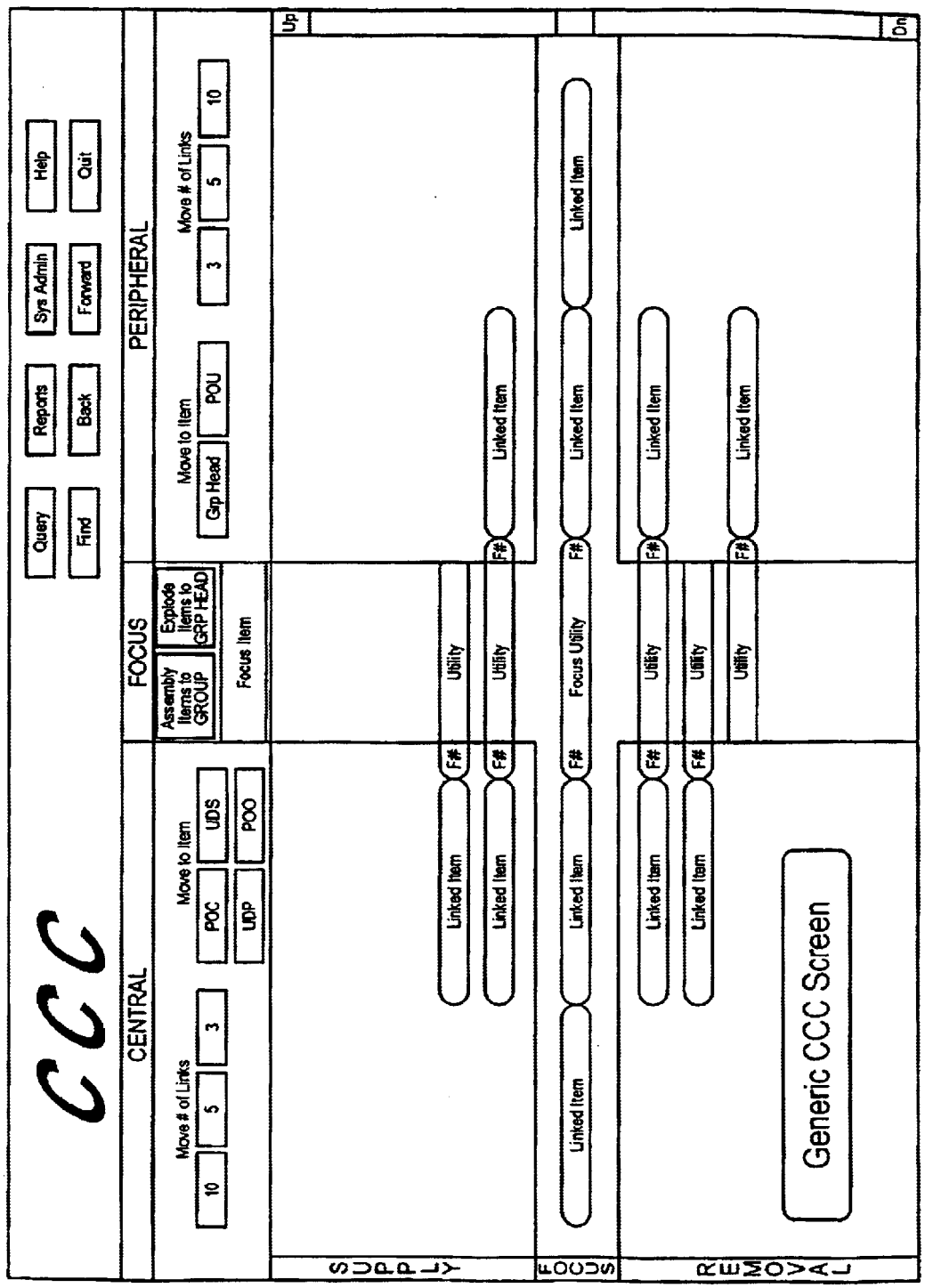
FIG. 30A through FIG. 30H (include all screen shots) shows a method of presenting on a computer screen the ordering scheme and the relationships between WFS integral parts.
Figure 30B:
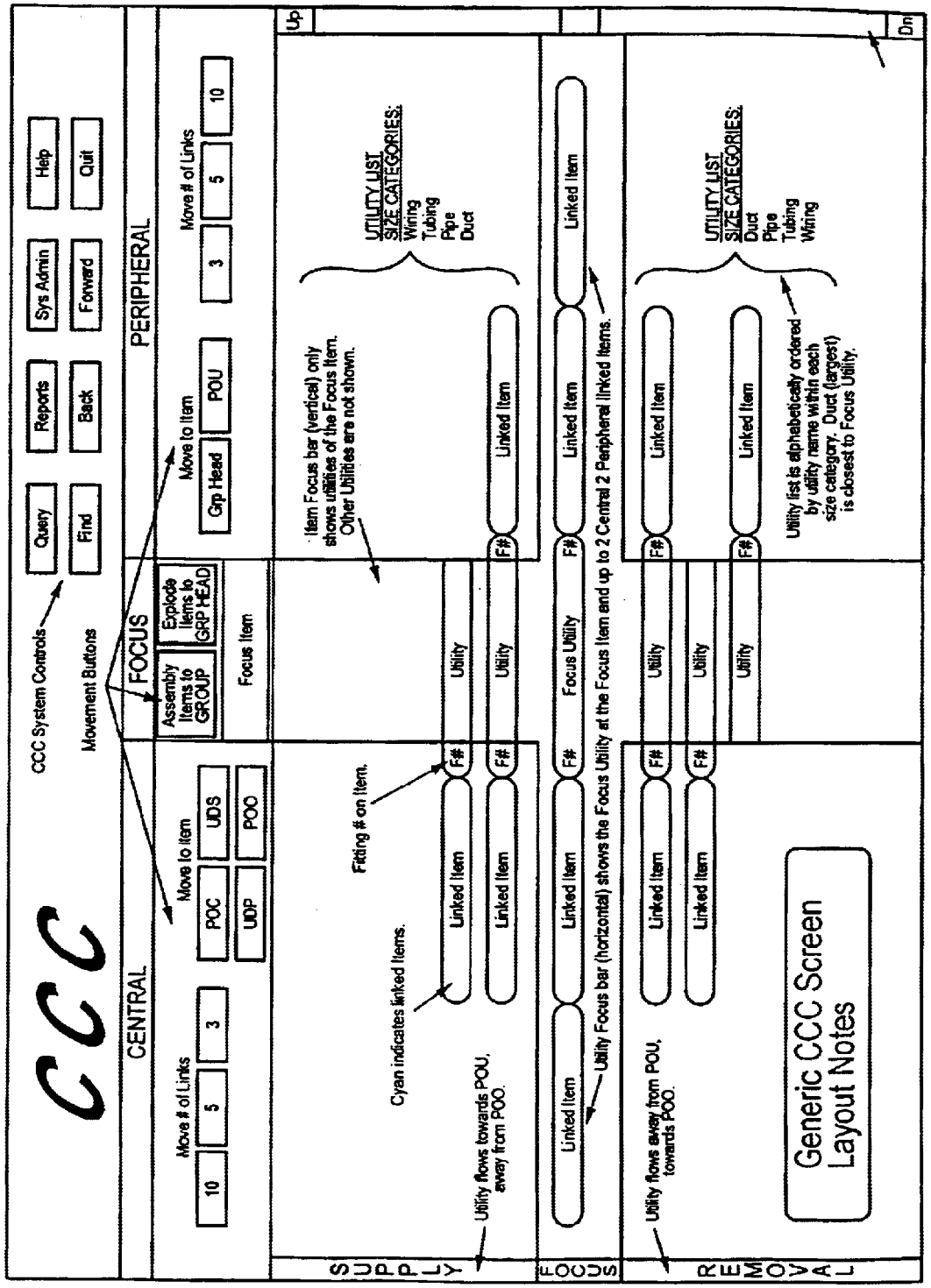
Figure 30C:
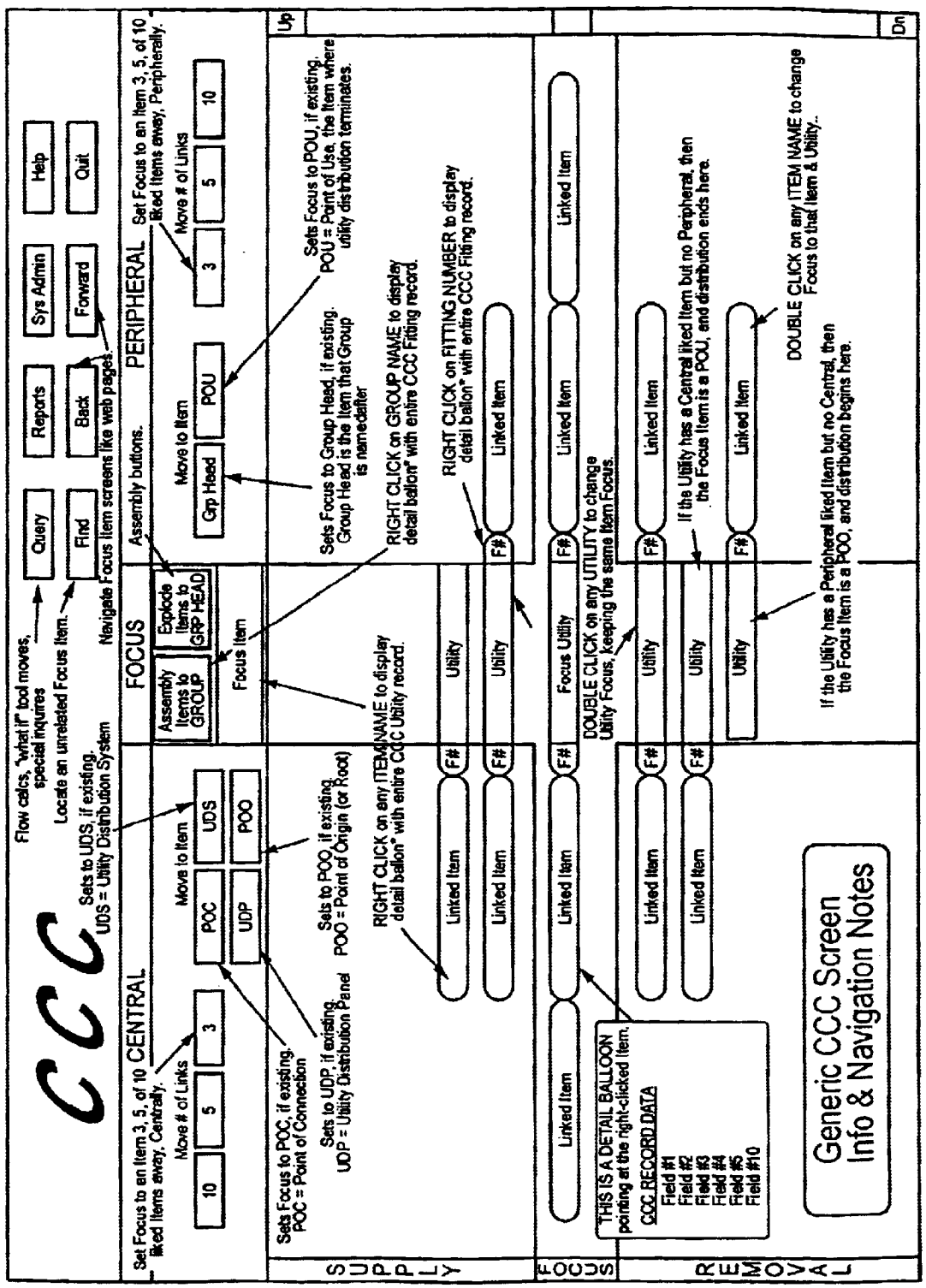
Figure 30D:
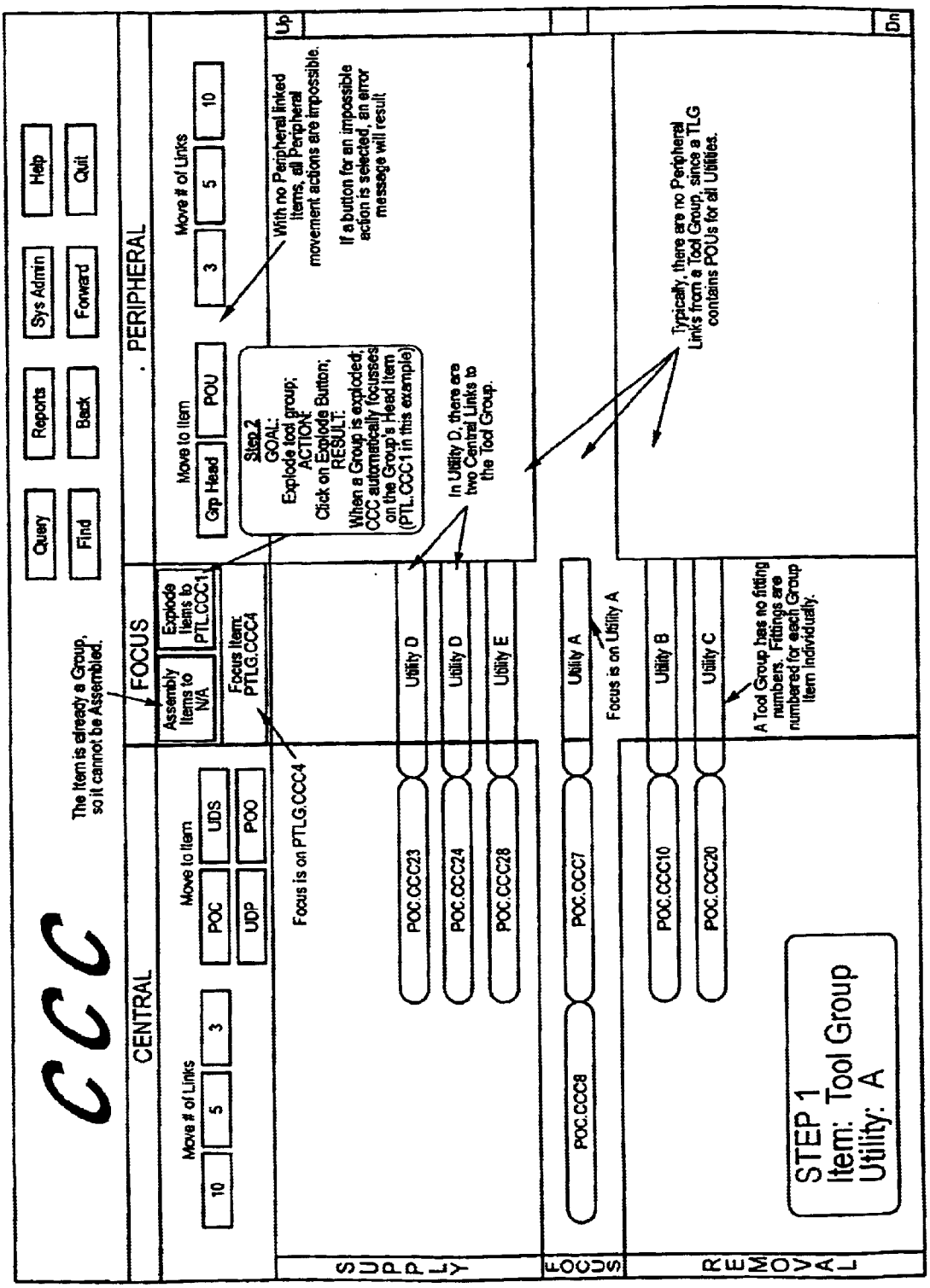
Figure 30E:
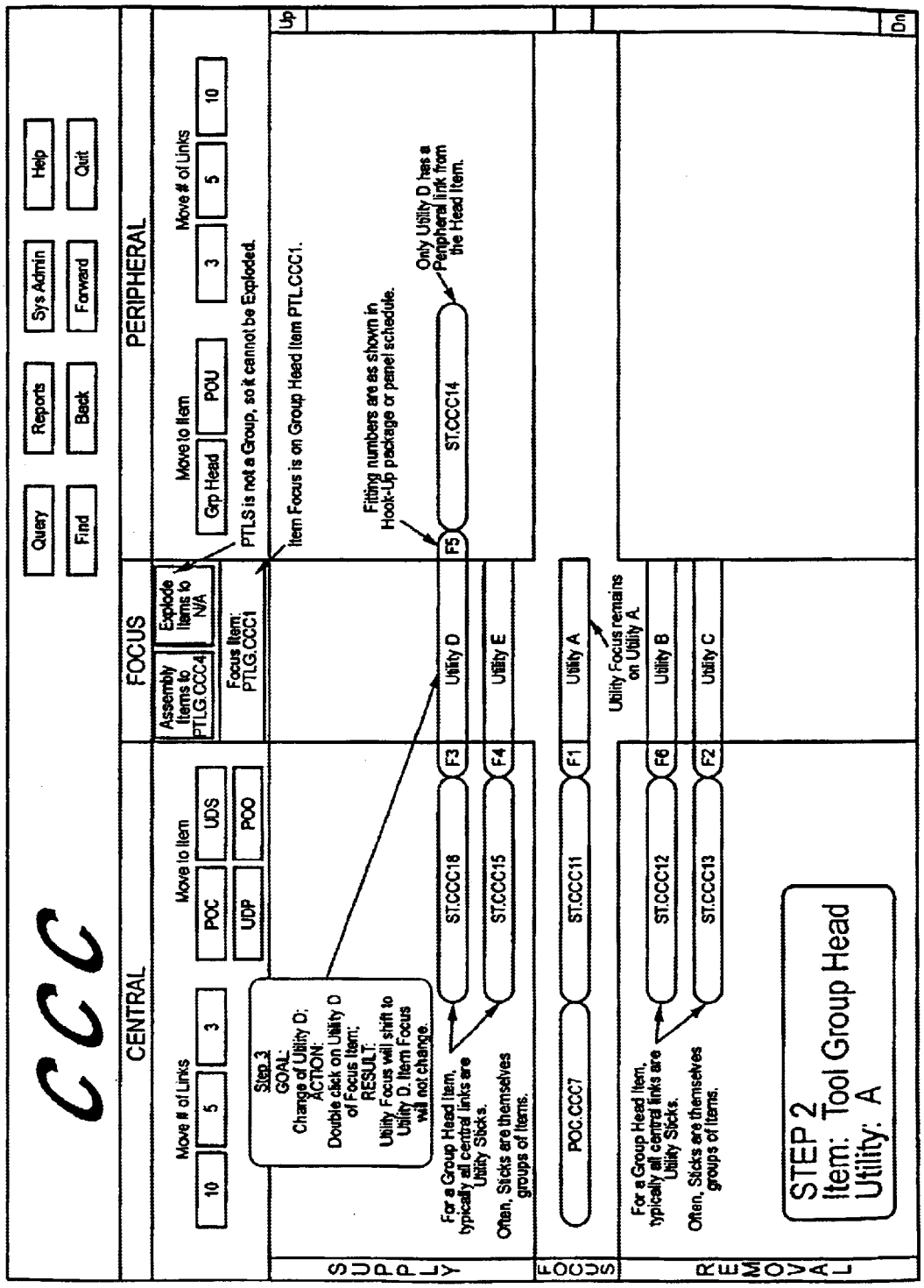
Figure 30F:
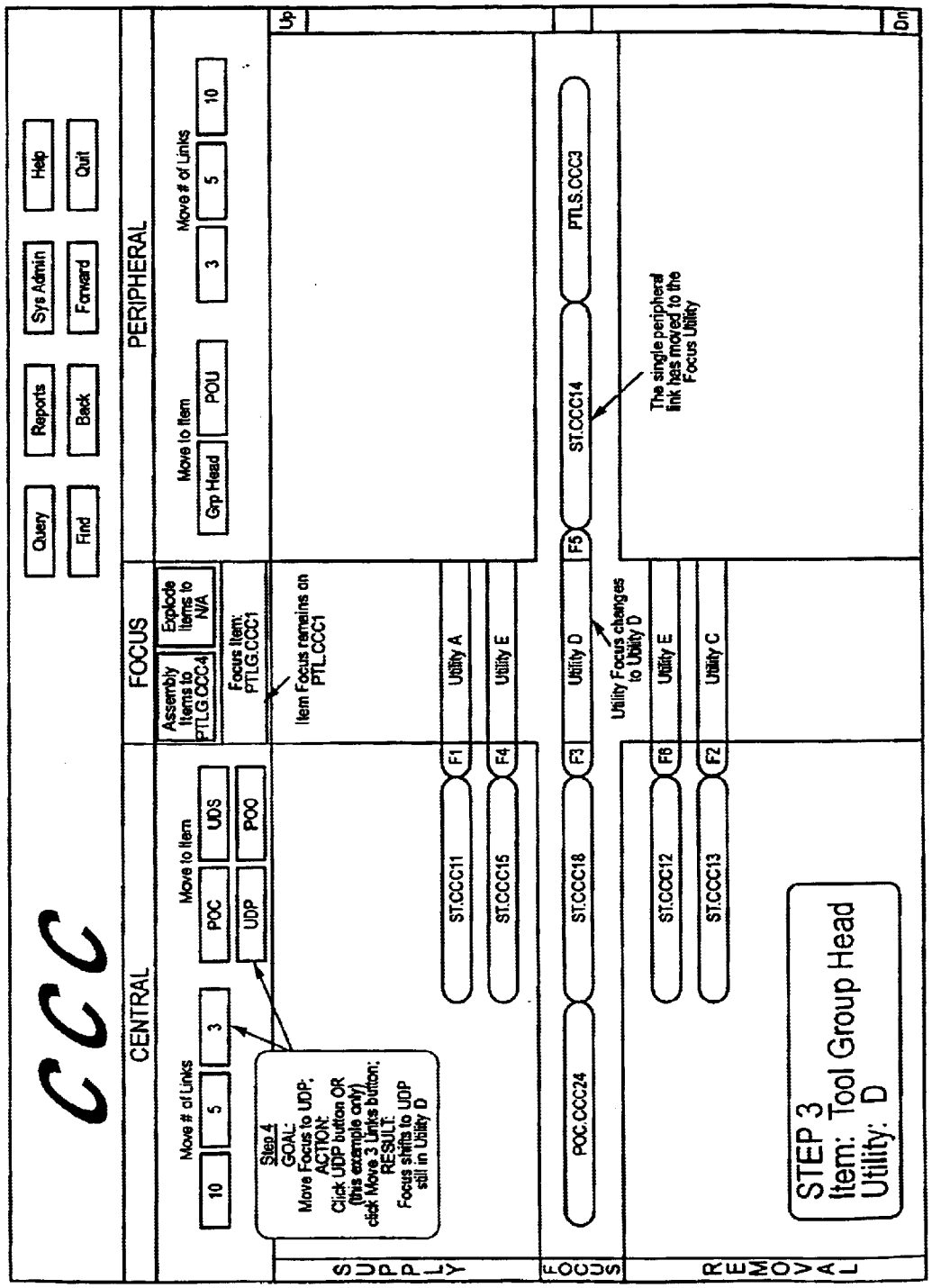
Figure 30G:
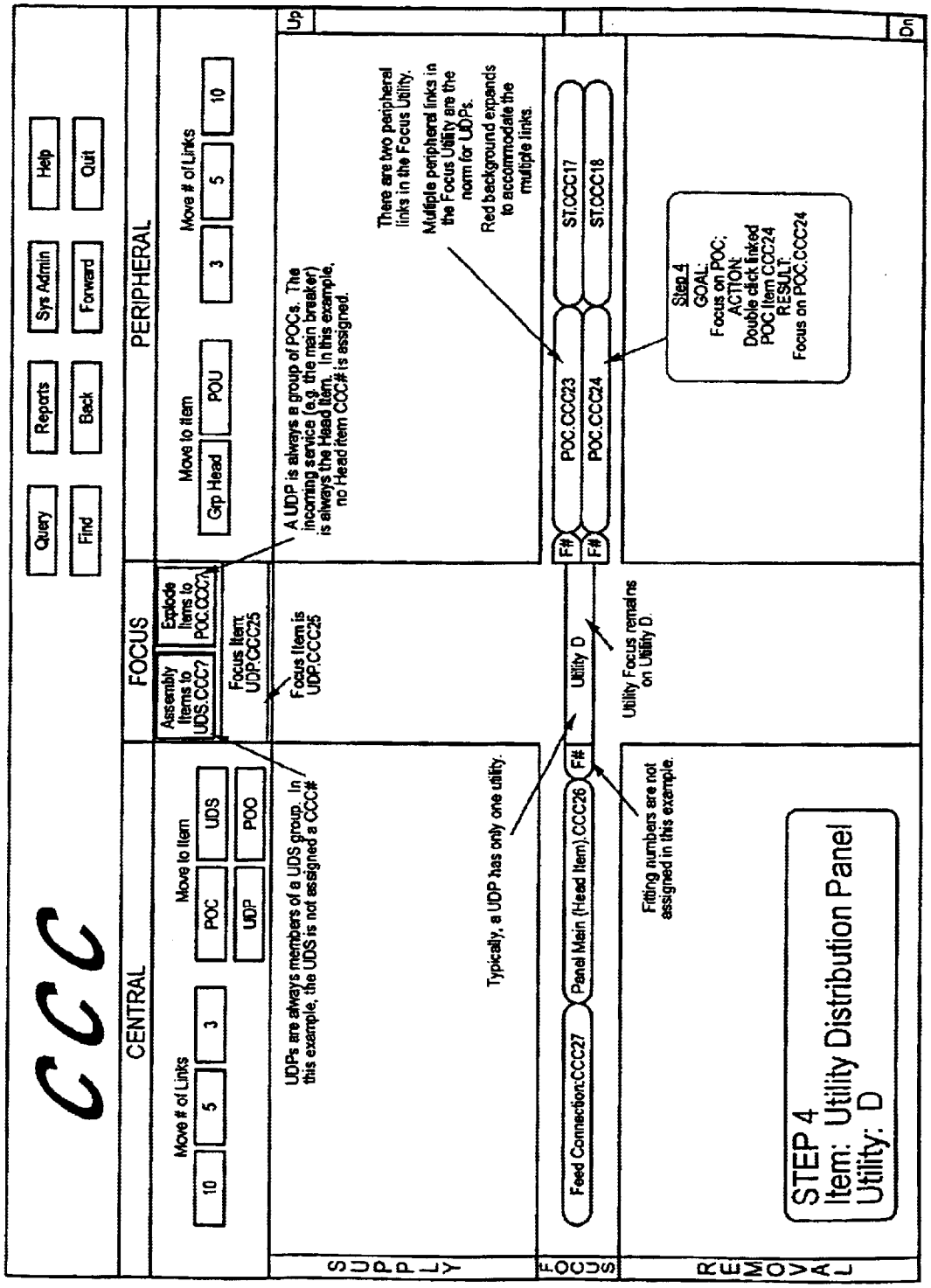
Figure 30H:
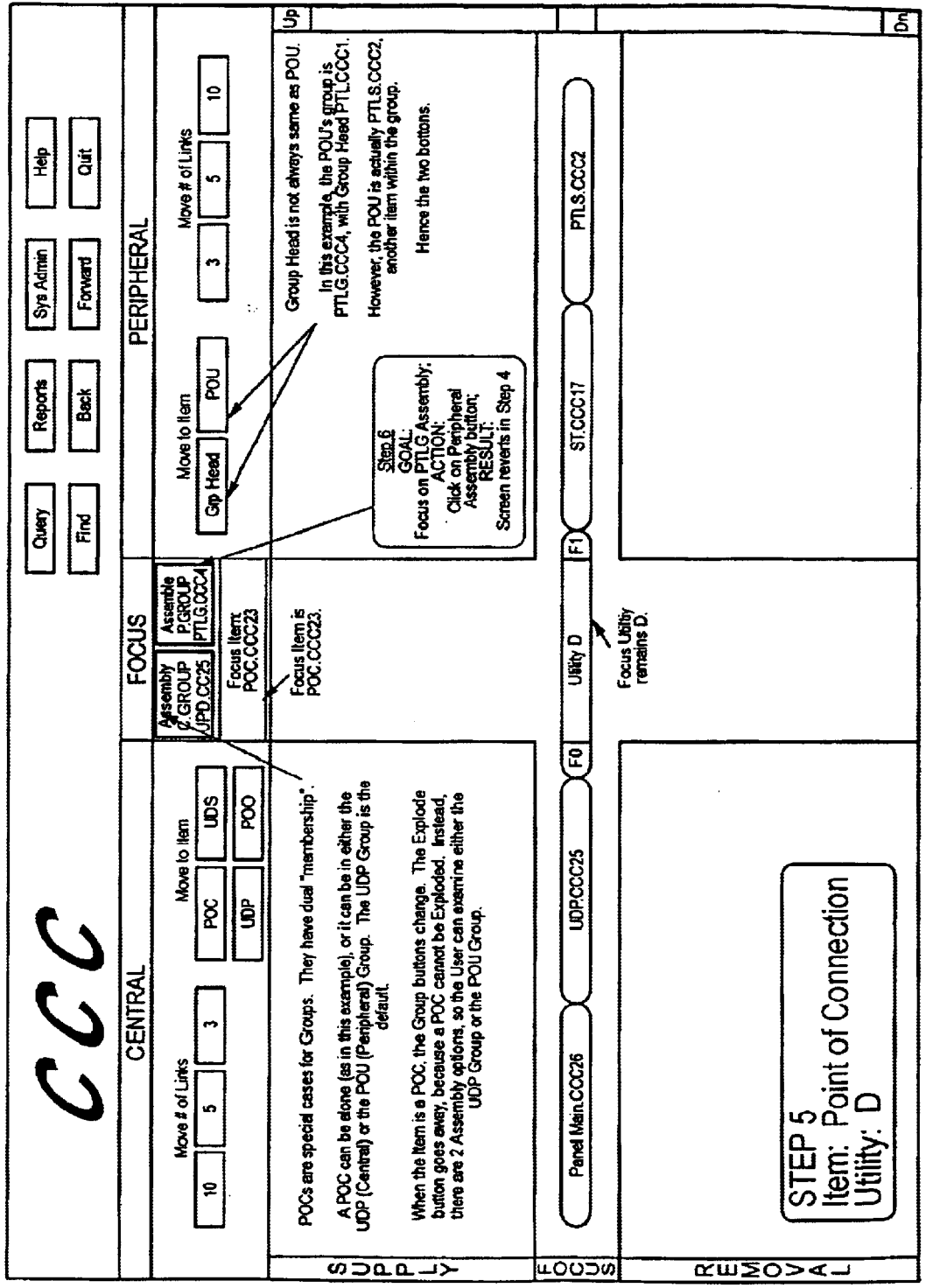

Those skilled in the art will recognize that the "granular" approach used herein will allow virtually any ordering scheme (such as the ordering schemes referenced in method steps 2700 and 2804) to be utilized to impose an order on a captured aspects of an evolving wafer fabrication system. Referring now to FIGS. 29A and 29B, shown is one ordering scheme which can be utilized to impose order on the captured aspects of an evolving system. As has been discussed above, processes and devices used herein deconstruct what was heretofore viewed as a number of interconnected systems into an amalgamation of granular units. One way in which this deconstructed information can be reconstructed, or ordered, is as shown in FIG. 29A. FIG. 29A shows grouping based on facilities engineering concepts. Shown in FIG. 29A is that an ordering scheme can be devised (e.g., one based on tool groups, such as the scheme illustrated in FIG. 29) to order the granular parts in a fashion desired. Shown in FIG. 29A is that each CCC (component, connection, or control), can be paired with an indicator of order. For example, PTL.CCCI is indicate of Production Tool Head, CCC Item 1, which defines the place of CCC Item 1 in the PTLG. Many more such exemplary orderings are also illustrated in FIG. 29A, which are substantially self-explanatory. In addition, Appendix A, which is hereby incorporated by reference in its entirety, gives more detail on the ordering scheme shown in FIG. 29A. Lastly, those skilled in the art will recognize that the ordering scheme shown is merely exemplary and that the "granular" nature of the captured evolving system will allow the imposition of virtually any order on the granular parts in accordance with the spirit of the foregoing example.

FIG. 29B shows pictographically some the aspects set forth in FIG. 29A. Shown in FIG. 29B is connection ordering example 2900 which has the ordering scheme of FIG. 29A. Depicted is that connection 2902 (shown as a pipe) has a central (toward a point of origin) coupling and a peripheral (toward a point of use) coupling. Depicted in control ordering example 2906 is that control 2908 (shown as a valve) has a central (toward a point of origin) coupling 2910 and a peripheral (toward from a point of use) coupling 2912. Illustrated in component ordering example 2914 is a way in which mechanical, electrical, chemical, and thermal relationships could be ordered and presented.

Those skilled in the art will recognize that the one or more presentation options referenced in method step 2800 will depend upon the type and amount of mapped information available for selected one or more parts. Additionally, those skilled in the art will appreciate that a variety of schemes can be utilized to achieve the acceptance of user input such as was referenced in method step 2804.

FIGS. 30A through 30H show example screen prints of various presentation options and user input schemes in the context of a graphical user interface. FIGS. 30 A, B, and C show a generic CCC screen layout and describe the information presented and the functions from which the user may select. FIGS. 30 D, E, F, G, and H show a presentation of the ordering scheme depicted FIG. 29A, using the screen format from FIGS. 30 A, B, and C. In the series, they simulate user mouse clicks choices with resultant screen changes and new information presented. Lastly, those skilled in the art will recognize that the input presentations schemes shown are merely exemplary and that the nature of the captured evolving system will allow the use of virtually any presentation and input scheme within the spirit of the foregoing example.

III. Determining Impacts of Action Involving the Evolving Wafer Fabrication System As was noted in the Description of the Related Art section, above, a significant problem that arises with respect to an evolving wafer fabrication system is that such a system's evolving nature makes it very difficult to predict with any accuracy the one or more impacts a certain action taken on, or with respect to, one or more particular integral parts of the wafer fabrication system may produce. The foregoing described various processes and devices whereby an evolving wafer fabrication system could be partially or wholly captured at virtually any point in its evolution and from virtually any point within the wafer fabrication system. Once the wafer fabrication system has been captured, in whole or in part, the capture data can be utilized to predict impacts within the wafer fabrication system with an accuracy heretofore unavailable via the use of processes and devices described below.

Figure 53A:
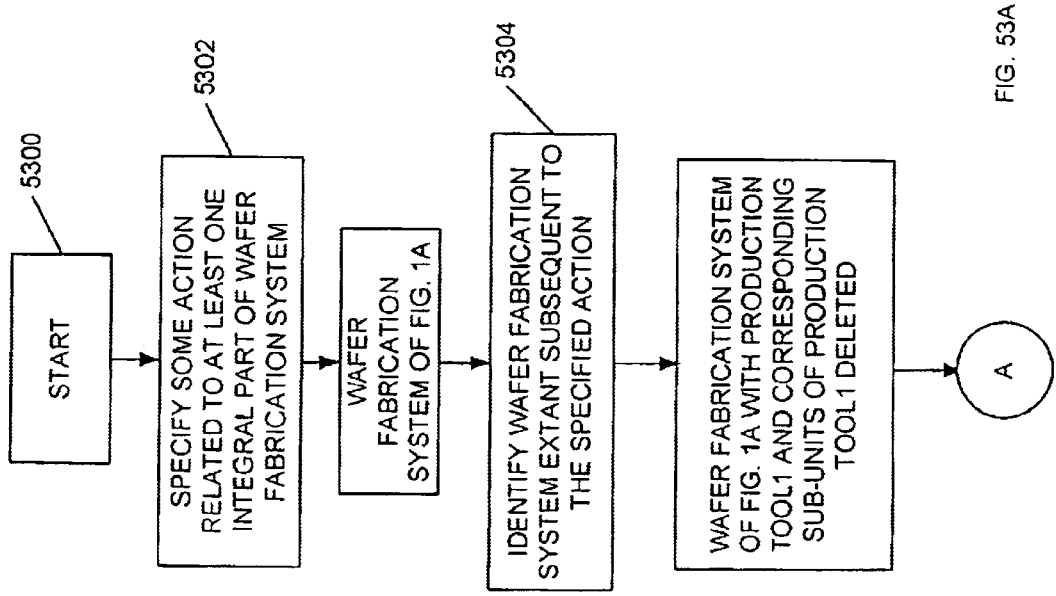
FIGS. 53A and 53B show a high-level partially schematic diagram depicting a process by which one or more impacts upon an evolving wafer fabrication system may be known.
Figure 53B:
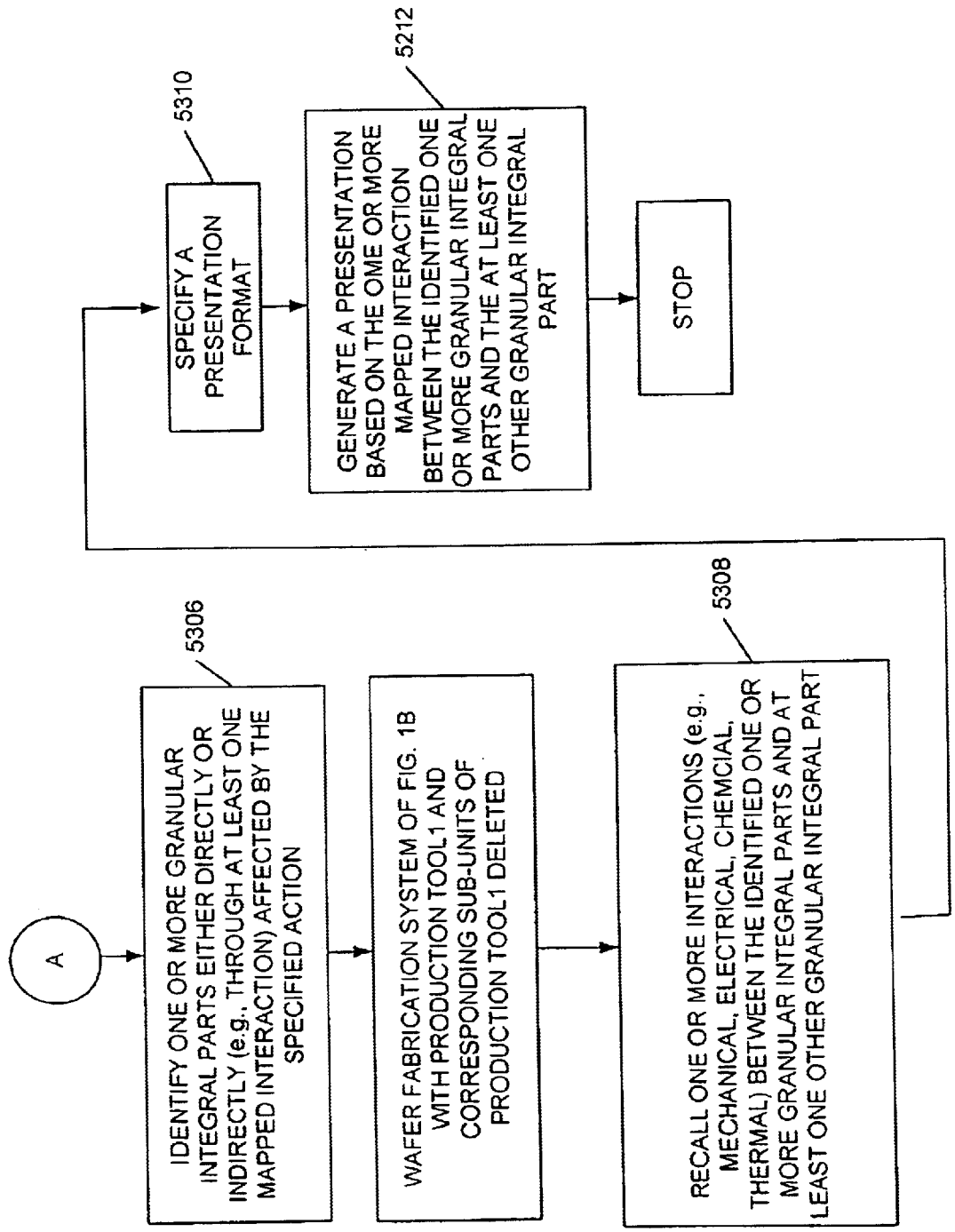

Referring now to FIGS. 53A and 53B, shown is a high-level partially schematic diagram depicting a process by which one or more impacts upon an evolving wafer fabrication system may be known. Method step 5300 depicts the start of the process. Method step 5302 illustrates the specification (typically done by a human user selecting between various presentation options by clicking a button on a graphical user interface) of some action (e.g., deleting production tool 102 is shown for sake of illustration, but those skilled in the art will recognize that the action could entail many other actions, such as shutting down a utility system, modifying a production tool, adding a production tool, etc.) related to wafer fabrication system 100. For sake of illustration, method step 5304 shows the identification of a wafer fabrication system that would be extant subsequent to the execution of the action specified, but it is to be understood that in one embodiment the specified change is translated directly to granular impact; shown for exemplary purposes, in the context of wafer fabrication system 100 that was depicted in FIG. 1A, is that the specified action results in the resultant wafer fabrication system 100 sans one or more of the integral parts associated with production tool 102. Method step 5306 shows the identification of one or more "granular" integral parts within a granular scheme, which for sake of illustration is shown as the "granular scheme" of FIG. 1B, directly or indirectly (e.g., through one or more mapped interactions and/or one or more other granular integral parts) affected by the specified action. Method step 5308 depicts the discernment, or recalling, of one or more mapped interactions (e.g., mechanical, electrical, chemical, and/or thermal couplings which were discussed above) between or involving the identified one or more granular integral parts directly or indirectly affected by the specified action related to wafer fabrication system 100. Method step 5310 illustrates the specification of a particular presentation format (typically accomplished via a human user selecting between various presentation options by clicking a button on a graphical user interface). Method step 5312 shows the generation of a presentation in a manner consistent with the selected presentation option and the identified one or more granular integral parts directly or indirectly affected by the specified action related to wafer fabrication system 100. As will be discussed below, the presentation can be in any format, and the fact that the presentation is generated using the granular format should not be taken to mean that the presentation must be in granular format. Rather, the granular format allows virtually infinite flexibility in presentation, as will become apparent below.

Figure 31:
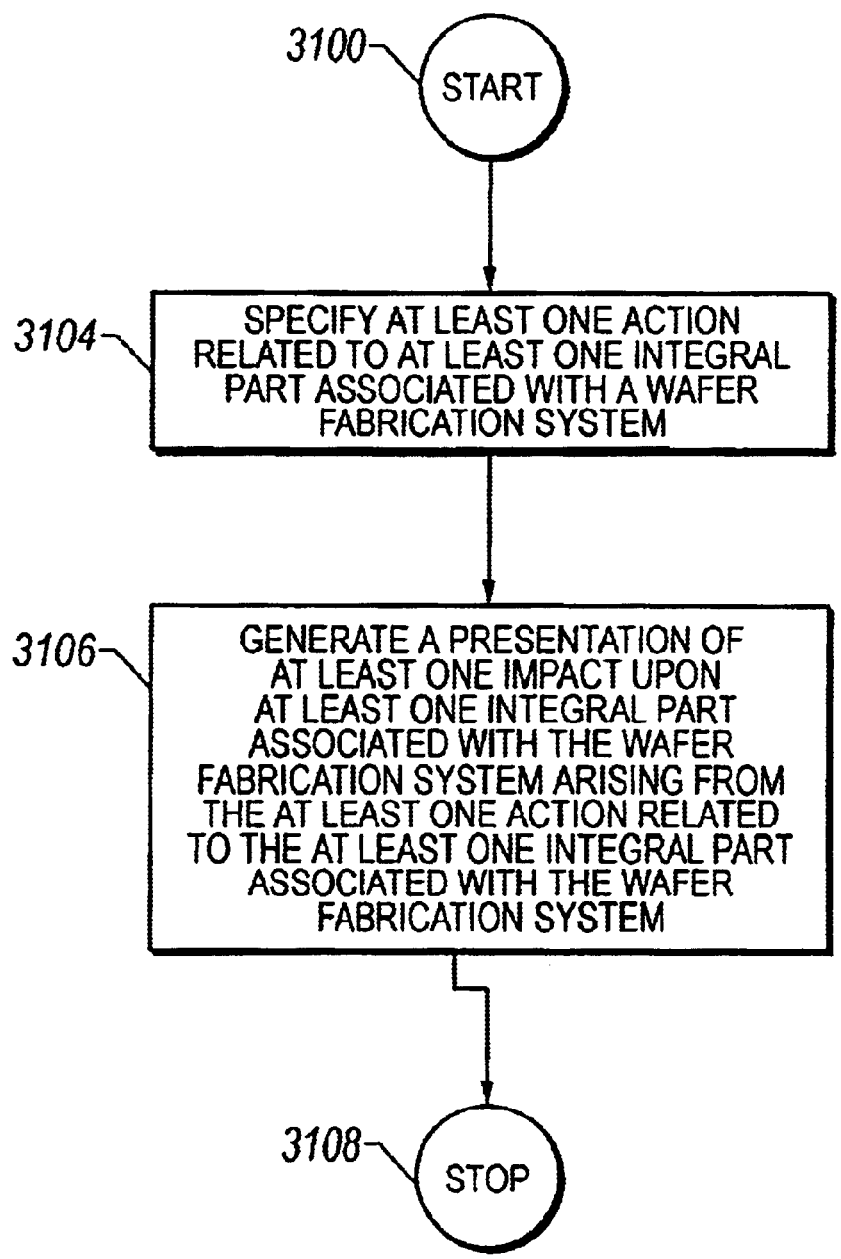
FIG. 31 depicts a high-level logic flowchart of a process by which one or more impacts upon an evolving wafer fabrication system may be known.

Referring now to FIG. 31, depicted is a high-level logic flowchart of a process by which one or more impacts upon an evolving wafer fabrication system may be known. Method step 3100 shows the start of the process. Method step 3104 shows the specification of at least one action related to an identified integral part associated with a wafer fabrication system. Method step 3106 illustrates the generation and presentation of at least one impact upon at least one integral part associated with the wafer fabrication system arising from the at least one action related to the at least one integral part associated with the wafer fabrication system. Method step 3107 shows the end of the process.

Figure 32:
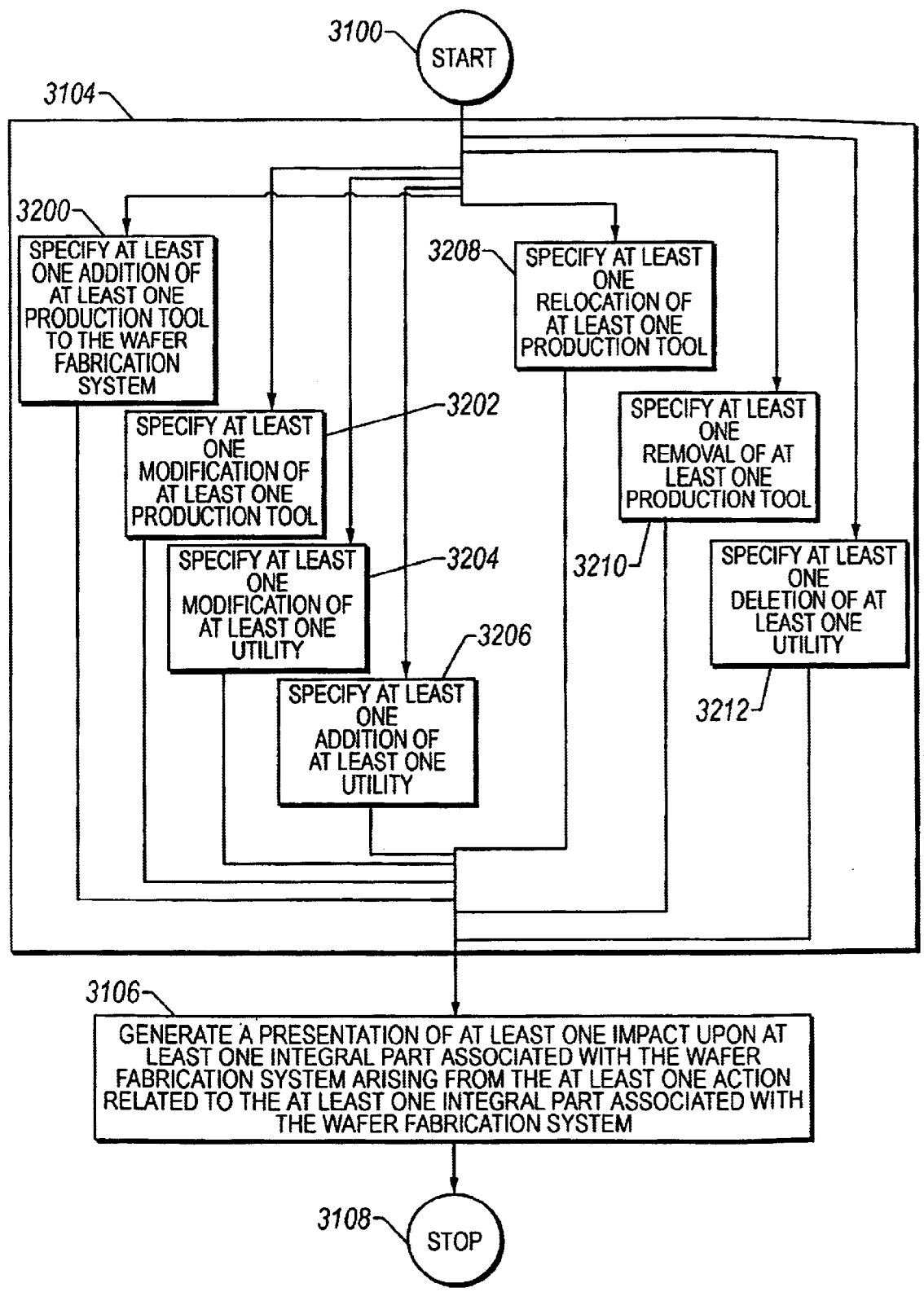
FIG. 32 shows a high-level logic flowchart showing several examples of the specification of at least one action related to the identified integral part associated with a wafer fabrication system.

Referring now to FIG. 32, shown is a high-level logic flowchart showing several examples of the specification of at least one action related to the identified integral part associated with a wafer fabrication system, referenced in method step 3104. Method step 3200 illustrates that in a first instance, the specification of at least one action related to an identified integral part associated with a wafer fabrication system, referenced in method step 3104, can involve specifying at least one addition of at least one production tool to the wafer fabrication system. Method step 3202 illustrates that in a second instance, the specification of at least one action related to the identified integral part associated with a wafer fabrication system, referenced in method step 3104, can involve specifying at least one modification of at least one production tool within the wafer fabrication system. Method step 3204 illustrates that in a third instance, the specification of at least one action related to the identified integral part associated with a wafer fabrication system, referenced in method step 3104, can involve specifying at least one modification of at least one utility within the wafer fabrication system. Method step 3206 illustrates that in a fourth instance, the specification of at least one action related to the identified integral part associated with a wafer fabrication system, referenced in method step 3104, can involve specifying at least one addition of at least one utility within the wafer fabrication system. Method step 3208 illustrates that in a fifth instance, the specification of at least one action related to the identified integral part associated with a wafer fabrication system, referenced in method step 3104, can involve specifying at least one relocation of at least one production tool within the wafer fabrication system. Method step 3210 illustrates that in a sixth instance, the specification of at least one action related to the identified integral part associated with a wafer fabrication system, referenced in method step 3104, can involve specifying at least one removal of at least one production tool from the wafer fabrication system. Method step 3212 illustrates that in a seventh instance, the specification of at least one action related to the identified integral part associated with a wafer fabrication system, referenced in method step 3104, can involve specifying at least one deletion of at least one utility from the wafer fabrication system. The remaining shown steps function substantially as like-numbered steps described previously.

Figure 33:
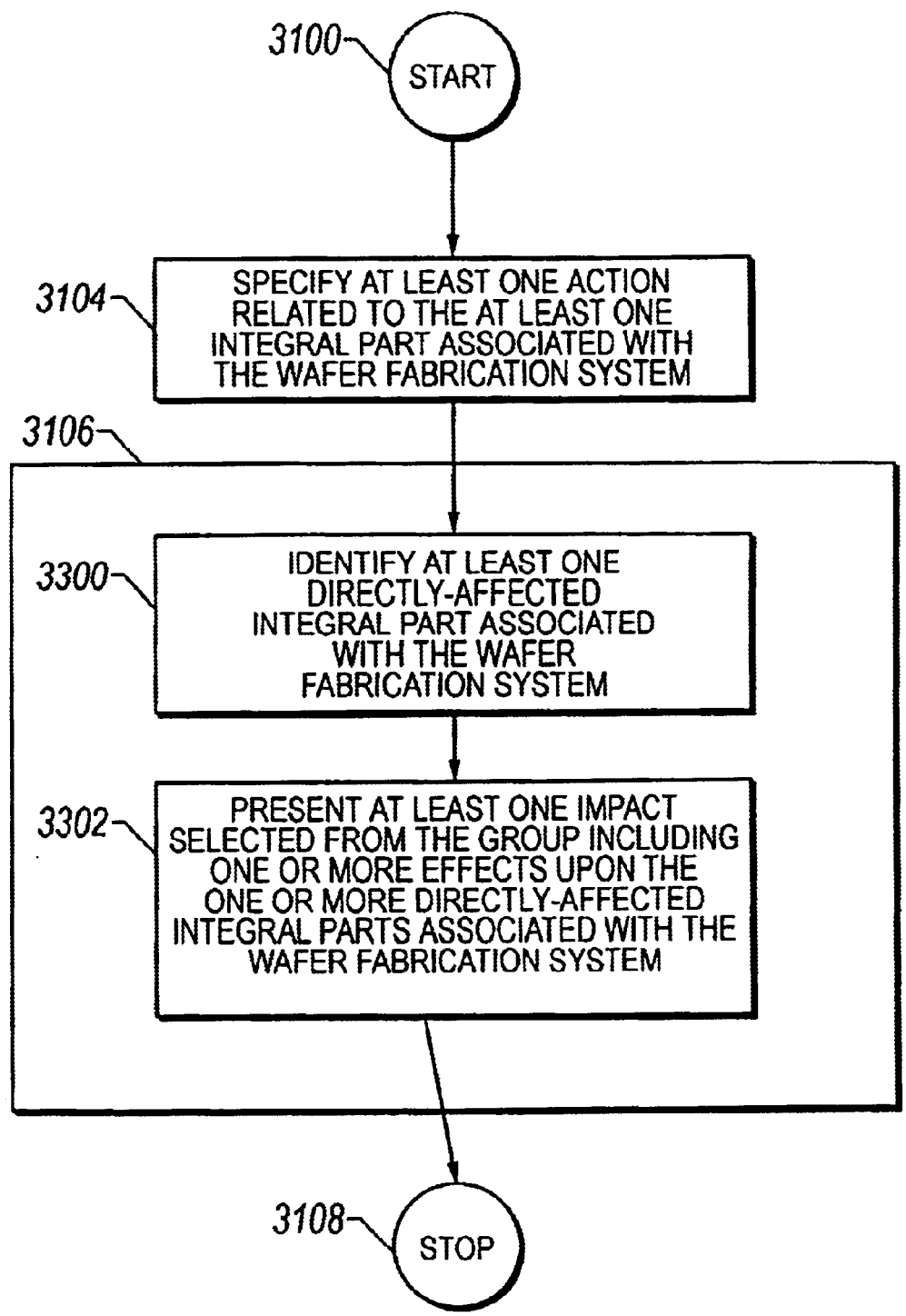
FIG. 33 shows a high-level logic flow chart showing an example of the generation and presentation of at least one impact upon at least one integral part associated with the wafer fabrication system arising from the at least one action related to the at least one integral part associated with the wafer fabrication system.

Referring now to FIG. 33, shown is a high-level logic flow chart showing an example of the generation and presentation of at least one impact upon at least one integral part associated with the wafer fabrication system arising from the at least one action related to the at least one integral part associated with the wafer fabrication system referenced in method step 3106. Method step 3300 illustrates that in one instance, the generation and presentation of at least one impact upon at least one integral part associated with the wafer fabrication system arising from the at least one action related to the at least one integral part associated with the wafer fabrication system, referenced in method step 3106, can include identifying at least one directly-affected integral part of the wafer fabrication system, with the directly-affected integral part being directly-affected by the action related to the at least one integral part associated with the wafer fabrication system. Method step 3302 shows that in one instance, the generation and presentation of at least one impact upon at least one integral part associated with the wafer fabrication system arising from the at least one action related to the at least one integral part associated with the wafer fabrication system 3106, can include presenting at least one impact selected from the group including but not limited to one or more effects upon the one or more directly-affected integral parts of the wafer fabrication system. The remaining shown steps function substantially as like-numbered steps described previously.

Figure 34:
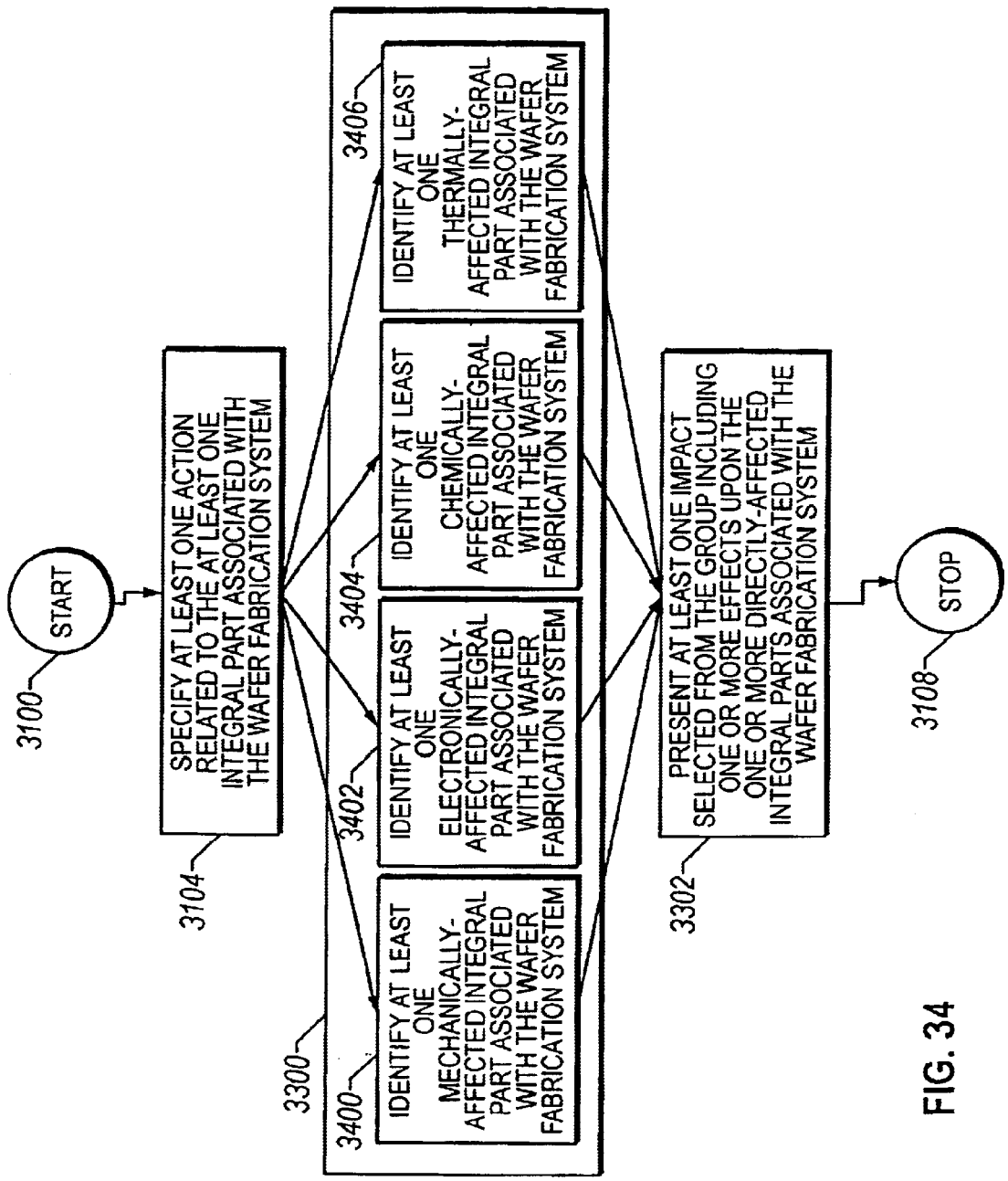
FIG. 34 shows a high-level logic flowchart showing an example of identifying at least one directly-affected integral part of the wafer fabrication system.

Referring now to FIG. 34, shown is a high-level logic flowchart showing an example of identifying at least one directly-affected integral part of the wafer fabrication system, with the directly-affected integral part being directly affected by the action related to the at least one integral part associated with the wafer fabrication system, referenced in method step 3300. Method step 3400 illustrates that in a first instance, the identifying at least one directly-affected[6] integral part of the wafer fabrication system, with the directly-affected integral part being directly affected by the action related to the at least one integral part associated with the wafer fabrication system, referenced in method step 3300, can include identifying at least one mechanically-affected integral part of the wafer fabrication system. Method step 3402 illustrates that in a second instance, the identifying at least one directly-affected integral part of the wafer fabrication system, with the directly-affected integral part being directly affected by the action related to the at least one integral part associated with the wafer fabrication system, referenced in method step 3300, can include identifying at least one electrically-affected integral part of the wafer fabrication system. Method step 3404 illustrates that in a third instance, the identifying at least one directly-affected integral part of the wafer fabrication system, with the directly-affected integral part being directly affected by the action related to the at least one integral part associated with the wafer fabrication system, referenced in method step 3300, can include identifying at least one chemically-affected integral part of the wafer fabrication system. Method step 3406 illustrates that in a fourth instance, the identifying at least one directly-affected integral part of the wafer fabrication system, with the directly-affected integral part being directly affected by the action related to the at least one integral part associated with the wafer fabrication system, referenced in method step 3300, can include identifying at least one thermally-affected integral part of the wafer fabrication system. The remaining shown steps function substantially as like-numbered steps described previously.

[6]As used herein, "directly-affected" can mean affected through direct action (e.g., mechanical, electrical, chemical, or thermal) upon a first integral part, and can also mean that the affecting is through a coupling (e.g., mechanical, electrical, chemical, or thermal) between the first integral part and a second integral part. Indirectly-affected can mean that at least a third intermediary integral part and its attendant couplings reside between a first and a second integral part, indirectly-coupled.

Figure 35:
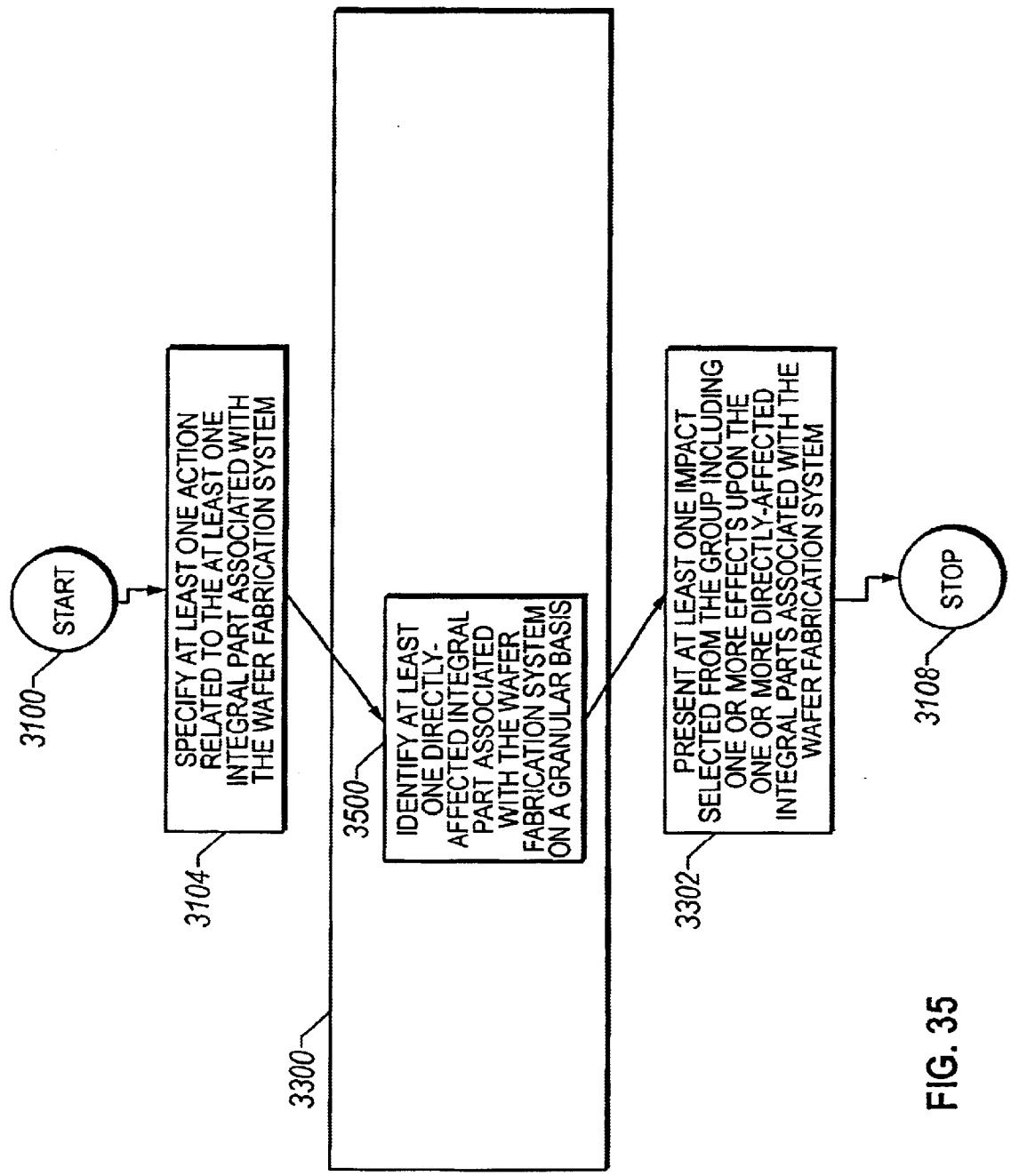
FIG. 35 shows a high-level logic flowchart showing an example of identifying at least one directly-affected integral part of the wafer fabrication system.

Referring now to FIG. 35, shown is a high-level logic flowchart showing an example of how identifying at least one directly-affected integral part of the wafer fabrication system, with the directly-affected integral part being directly affected by
the action related to the at least one integral part associated with the wafer fabrication system, referenced in method step 3300. Method step 3500 illustrates that in a first instance, the identifying at least one directly-affected integral part of the wafer fabrication system, with the directly-affected integral part being directly affected by the action related to the at least one integral part associated with the wafer fabrication system, referenced in method step 3300, can include identifying at least one directly-affected production tool of the wafer fabrication system on a granular basis. The remaining shown steps function substantially as like-numbered steps described previously.

Figure 40:
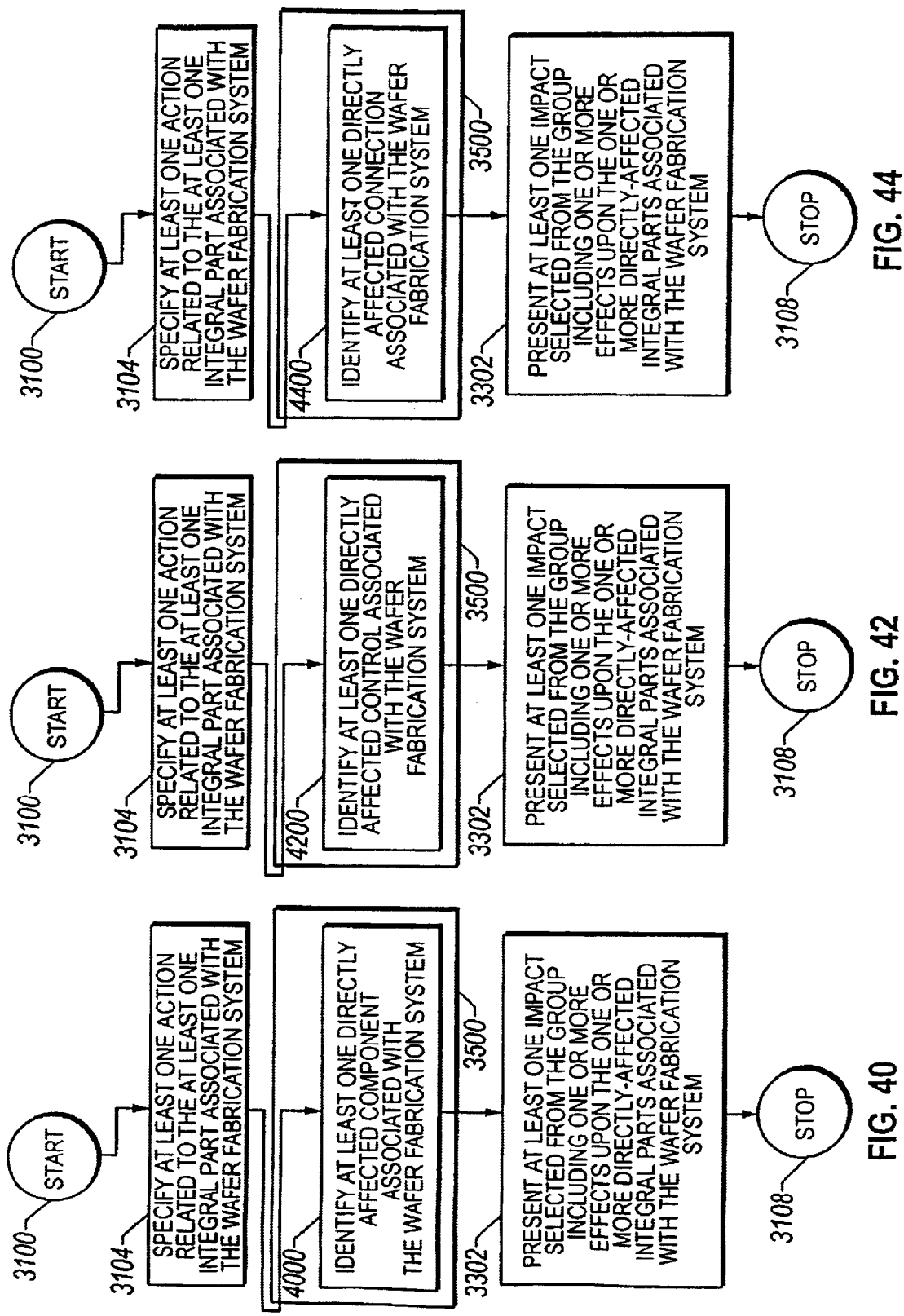
FIG. 40 shows a high-level logic flowchart showing an example of identification of the at least one directly affected integral part on a granular basis.

Referring now to FIG. 40, shown is a high-level logic flowchart showing an example of identification of the at least one directly affected integral part on a granular basis as is referenced in method step 3500. Method step 4000 illustrates that in one instance, the identification of at least one directly affected integral part on a granular basis, referenced in method step 3500, can involve identifying at least one directly affected component (as the term component is defined and used herein) associated with the wafer fabrication system. The remaining shown steps function substantially as like-numbered steps described previously.

Figure 41:
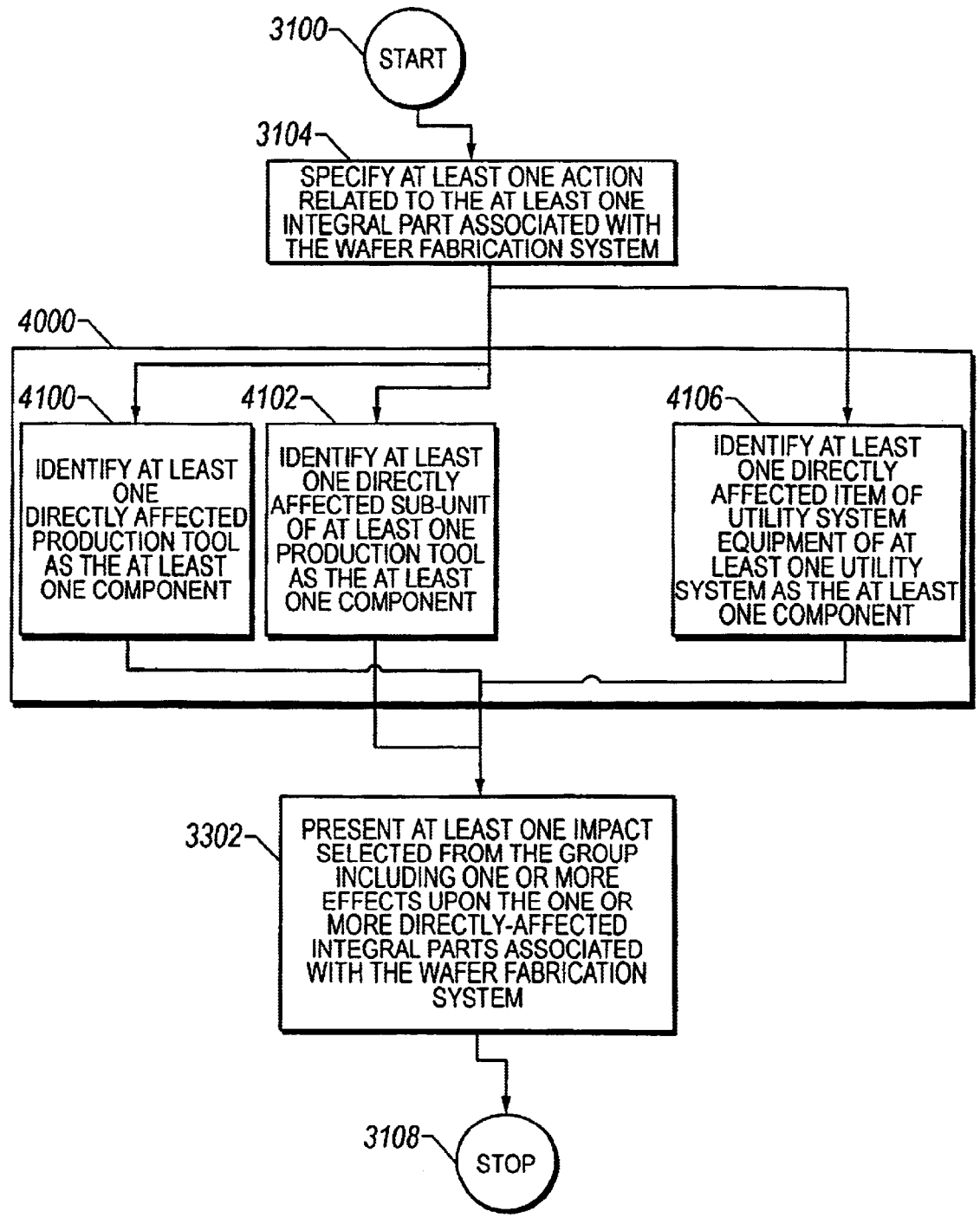
FIG. 41 shows a high-level logic flowchart showing several examples of identification of at least one directly affected component (as the term component is defined and used herein) associated with the wafer fabrication system.

Referring now to FIG. 41, shown is a high-level logic flowchart showing several examples of identification of at least one directly affected component (as the term component is defined and used herein) associated with the wafer fabrication system referenced in method step 4000. Method step 4100 illustrates that in a first instance, the identification of the at least one directly affected component (as the term component is defined and used herein) associated with the wafer fabrication system, referenced in method step 4000, can involve identifying at least one production tool. Method step 4102 illustrates that in a second instance, the identification of the at least one directly affected component (as the term component is defined and used herein) associated with the wafer fabrication system, referenced in method step 4000, can involve identifying at least one directly affected sub-unit of at least one production tool. Method step 4106 illustrates that in a third instance, the identification of the at least one directly affected component (as the term component is defined and used herein) associated with the wafer fabrication system, referenced in method step 4000, can involve identifying at least one directly affected item of utility system equipment. The remaining shown steps function substantially as like-numbered steps described previously.

Referring now to FIG. 42, shown is a high-level logic flowchart showing an example of identification of at least one directly affected integral part on a granular basis as is referenced in method stop 3500. Method step 4200 illustrates that in one instance, the identification of at least one directly affected integral part on a granular basis, referenced in method step 3500, can involve identifying at least directly affected one control (as the term control is defined and used herein) associated with the wafer fabrication system. The remaining shown steps function substantially as like-numbered steps described previously.

Figure 43:
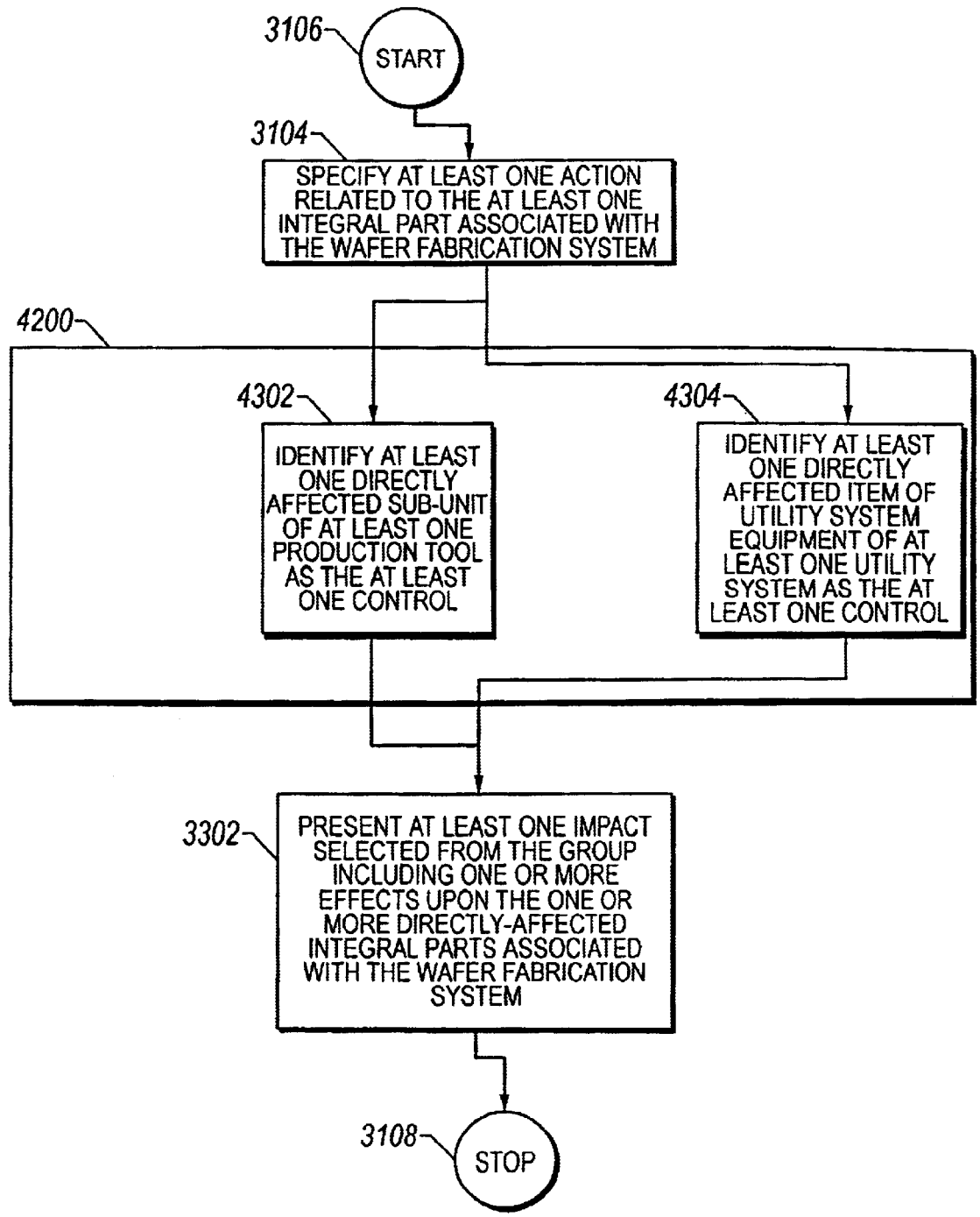
FIG. 43 shows a high-level logic flowchart showing several examples of the identification of the at least one directly affected control (as the term control is defined and used herein) associated with the wafer fabrication system.

Referring now to FIG. 43, shown is a high-level logic flowchart showing several examples of the identification of the at least one directly affected control (as the term control is defined and used herein) associated with the wafer fabrication system referenced in method step 4200. Method step 4302 illustrates that in a first instance, the identification of the at least one directly affected control (as the term control is defined and used herein) associated with the wafer fabrication system, referenced in method step 4200, can involve identifying at least one directly affected sub-unit of at least one production tool. Method step 4304 illustrates that in a second instance, the identification of the at least one directly affected control (as the term control is defined and used herein) associated with the wafer fabrication system, referenced in method step 4200, can involve identifying at least one directly affected item of utility system equipment. The remaining shown steps function substantially as like-numbered steps described previously.

Referring now to FIG. 44, shown is a high-level logic flowchart showing an example of the identification of at least one directly affected integral part on a granular basis as is referenced in method stop 3500. Method step 4500 illustrates that in one instance, the identification of at least one directly affected integral part on a granular basis, referenced in method step 3500, involves identifying at least one directly affected connection (as the term connection is defined and used herein) associated with the wafer fabrication system. The remaining shown steps function substantially as like-numbered steps described previously.

Figure 45:
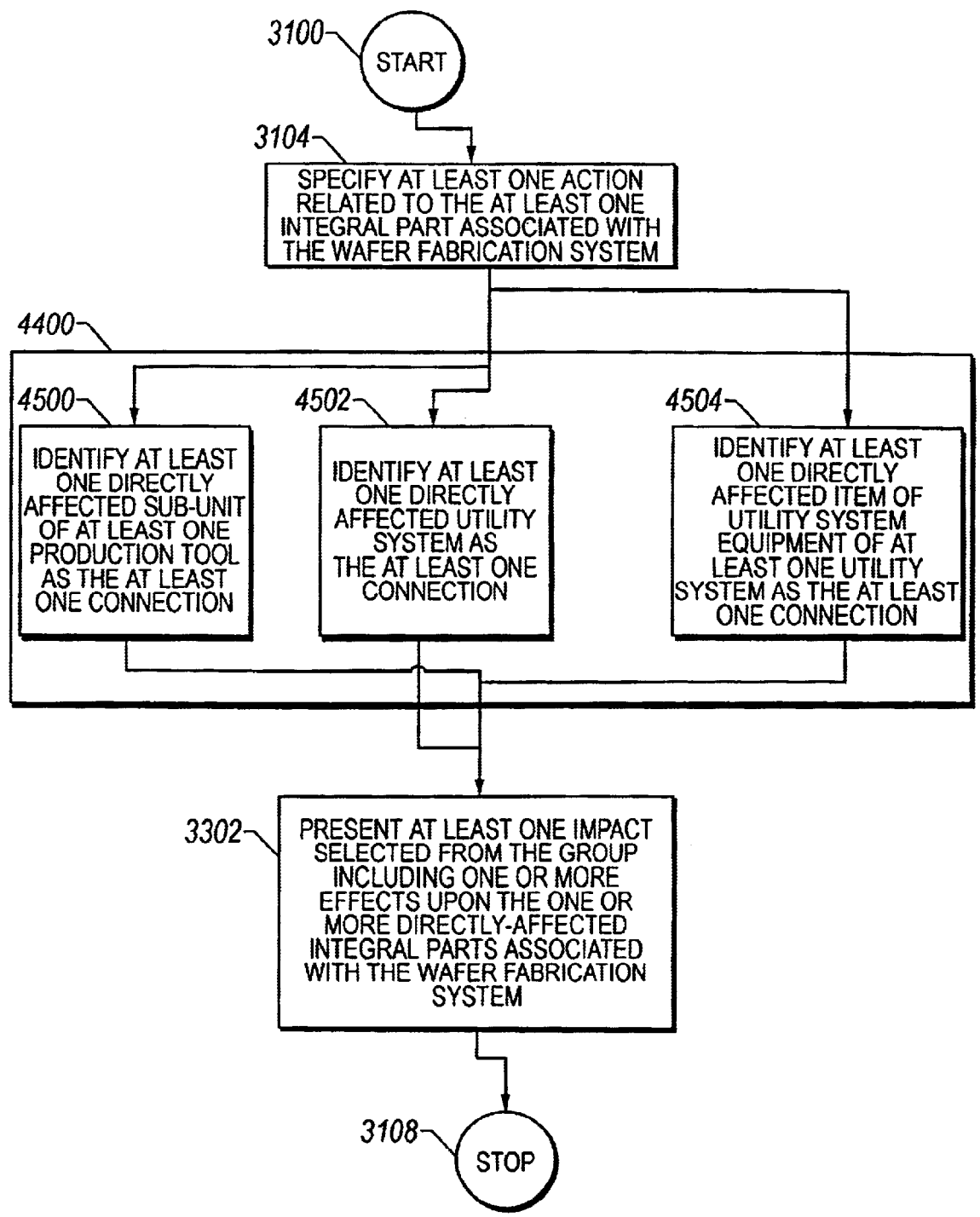
FIG. 45 shows a high-level logic flowchart showing several examples of the identification of at least one directly affected connection (as the term connection is defined and used herein) associated with the wafer fabrication system.

Referring now to FIG. 45, shown is a high-level logic flowchart showing several examples of the identification of at least one directly affected connection (as the term connection is defined and used herein) associated with the wafer fabrication system, referenced in method step 4400. Method step 4500 illustrates that in a first instance, the identification of the at least one directly affected connection (as the term connection is defined and used herein) associated with the wafer fabrication system, referenced in method step 4400, can involve identifying at least one directly affected production tool. Method step 4502 illustrates that in a second instance, the identification of the at least one directly affected connection (as the term connection is defined and used herein) associated with the wafer fabrication system, referenced in method step 4400, can involve identifying at least one directly affected utility system. Method step 4504 illustrates that in one instance, the identification of the at least one directly affected connection (as the term connection is defined and used herein) associated with the wafer fabrication system, referenced in method step 4400, can involve identifying at least one directly affected item of utility system equipment. The remaining shown steps function substantially as like-numbered steps described previously.

Figure 36:
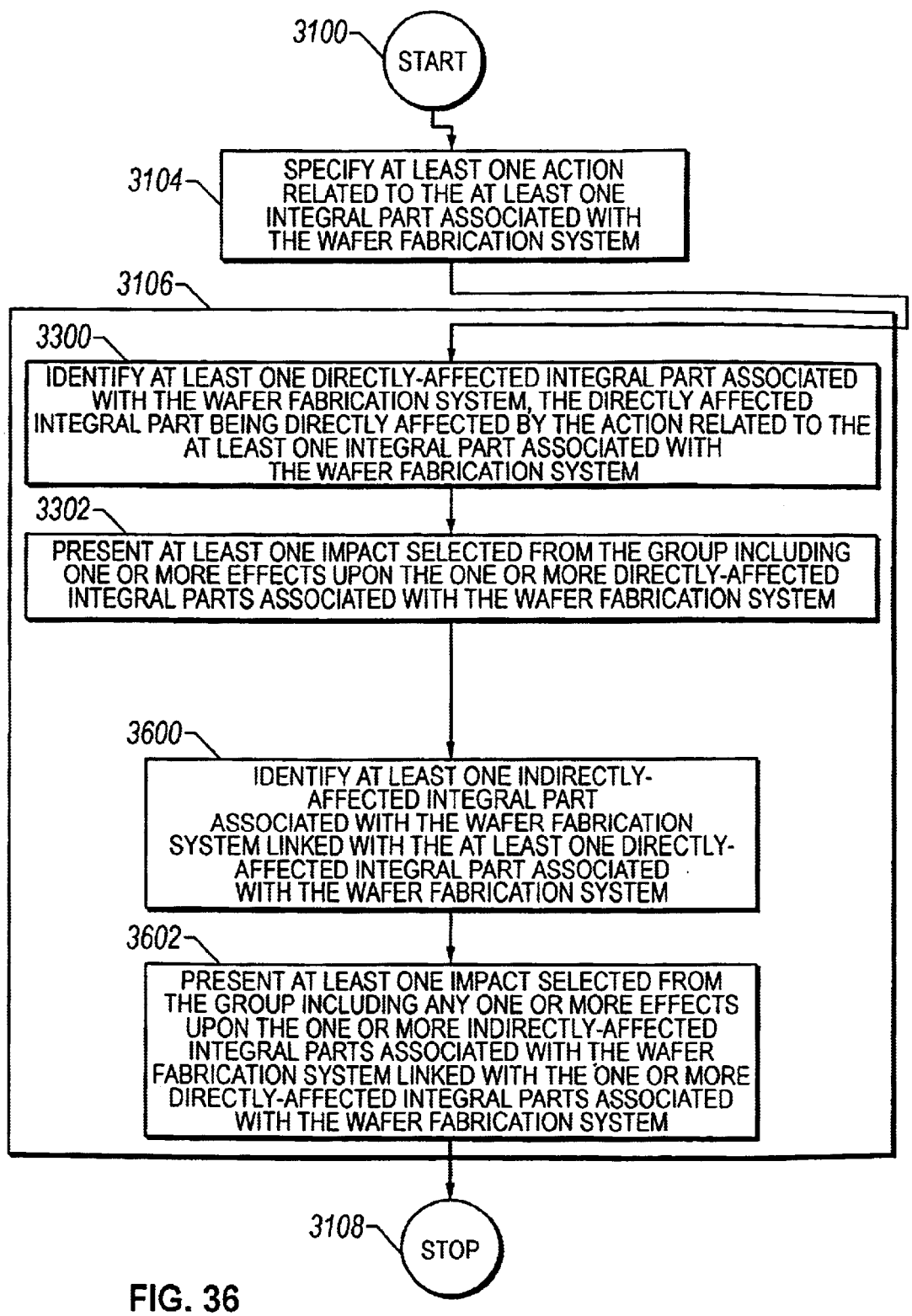
FIG. 36 shows a high-level logic flowchart showing a process wherein indirectly-affected integral parts of a wafer fabrication system are taken into account.

Referring now to FIG. 36, shown is a high-level logic flowchart showing a process wherein indirectly-affected integral parts of a wafer fabrication system are taken into account. Method step 3600 illustrates that subsequent to method step 3302, identification is made of at least one indirectly-affected integral part of the wafer fabrication system linked with the at least one directly-affected integral part of the wafer fabrication system. Thereafter, method step 3602 illustrates that presentation is made of at least one impact selected from the group including and one or more effects upon the one or more indirectly-affected integral parts of the wafer fabrication system linked with the one or more directly-affected integral parts of the wafer fabrication system. The remaining shown steps function substantially as like-numbered steps described previously.

Figure 37:
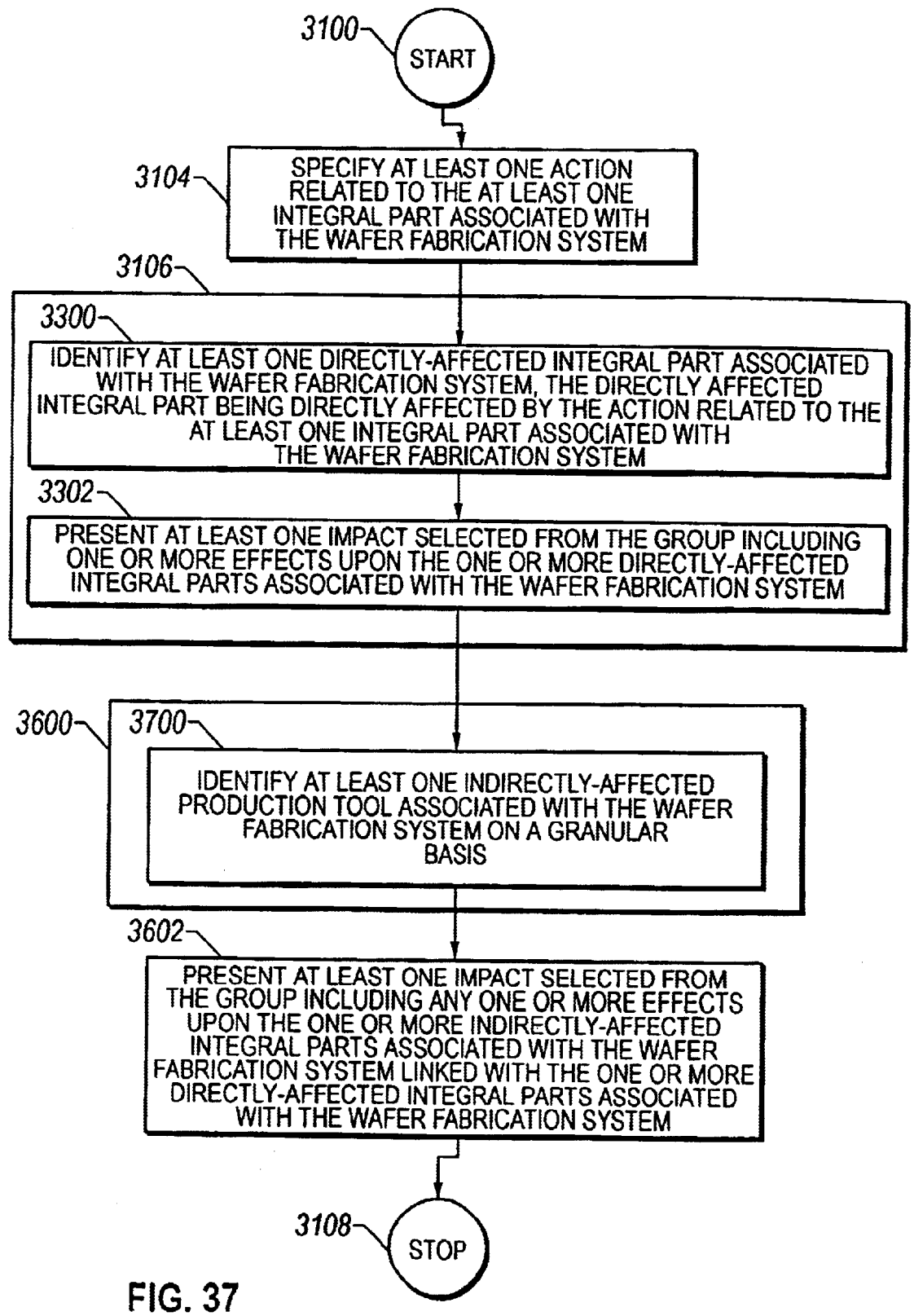
FIG. 37 shows a high-level logic flowchart showing examples of the identification of at least one indirectly-affected integral part of the wafer fabrication system linked with the at least one directly-affected integral part of the wafer fabrication system.

Referring now to FIG. 37, shown is a high-level logic flowchart showing examples of the identification of at least one indirectly-affected integral part of the wafer fabrication system linked with the at least one directly-affected integral part of the wafer fabrication system referenced in 3602. Method step 3700 illustrates that in a first instance, the identification of at least one indirectly-affected integral part of the wafer fabrication system linked with the at least one directly-affected integral part of the wafer fabrication system, referenced in method step 3602, can include identifying at least one indirectly-affected integral part of the wafer fabrication system on a granular basis. The remaining shown steps function substantially as like-numbered steps described previously.

Figure 38:
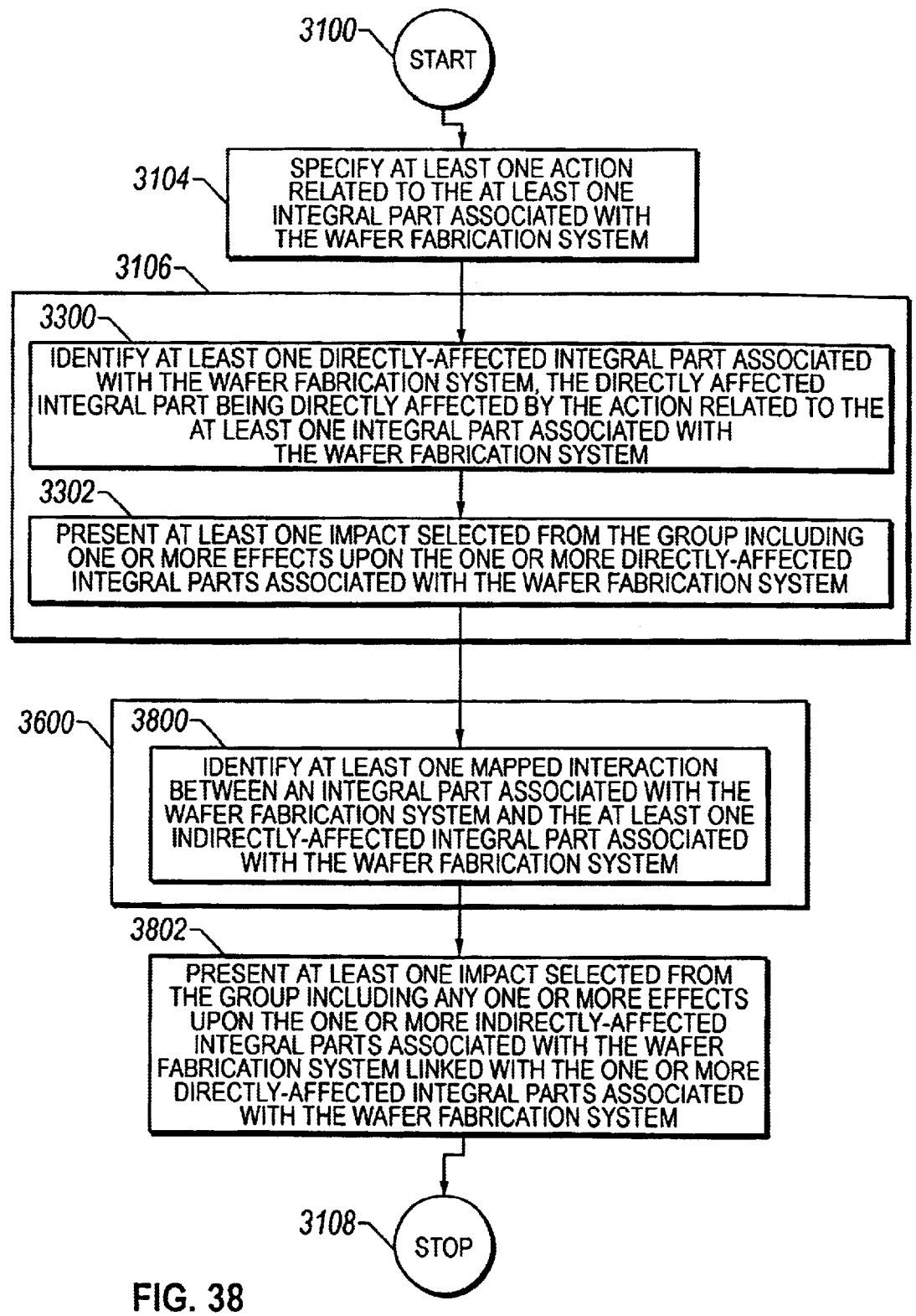
FIG. 38 shows a high-level logic flowchart showing an example of identifying at least one indirectly-affected integral part of the wafer fabrication system linked with the at least one directly-affected integral part of the wafer fabrication system.

Referring now to FIG. 38, shown is a high-level logic flowchart showing an example of identifying at least one indirectly-affected integral part of the wafer fabrication system linked with the at least one directly-affected integral part of the wafer fabrication system referenced in method step 3600. Method step 3800 illustrates that in one instance, the identifying at least one directly-affected integral part of the wafer fabrication system linked with the at least one directly-affected integral part of the wafer fabrication, referenced in method step 3600, includes identifying at least one mapped interaction between an integral part of the wafer fabrication system and the at least one indirectly-affected integral part of the wafer fabrication system. The remaining shown steps function substantially as like-numbered steps described previously.

Figure 39:
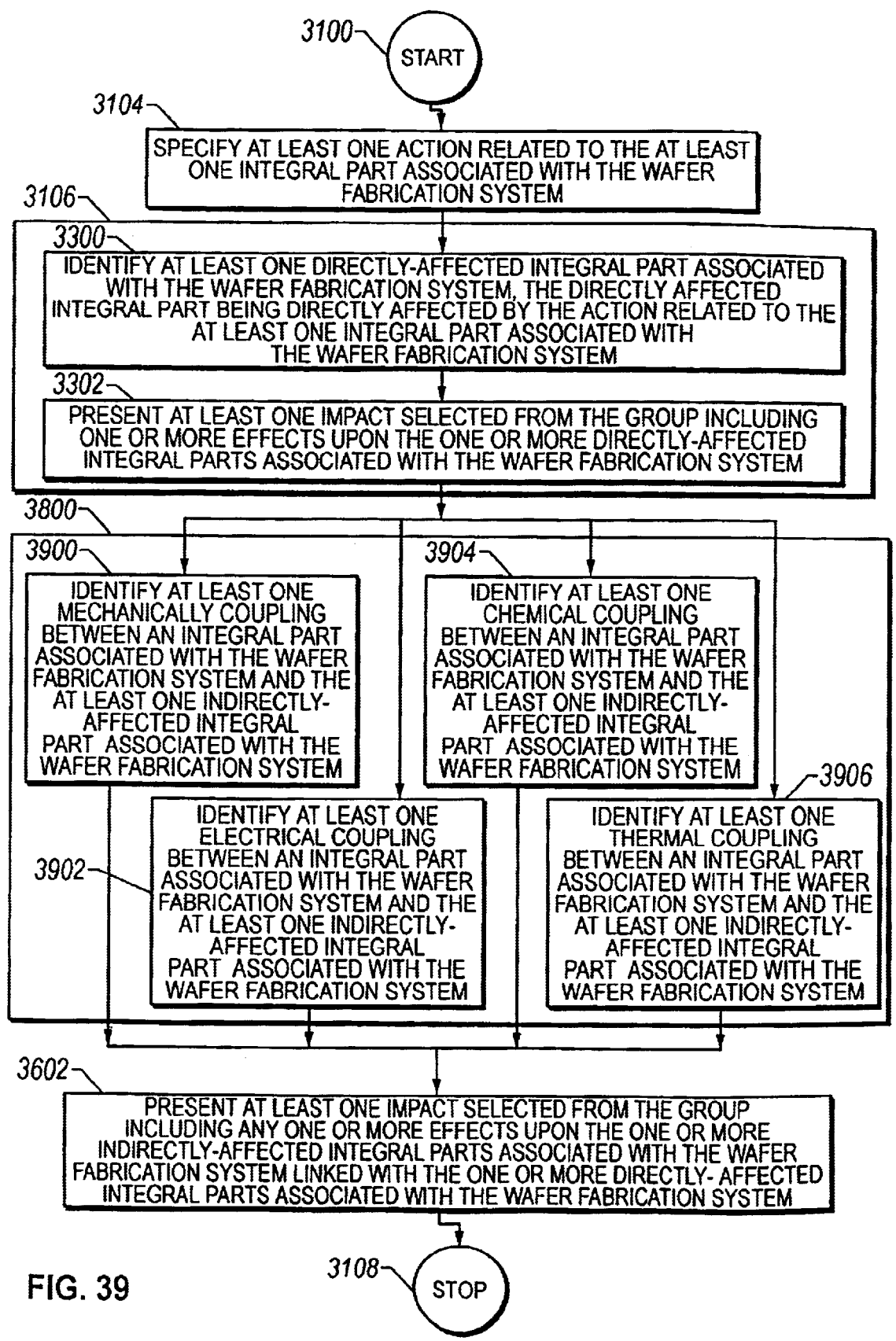
FIG. 39 shows a high-level logic flowchart showing an example of the identifying at least one coupling between an integral part of the wafer fabrication system and the at least one directly-affected integral part of the wafer fabrication system.

Referring now to FIG. 39, shown is a high-level logic flowchart showing an example of the identifying at least one coupling between an integral part of the wafer fabrication system and the at least one directly-affected integral part of the wafer fabrication system as referenced in method stop 3800. Method step 3900 depicts that in a first instance, identifying at least one coupling between an integral part of the wafer fabrication system and the at least one directly-affected integral part of the wafer fabrication system as referenced in method stop 3800, includes identifying at least one mechanical coupling between an integral part of the wafer fabrication system and the at least one directly-affected integral part of the wafer fabrication system. Method step 3902 depicts that in a second instance, identifying at least one coupling between an integral part of the wafer fabrication system and the at least one directly-affected integral part of the wafer fabrication system as referenced in method stop 3800, includes identifying at least one electrical coupling between an integral part of the wafer fabrication system and the at least one directly-affected integral part of the wafer fabrication system. Method step 3904 depicts that in a third instance, identifying at least one coupling between an integral part of the wafer fabrication system and the at least one directly-affected integral part of the wafer fabrication system as referenced in method stop 3800, includes identifying at least one chemical coupling between an integral part of the wafer fabrication system and the at least one directly-affected integral part of the wafer fabrication system. Method step 3906 depicts that in a fourth instance, identifying at least one coupling between an integral part of the wafer fabrication system and the at least one directly-affected integral part of the wafer fabrication system as referenced in method stop 3800, includes identifying at least one thermal coupling between an integral part of the wafer fabrication system and the at least one directly-affected integral part of the wafer fabrication system. The remaining shown steps function substantially as like-numbered steps described previously.

Figure 46:
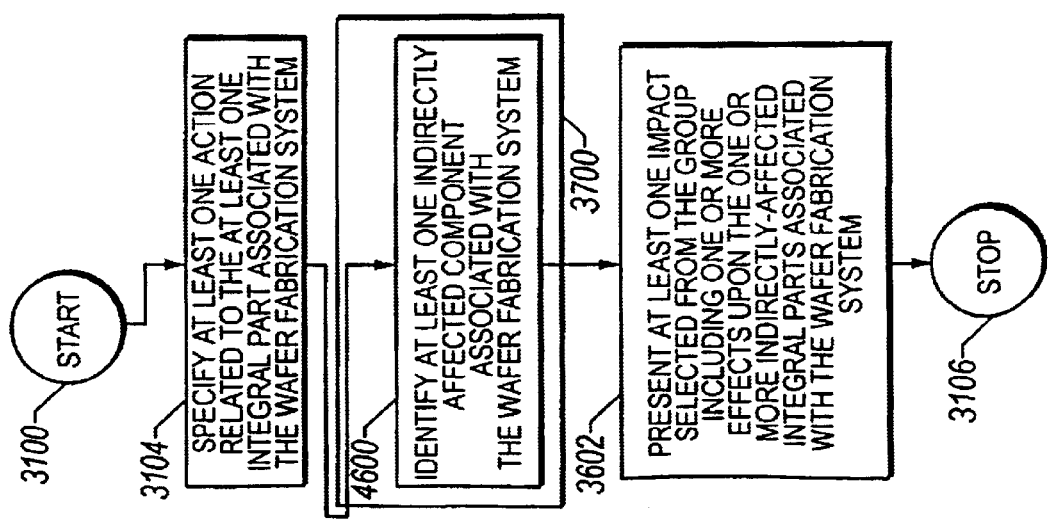
FIG. 46 shows a high-level logic flowchart showing an example of the identification of the at least one indirectly affected integral part on a granular basis.

Referring now to FIG. 46, shown is a high-level logic flowchart showing an example of the identification of the at least one indirectly affected integral part on a granular basis as is referenced in method stop 3700. Method step 4600 illustrates that in one instance, the identification of at least one indirectly affected integral part on a granular basis, referenced in method step 3700, can involve identifying at least one indirectly affected component (as the term component is defined and used herein) associated with the wafer fabrication system. The remaining shown steps function substantially as like-numbered steps described previously.

Figure 47:
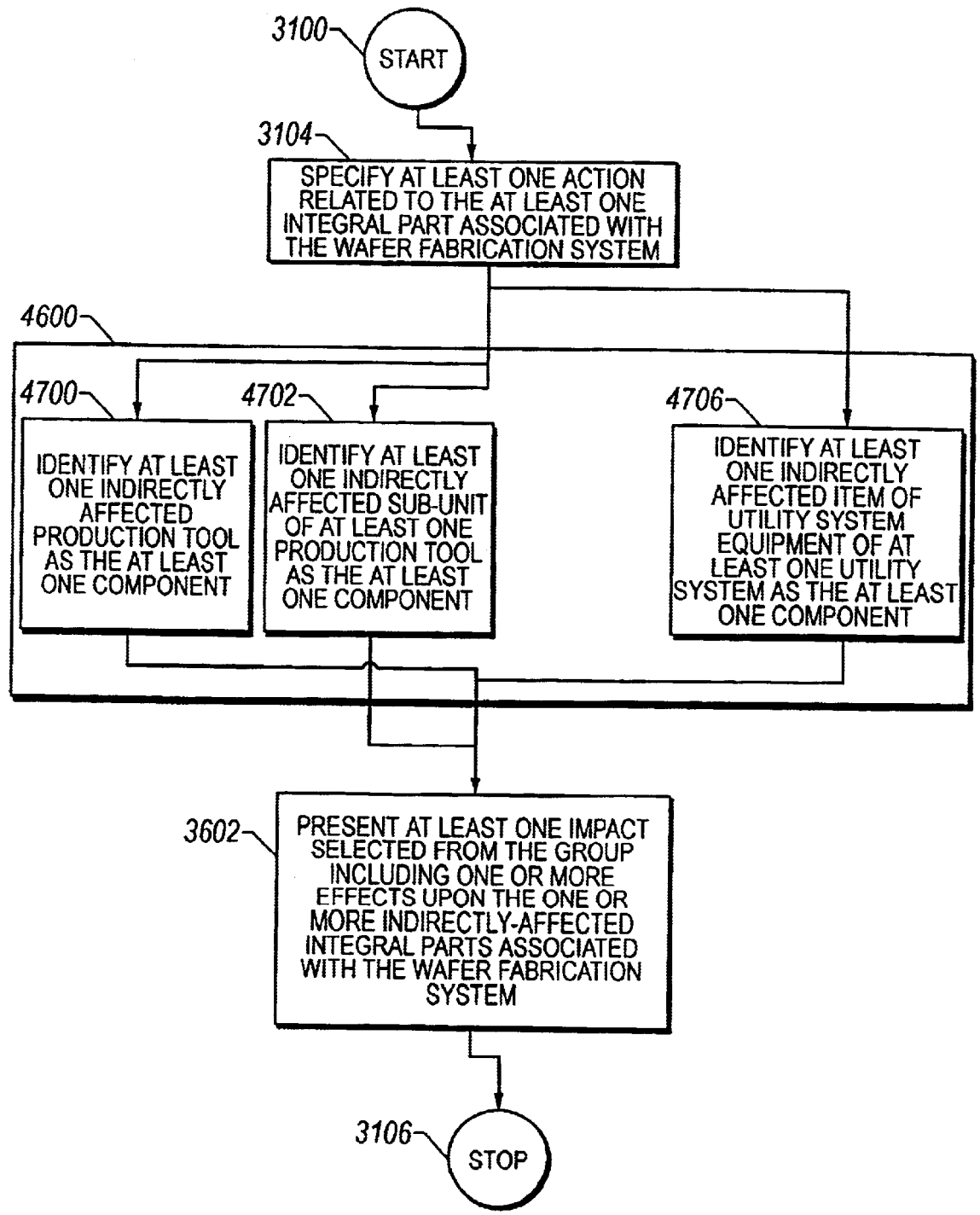
FIG. 47 shows a high-level logic flowchart showing several examples of identification of at least one indirectly affected component (as the term component is defined and used herein) associated with the wafer fabrication system.

Referring now to FIG. 47, shown is a high-level logic flowchart showing several examples of identification of at least one indirectly affected component (as the term component is defined and used herein) associated with the wafer fabrication system referenced in method step 4600. Method step 4700 illustrates that in a first instance, the identification of the at least one indirectly affected component (as the term component is defined and used herein) associated with the wafer fabrication system, referenced in method step 4600, can involve identifying at least one indirectly affected production tool. Method step 4702 illustrates that in a second instance, the identification of the at least one indirectly affected component (as the term component is defined and used herein) associated with the wafer fabrication system, referenced in method step 4600, can involve identifying at least one indirectly affected sub-unit of at least one production tool. Method step 4706 illustrates that in a third instance, the identification of the at least one indirectly affected component (as the term component is defined and used herein) associated with the wafer fabrication system, referenced in method step 4600, can involve identifying at least one indirectly affected item of utility system equipment. The remaining shown steps function substantially as like-numbered steps described previously.

Figure 48:
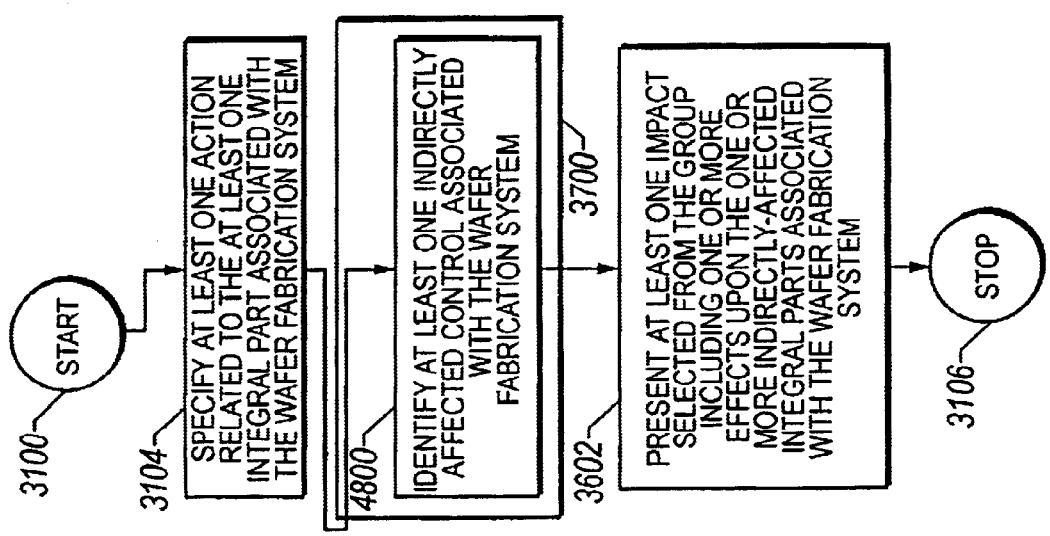
FIG. 48 shows a high-level logic flowchart showing an example of the identification of at least one indirectly affected integral part on a granular.

Referring now to FIG. 48, shown is a high-level logic flowchart showing an example of the identification of at least one indirectly affected integral part on a granular basis as is referenced in method stop 3700. Method step 4800 illustrates that in one instance, the identification of at least one indirectly affected integral part on a granular basis, referenced in method step 3700, can involve identifying at least indirectly affected one control (as the term control is defined and used herein) associated with the wafer fabrication system. The remaining shown steps function substantially as like-numbered steps described previously.

Figure 49:
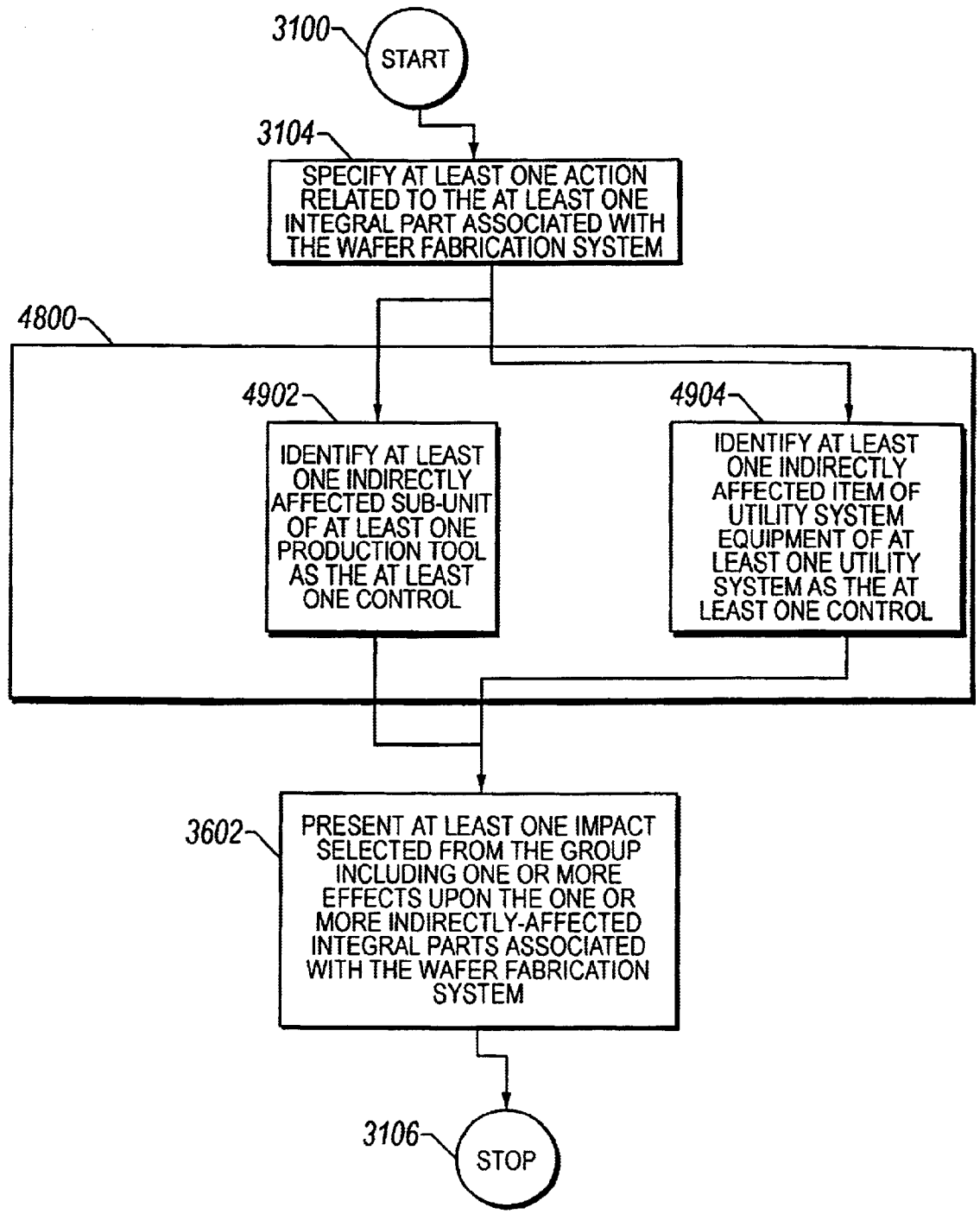
FIG. 49 shows a high-level logic flowchart showing several examples of the identification of the at least one indirectly affected control (as the term control is defined and used herein) associated with the wafer fabrication system.

Referring now to FIG. 49, shown is a high-level logic flowchart showing several examples of the identification of the at least one indirectly affected control (as the term control is defined and used herein) associated with the wafer fabrication system referenced in method step 4800. Method step 4902 illustrates that in a first instance, the identification of the at least one indirectly affected control (as the term control is defined and used herein) associated with the wafer fabrication system, referenced in method step 4800, can involve identifying at least one indirectly affected sub-unit of at least one production tool. Method step 4904 illustrates that in a second instance, the identification of the at least one indirectly affected control (as the term control is defined and used herein) associated with the wafer fabrication system, referenced in method step 4800, can involve identifying at least one indirectly affected item of utility system equipment. The remaining shown steps function substantially as like-numbered steps described previously.

Figure 50:
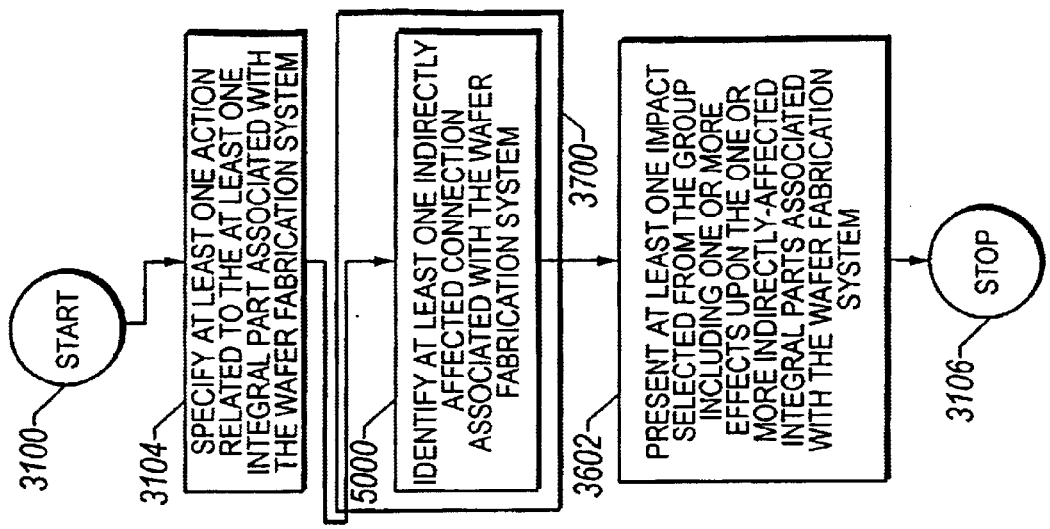
FIG. 50 shows a high-level logic flowchart showing an example of the identification of at least one indirectly affected integral part on a granular basis.

Referring now to FIG. 50, shown is a high-level logic flowchart showing an example of the identification of at least one indirectly affected integral part on a granular basis as is referenced in method stop 3700. Method step 5100 illustrates that in one instance, the identification of at least one indirectly affected integral part on a grahular basis, referenced in method step 3700, involves identifying at least one indirectly affected connection (as the term connection is defined and used herein) associated with the wafer fabrication system. The remaining shown steps function substantially as like-numbered steps described previously.

Figure 51:
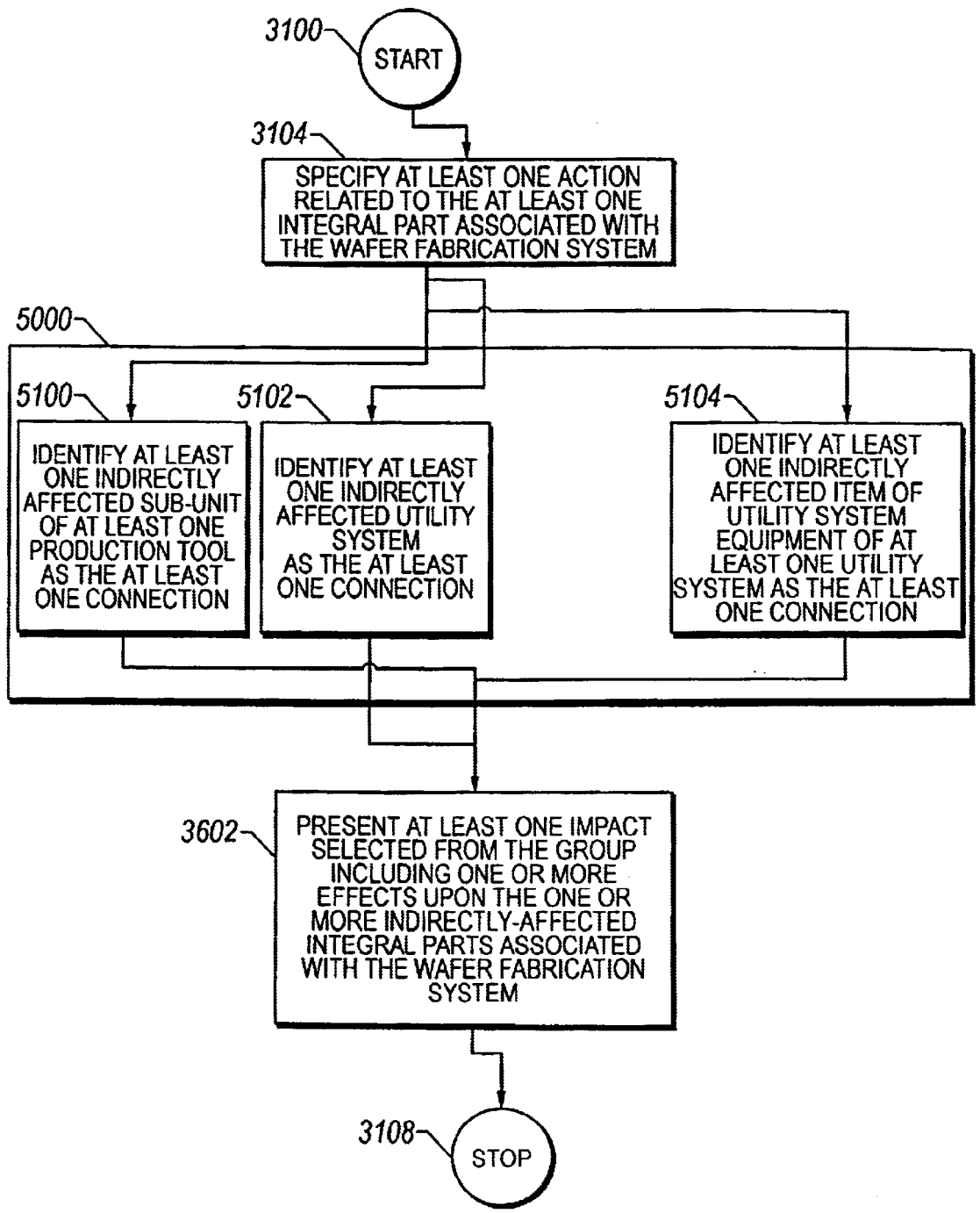
FIG. 51 shows a high-level logic flowchart showing several examples of the identification of at least one indirectly affected connection (as the term connection is defined and used herein) associated with the wafer fabrication system.

Referring now to FIG. 51, shown is a high-level logic flowchart showing several examples of the identification of at least one indirectly affected connection (as the term connection is defined and used herein) associated with the wafer fabrication system, referenced in method step 5000. Method step 5100 illustrates that in a first instance, the identification of the at least one indirectly affected connection (as the term connection is defined and used herein) associated with the wafer fabrication system, referenced in method step 5000, can involve identifying at least one indirectly affected production tool. Method step 5102 illustrates that in a second instance, the identification of the at least one indirectly affected connection (as the term connection is defined and used herein) associated with the wafer fabrication system, referenced in method step 5000, can involve identifying at least one indirectly affected utility system. Method step 5104 illustrates that in one instance, the identification of the at least one indirectly affected connection (as the term connection is defined and used herein) associated with the wafer fabrication system, referenced in method step 5000, can involve identifying at least one indirectly affected item of utility system equipment. The remaining shown steps function substantially as like-numbered steps described previously.

Method step 3302 referenced presentation of at least one impact selected from the group including one or more effects upon the one or more directly-affected integral parts of the wafer fabrication system. Method step 3602 referenced presentation of at least one impact selected from the group including the one or more effects upon the one or more indirectly-affected integral parts of the wafer fabrication system.

In so far as specifying at least one action relates to the at least one integral part referenced in method step 3104 will, in some sense, result in the generation of a "hypothetical" wafer fabrication system defined by the direct and/or indirect effects of the specified action, those skilled in the art will recognize that the presentation of the impacts referenced in method steps 3302 and 3602 can be achieved via the use of the process and devices referenced in generating presentation of relationships involving integral parts of evolving wafer fabrication system with substantially minimal modifications.

Figure 54:
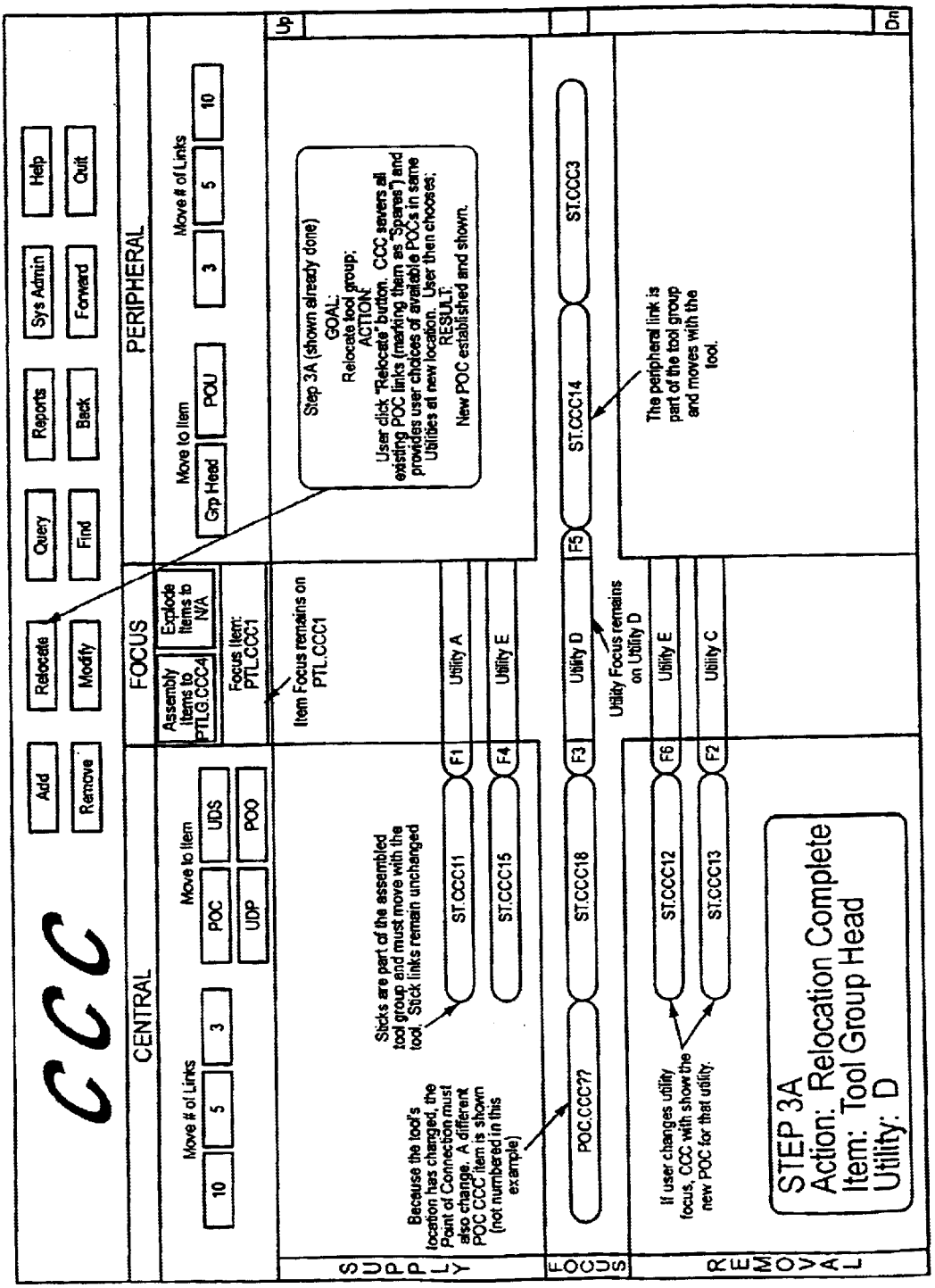
FIG. 54 shows a proposed graphical user interface which can be utilized to accept a user specification of an action on at least one integral part of a wafer fabrication system.

Referring now to FIG. 54, shown is a proposed graphical user interface, to be viewed against the background of FIGS. 30A–30H, which can be utilized to accept a user specification of an action on at least one integral part of a wafer fabrication system, such as was referenced in method step 3104. Although not explicitly shown, those skilled will recognize that graphical presentation techniques, notorious within the art, can be utilized to produce graphical presentations of the foregoing described effects of a proposed action (exactly what impacts will be presented is a design choice) since, as has been discussed, typically (but not always) the results of the proposed action will take the form of a new set of relationships between integral parts of the wafer fabrication system, which can thereafter be presented in the manner discussed previously. The graphical user interfaces can be generated by a multitude of programming techniques well known to those within the art.

The foregoing detailed description set forth various embodiments of the present invention via the use of block diagrams, flowcharts, and examples. It will be understood as notorious by those within the art that each block diagram component, flowchart step, and operations and/or components illustrated by the use of examples can be implemented, individually and/or collectively, by a wide range of hardware, software, firmware, or any combination thereof. In one embodiment, the present invention is implemented via standard relational database products. However, those skilled in the art will recognize that the embodiments disclosed herein, in whole or in part, can be equivalently implemented in Application Specific Integrated Circuits (ASICs), standard Integrated Circuits, as a computer program running on a computer, as firmware, or as virtually any combination thereof and that designing the circuitry and/or writing the code for the software or firmware would be well within the skill of one of ordinary skill in the art in light of this disclosure.

The foregoing described embodiments depict different components contained within, or connected with, different other components. It is to be understood that such depicted architectures are merely exemplary, and that in fact many other architectures can be implemented which achieve the same functionality. In an abstract, but still definite, sense those within the art will appreciate that any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims contain usage of the introductory phrases "at least one" and "one or more"

to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles.

What is claimed is:

1. A method comprising:
   identifying at least one integral part associated with a wafer fabrication system, wherein said identifying at least one integral part associated with a wafer fabrication system comprises identifying the at least one integral part associated with the wafer fabrication system on a granular basis; and
   generating a presentation of at least one relationship between the at least one integral part associated with the wafer fabrication system and at least one other integral part associated with the wafer fabrication system.

2. The method of claim 1, wherein said identifying the at least one integral part associated with the wafer fabrication system on a granular basis further comprises:
   identifying at least one component associated with the wafer fabrication system.

3. The method of claim 2, wherein said identifying at least one component associated with the wafer fabrication system further comprises:
   identifying at least one production tool as the at least one component.

4. The method of claim 2, wherein said identifying at least one component associated with the wafer fabrication system further comprises:
   identifying at least one sub-unit of at least one production tool as the at least one component.

5. The method of claim 2, where said identifying at least one component associated with the wafer fabrication system further comprises:
   identifying at least one optistation as the at least one component.

6. The method of claim 2, where said identifying at least one component associated with the wafer fabrication system further comprises:
   identifying at least one item of utility system equipment of at least one utility system as the at least one component.

7. The method of claim 1, wherein said identifying the at least one integral part associated with the wafer fabrication system on a granular basis further comprises:
   identifying at least one control associated with the wafer fabrication system.

8. The method of claim 7, wherein said identifying at least one control associated with the wafer fabrication system further comprises:
   identifying at least one device that modifies or meters a utility as the at least one control.

9. The method of claim 7, wherein said identifying at least one control associated with the wafer fabrication system further comprises:
   identifying at least one of the group comprising any valve, damper, circuit breaker, flow meter, transformer, or sensor as the at least one control.

10. The method of claim 7, where said identifying at least one control associated with the wafer fabrication system further comprises:
    identifying at least one item of utility system equipment of at least one utility system as the at least one control.

11. The method of claim 1, wherein said identifying the at least one integral part associated with the wafer fabrication system on a granular basis further comprises:
    identifying at least one connection associated with the wafer fabrication system.

12. The method of claim 11, wherein said identifying at least one connection associated with the wafer fabrication system further comprises:
    identifying at least one sub-unit of at least one production tool as the at least one connection.

13. The method of claim 11, wherein said identifying at least one control associated with the wafer fabrication system further comprises:
    identifying at least one utility system as the at least one connection.

14. The method of claim 11, wherein said identifying at least one connection associated with the wafer fabrication system further comprises:
    identifying at least one item of utility system equipment of at least one utility system as the at least one connection.

15. A system comprising:
    means for identifying at least one integral part associated with a wafer fabrication system, wherein said means for identifying at least one integral part associated with a wafer fabrication system comprises means for identifying the at least one integral part associated with the wafer fabrication system on a granular basis; and
    means for generating a presentation of at least one relationship between the at least one integral part associated with the wafer fabrication system and at least one other integral part associated with the wafer fabrication system.

16. The system of claim 15, wherein said means for identifying the at least one integral part associated with the wafer fabrication system on a granular basis further comprises:
    means for identifying at least one component associated with the wafer fabrication system.

17. The system of claim 16, wherein said means for identifying at least one component associated with the wafer fabrication system further comprises:
    means for identifying at least one production tool as the at least one component.

18. The system of claim 16, wherein said means for identifying at least one component associated with the wafer fabrication system further comprises:
    means for identifying at least one sub-unit of at least one production tool as the at least one component.

19. The system of claim 16, where said means for identifying at least one component associated with the wafer fabrication system further comprises:
    means for identifying at least one optistation as the at least one component.

20. The system of claim 16, where said means for identifying at least one component associated with the wafer fabrication system further comprises:
    means for identifying at least one item of utility system equipment of at least one utility system as the at least one component.

21. The system of claim 15, wherein said means for identifying the at least one integral part associated with the wafer fabrication system on a granular basis further comprises:

means for identifying at least one control associated with the wafer fabrication system.

22. The method of claim 21, wherein said means for identifying at least one control associated with the wafer fabrication system further comprises:

means for identifying at least one device that modifies or meters a utility as the at least one control.

23. The system of claim 21, wherein said means for identifying at least one control associated with the wafer fabrication system further comprises:

means for identifying at least one of the group comprising any valve, damper, circuit breaker, flow meter, transformer, or sensor as the at least one control.

24. The system of claim 21, where said means for identifying at least one control associated with the wafer fabrication system further comprises:

means for identifying at least one item of utility system equipment of at least one utility system as the at least one control.

25. The system of claim 15, wherein said means for identifying the at least one integral part associated with the wafer fabrication system on a granular basis further comprises:

means for identifying at least one connection associated with the wafer fabrication system.

26. The system of claim 25, wherein said means for identifying at least one connection associated with the wafer fabrication system further comprises:

means for identifying at least one sub-unit of at least one production tool as the at least one connection.

27. The system of claim 25, wherein said means for identifying at least one control associated with the wafer fabrication system further comprises:

means for identifying at least one utility system as the at least one connection.

28. The system of claim 25, wherein said means for identifying at least one connection associated with the wafer fabrication system further comprises:

means for identifying at least one item of utility system equipment of at least one utility system as the at least one connection.

* * * * *